(12) United States Patent
Matsumoto et al.

(10) Patent No.: US 11,021,568 B2
(45) Date of Patent: Jun. 1, 2021

(54) POLYMER COMPOUND AND LIGHT EMITTING DEVICE USING THE SAME

(71) Applicant: Sumitomo Chemical Company, Limited, Tokyo (JP)

(72) Inventors: Ryuji Matsumoto, Tsukuba (JP); Yuki Hiroi, Osaka (JP); Tomoyasu Yoshida, Tokyo (JP); Daisuke Fukushima, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/620,605

(22) PCT Filed: Jun. 27, 2018

(86) PCT No.: PCT/JP2018/024289
§ 371 (c)(1),
(2) Date: Dec. 9, 2019

(87) PCT Pub. No.: WO2019/004248
PCT Pub. Date: Jan. 3, 2019

(65) Prior Publication Data
US 2021/0087330 A1    Mar. 25, 2021

(30) Foreign Application Priority Data

Jun. 30, 2017  (JP) .............................. JP2017-128629

(51) Int. Cl.
| *H01L 29/08* | (2006.01) |
| *C08G 61/12* | (2006.01) |
| *H01L 51/00* | (2006.01) |
| *H01L 51/50* | (2006.01) |

(52) U.S. Cl.
CPC .......... *C08G 61/12* (2013.01); *H01L 51/0061* (2013.01); *H01L 51/0072* (2013.01); *H01L 51/5056* (2013.01); *H01L 51/5092* (2013.01)

(58) Field of Classification Search
CPC ............. H01L 51/0061; H01L 51/0072; H01L 51/5056; H01L 51/5092; C08G 61/10; C08G 61/12
See application file for complete search history.

(56) References Cited

U.S. PATENT DOCUMENTS

| 2010/0171417 | A1* | 7/2010 | Kitamura | .............. | C09K 11/06 313/504 |
| 2014/0175421 | A1 | 6/2014 | Pan et al. | | |
| 2014/0217378 | A1* | 8/2014 | Nishimura | .......... | H01L 51/0061 257/40 |
| 2015/0236274 | A1 | 8/2015 | Hatakeyama et al. | | |
| 2016/0181564 | A1* | 6/2016 | Hayama | .............. | H01L 51/0071 257/40 |
| 2017/0186968 | A1* | 6/2017 | Shiomi | ................ | C07D 401/10 |
| 2018/0094000 | A1 | 4/2018 | Hatakeyama et al. | | |
| 2019/0013478 | A1 | 1/2019 | Iijima et al. | | |
| 2020/0091431 | A1 | 3/2020 | Hatakeyama et al. | | |

FOREIGN PATENT DOCUMENTS

| CN | 106467553 | A | 3/2017 |
| EP | 3109253 | A1 | 12/2016 |
| JP | 2014527550 | A | 10/2014 |
| JP | 2016196610 | A | 11/2016 |
| JP | 2017079267 | A | 4/2017 |
| JP | 2018061028 | A | 4/2018 |
| WO | 2013013753 | A2 | 1/2013 |
| WO | 2015102118 | A1 | 7/2015 |

(Continued)

OTHER PUBLICATIONS

Hatakeyama et al., "Ultrapure Blue Thermally Activated Delayed Fluorescence Molecules: Efficient HOMO-LUMO Separation by the Multiple Resonance Effect," Advanced Materials, vol. 28, pp. 2777-2781 (2016).
International Search Report dated Sep. 25, 2018 in International Application No. PCT/JP2018/024289.
Written Opinion dated Sep. 25, 2018 in International Application No. PCT/JP2018/024289.
Extended European Search Report dated Feb. 24, 2021 in EP Application No. 18824800.9.

*Primary Examiner* — Phuc T Dang
(74) *Attorney, Agent, or Firm* — Panitch Schwarze Belisario & Nadel LLP

(57) ABSTRACT

A polymer compound which is useful for producing a light emitting device having excellent luminance life is described. The polymer compound contains a constitutional unit having a residue of a compound represented by the formula (1) and a constitutional unit having no residue of a compound represented by the formula (1):

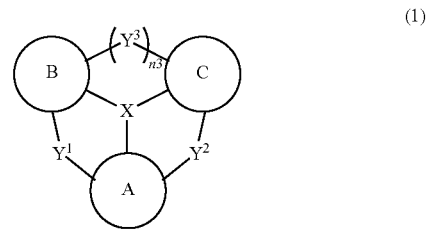

(1)

In formula (1), Ring A, Ring B and Ring C represent an aromatic hydrocarbon ring, X represents a boron atom, $Y^1$, $Y^2$ and $Y^3$ represent N-Ry, a sulfur atom or a selenium atom, Ry represents a hydrogen atom, an aryl group, a monovalent heterocyclic group or an alkyl group, and n3 is 0 or 1. When n3 is 0, —$Y^3$— is absent.

15 Claims, No Drawings

(56) References Cited

FOREIGN PATENT DOCUMENTS

| WO | 2016152418 A1 | 9/2016 |
| WO | 2016152544 A1 | 9/2016 |
| WO | 2017018326 A1 | 2/2017 |

* cited by examiner

POLYMER COMPOUND AND LIGHT EMITTING DEVICE USING THE SAME

CROSS-REFERENCE TO RELATED APPLICATIONS

This application is a Section 371 of International Application No. PCT/JP2018/024289, filed Jun. 27, 2018, which was published in the Japanese language on Jan. 3, 2019 under International Publication No. WO 2019/004248 A1, which claims priority under 35 U.S.C. § 119(b) to Japanese Application No. 2017-128629, filed Jun. 30, 2017, the disclosures of which are incorporated herein by reference in their entirety.

TECHNICAL FIELD

The present invention relates to a polymer compound and a light emitting device using the same.

BACKGROUND ART

As a light emitting material used for a light emitting device, for example, a polymer compound represented by the following formula is investigated (Patent Document 1).

[Chemical Formula 1]

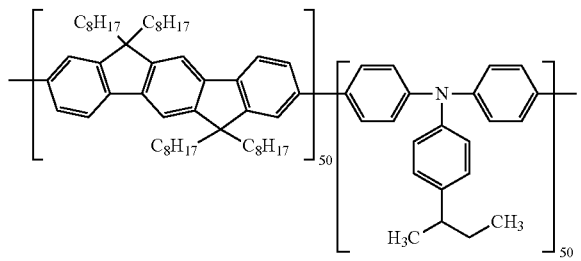

PRIOR ART DOCUMENT

Patent Document
 [Patent Document 1]
 International Publication WO2013/013753

SUMMARY OF THE INVENTION

Problem to be Solved by the Invention

However, a light emitting device produced by using the above-described polymer compound is not necessarily sufficient in luminance life.

Then, the present invention has an object of providing a polymer compound which is useful for production of a light emitting device excellent in luminance life.

Means for Solving the Problem

The present invention provides the following [1] to [15].

[1] A polymer compound comprising a constitutional unit having a residue of a compound represented by the formula (1) and a constitutional unit having no residue of a compound represented by the formula (1) described above:

[Chemical Formula 2]

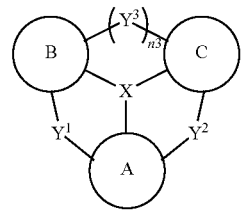

(1)

[wherein,

Ring A, Ring B and Ring C each independently represent an aromatic hydrocarbon ring or an aromatic heterocyclic ring, and these rings optionally have a substituent.

X represents a boron atom, a phosphorus atom, P=O, P=S, an aluminum atom, a gallium atom, an arsenic atom, Si-Rx or Ge-Rx. Rx represents an aryl group or an alkyl group, and the foregoing groups optionally have a substituent.

$Y^1$ represents N-Ry, a sulfur atom or a selenium atom. $Y^2$ and $Y^3$ each independently represent an oxygen atom, N-Ry, a sulfur atom or a selenium atom. Ry represents a hydrogen atom, an aryl group, a monovalent heterocyclic group or an alkyl group, and the foregoing groups optionally have a substituent. When a plurality of Ry are present, they may be the same or different. Ry may be bonded to the above-described Ring A, the above-described Ring B or the above-described Ring C directly or via a connecting group.

n3 is 0 or 1. When n3 is 0, —$Y^3$— is absent.].

[2] The polymer compound according to [1], wherein the above-described constitutional unit having a residue of a compound represented by the formula (1) is a constitutional unit represented by the formula (2) or the formula (2'):

[Chemical Formula 3]

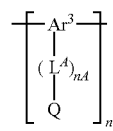

(2)

[wherein, nA is an integer of 0 to 5.

n is 1 or 2.

$Ar^3$ represents an aromatic hydrocarbon group or a heterocyclic group, and the foregoing groups optionally have a substituent.

$L^A$ represents an alkylene group, a cycloalkylene group, an arylene group, a divalent heterocyclic group, a group represented by —NR'—, an oxygen atom or a sulfur atom, and the foregoing groups optionally have a substituent. R' represents a hydrogen atom, an alkyl group, a cycloalkyl group, an aryl group or a monovalent heterocyclic group, and the foregoing groups optionally have a substituent. When a plurality of $L^A$ are present, they may be the same or different.

Q represents the above-described residue of a compound represented by the formula (1).]

[Chemical Formula 4]

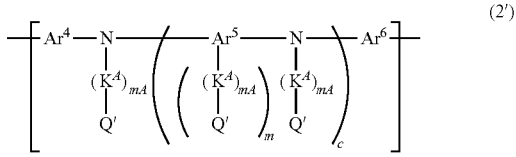

(2')

[wherein, m is an integer of 1 to 4.

mA is an integer of 0 to 5. When a plurality of mA are present, they may be the same or different.

c is 0 or 1.

$Ar^4$ and $Ar^6$ each independently represent an arylene group or a divalent heterocyclic group, and the foregoing groups optionally have a substituent.

$Ar^5$ represents an aromatic hydrocarbon group, a heterocyclic group, or a group in which at least one aromatic hydrocarbon ring and at least one heterocyclic ring are bonded, and the foregoing groups optionally have a substituent.

$Ar^4$, $Ar^5$ and $Ar^6$ may be bonded directly or via an oxygen atom or a sulfur atom to a group other than these groups bonded to a nitrogen atom to which these groups are bonded, to form a ring.

$K^A$ represents an alkylene group, a cycloalkylene group, an arylene group, a divalent heterocyclic group, a group represented by —NR'—, an oxygen atom or a sulfur atom, and the foregoing groups optionally have a substituent. R' represents a hydrogen atom, an alkyl group, a cycloalkyl group, an aryl group or a monovalent heterocyclic group, and the foregoing groups optionally have a substituent. When a plurality of $K^A$ are present, they may be the same or different.

Q' represents the above-described residue of a compound represented by the formula (1), a hydrogen atom, an alkyl group, a cycloalkyl group, an aryl group or a monovalent heterocyclic group, and the foregoing groups optionally have a substituent. When a plurality of Q' are present, they may be the same or different. At least one Q' is the above-described residue of a compound represented by the formula (1).].

[3] The polymer compound according to [1], wherein the above-described constitutional unit having a residue of a compound represented by the formula (1) is a constitutional unit represented by the formula (3):

[Chemical Formula 5]

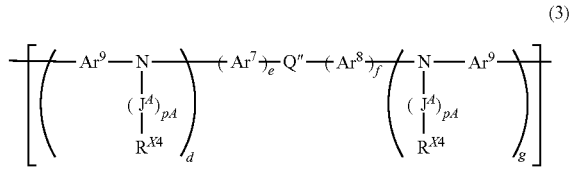

(3)

[wherein, d, e, f and g each independently represent an integer of 0 to 2.

pA is an integer of 0 to 5. When a plurality of pA are present, they may be the same or different.

$J^A$ represents an alkylene group, a cycloalkylene group, an arylene group, a divalent heterocyclic group, a group represented by —NR'—, an oxygen atom or a sulfur atom, and the foregoing groups optionally have a substituent. R' represents a hydrogen atom, an alkyl group, a cycloalkyl group, an aryl group or a monovalent heterocyclic group, and the foregoing groups optionally have a substituent. When a plurality of $J^A$ are present, they may be the same or different.

$Ar^7$, $Ar^8$ and $Ar^9$ each independently represent an arylene group or a divalent heterocyclic group, and the foregoing groups optionally have a substituent. When a plurality of $Ar^7$, $Ar^8$ and $Ar^9$ are present, they may be the same or different at each occurrence.

$R^{X4}$ represents a hydrogen atom, an alkyl group, a cycloalkyl group, an aryl group or a monovalent heterocyclic group, and the foregoing groups optionally have a substituent. When a plurality of $R^{X4}$ are present, they may be the same or different.

Q" represents the above-described residue of a compound represented by the formula (1).].

[4] The polymer compound according to any one of [1] to [3], wherein the above-described X is a boron atom.

[5] The polymer compound according to any one of [1] to [4], wherein the above-described $Y^1$, $Y^2$ and $Y^3$ are each N-Ry.

[6] The polymer compound according to any one of [1] to [5], wherein the above-described n3 is 0.

[7] The polymer compound according to [2], wherein the above-described constitutional unit represented by the formula (2) is a constitutional unit represented by the formula (31):

[Chemical Formula 6]

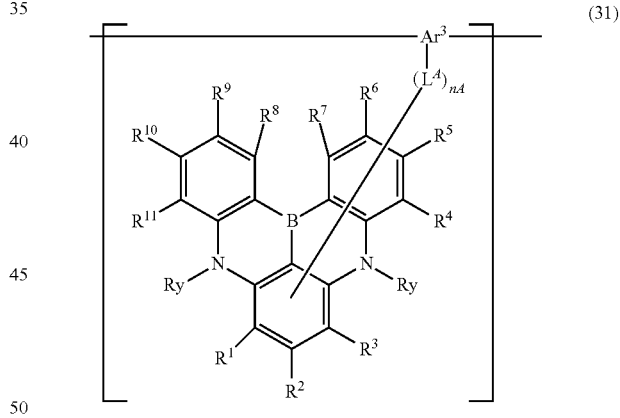

(31)

[wherein, $R^1$, $R^2$, $R^3$, $R^4$, $R^5$, $R^6$, $R^7$, $R^8$, $R^9$, $R^{10}$ and $R^{11}$ each independently represent a connecting bond, a hydrogen atom, an alkyl group, a cycloalkyl group, an alkoxy group, a cycloalkoxy group, an aryl group, an aryloxy group, a monovalent heterocyclic group or a substituted amino group, and the foregoing groups optionally have a substituent. One of $R^1$, $R^2$, $R^3$, $R^4$, $R^5$, $R^6$, $R^7$, $R^8$, $R^9$, $R^{10}$ and $R^{11}$ is a connecting bond.

Ry, $Ar^3$, $L^A$ and nA represent the same meaning as described above.].

[8] The polymer compound according to [2], wherein the above-described constitutional unit represented by the formula (2') is a constitutional unit represented by the formula (41):

[Chemical Formula 7]

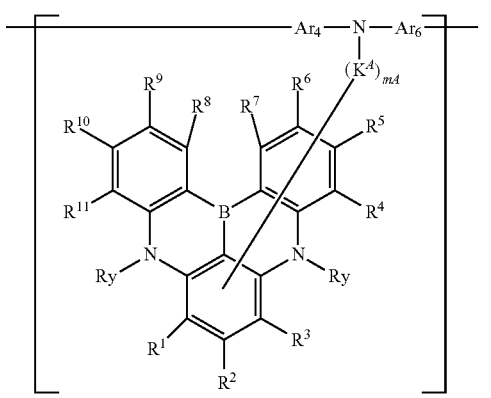

(41)

[wherein, $R^1$, $R^2$, $R^3$, $R^4$, $R^5$, $R^6$, $R^7$, $R^8$, $R^9$, $R^{10}$ and $R^{11}$ each independently represent a connecting bond, a hydrogen atom, an alkyl group, a cycloalkyl group, an alkoxy group, a cycloalkoxy group, an aryl group, an aryloxy group, a monovalent heterocyclic group or a substituted amino group, and the foregoing groups optionally have a substituent. One of $R^1$, $R^2$, $R^3$, $R^4$, $R^5$, $R^6$, $R^7$, $R^8$, $R^9$, $R^{10}$ and $R^{11}$ is a connecting bond.

Ry, $Ar^4$, $Ar^6$, $K^A$ and mA represent the same meaning as described above.].

[9] The polymer compound according to [3], wherein the above-described constitutional unit represented by the formula (3) is a constitutional unit represented by the formula (51):

[Chemical Formula 8]

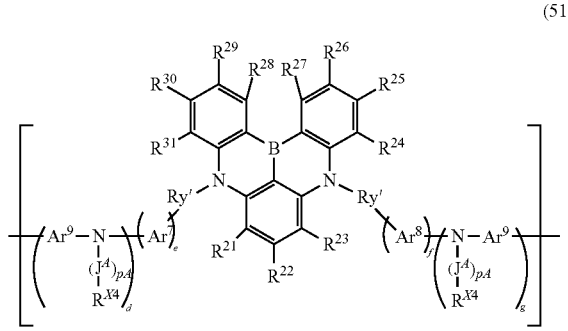

(51)

[wherein, $R^{21}$, $R^{22}$, $R^{23}$, $R^{24}$, $R^{25}$, $R^{26}$, $R^{27}$, $R^{28}$, $R^{29}$, $R^{30}$ and $R^{31}$ each independently represent a hydrogen atom, an alkyl group, a cycloalkyl group, an alkoxy group, a cycloalkoxy group, an aryl group, an aryloxy group, a monovalent heterocyclic group or a substituted amino group, and the foregoing groups optionally have a substituent.

Ry' represents a direct bond, an arylene group, a divalent heterocyclic group or an alkylene group, and the foregoing groups optionally have a substituent. A plurality of Ry' may be the same or different.

$Ar^7$, $Ar^8$, $Ar^9$, $R^{X4}$, $J^A$, pA, d, e, f and g represent the same meaning as described above.].

[10] The polymer compound according to any one of [1] to [9], wherein the above-described constitutional unit having no residue of a compound represented by the formula (1) is at least one constitutional unit selected from the group consisting of a constitutional unit represented by the formula (X) and a constitutional unit represented by the formula (Y):

[Chemical Formula 9]

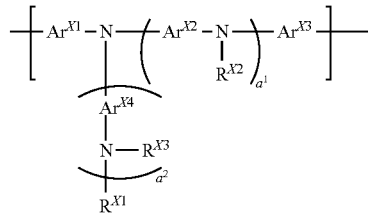

(X)

[wherein, $a^1$ and $a^2$ each independently represent an integer of 0 to 2.

$Ar^{X1}$ and $Ar^{X3}$ each independently represent an arylene group or a divalent heterocyclic group, and the foregoing groups optionally have a substituent.

$Ar^{X2}$ and $Ar^{X4}$ each independently represent an arylene group, a divalent heterocyclic group, or a divalent group in which at least one arylene group and at least one divalent heterocyclic group are bonded, and the foregoing groups optionally have a substituent. When a plurality of $Ar^{X2}$ and $Ar^{X4}$ are present, they may be the same or different at each occurrence.

$R^{X1}$, $R^{X2}$ and $R^{X3}$ each independently represent a hydrogen atom, an alkyl group, a cycloalkyl group, an aryl group or a monovalent heterocyclic group, and the foregoing groups optionally have a substituent. When a plurality of $R^{X2}$ and $R^{X3}$ are present, they may be the same or different at each occurrence.]

[Chemical Formula 10]

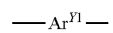

(Y)

[wherein, $Ar^{Y1}$ represents an arylene group, a divalent heterocyclic group, or a divalent group in which at least one arylene group and at least one divalent heterocyclic group are bonded, and the foregoing groups optionally have a substituent.].

[11] The polymer compound according to [10], wherein the above-described the constitutional unit represented by the formula (Y) is a constitutional unit represented by the formula (Y-1) or a constitutional unit represented by the formula (Y-2):

[Chemical Formula 11]

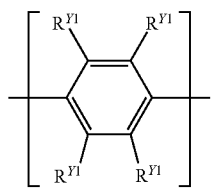

(Y-1)

[wherein, $R^{Y1}$ represents a hydrogen atom, an alkyl group, a cycloalkyl group, an alkoxy group, a cycloalkoxy group, an aryl group or a monovalent heterocyclic group, and the foregoing groups optionally have a substituent. A plurality of $R^{Y1}$ may be the same or different, and adjacent $R^{Y1}$ may be bonded together to form a ring together with carbon atoms to which they are attached.]

[Chemical Formula 12]

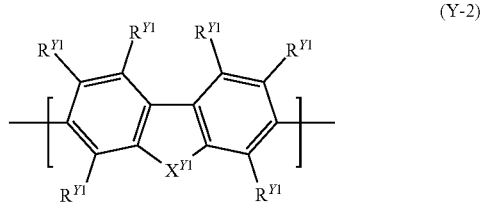

(Y-2)

[wherein, $R^{Y1}$ represent the same meaning as described above.

$X^{Y1}$ represents a group represented by —C(R$^{Y2}$)$_2$—, —C(R$^{Y2}$)=C(R$^{Y2}$)— or C(R$^{Y2}$)$_2$—C(R$^{Y2}$)$_2$—. $R^{Y2}$ represents a hydrogen atom, an alkyl group, a cycloalkyl group, an alkoxy group, a cycloalkoxy group, an aryl group or a monovalent heterocyclic group, and the foregoing groups optionally have a substituent. A plurality of $R^{Y2}$ may be the same or different, and the plurality of $R^{Y2}$ may be combined together to form a ring together with carbon atoms to which they are attached.].

[12] The polymer compound according to any one of [2], [4] to [8], [10] and [11], wherein the total amount of the constitutional unit represented by the formula (2) and the constitutional unit represented by the formula (2') described above is 0.1 to 50% by mole with respect to the total amount of all constitutional units contained in the polymer compound.

[13] The polymer compound according to any one of [3] to [6] and [9] to [11], wherein the total amount of the above-described constitutional unit represented by the formula (3) is 0.1 to 50% by mole with respect to the total amount of all constitutional units contained in the polymer compound.

[14] A composition comprising at least one material selected from the group consisting of a hole transporting material, a hole injection material, an electron transporting material, an electron injection material, a light emitting material, an antioxidant and a solvent, and the polymer compound according to any one of [1] to [13].

[15] A light emitting device having an organic layer containing the polymer compound according to any one of [1] to [13].

Effect of the Invention

According to the present invention, a polymer compound which is useful for production of a light emitting device excellent in luminance life can be provided. Further, according to the present invention, a composition comprising this polymer compound and a light emitting device comprising this polymer compound can be provided.

MODES FOR CARRYING OUT THE INVENTION

Suitable embodiments of the present invention will be illustrated in detail below.

Explanation of Common Terms

Terms commonly used in the present specification have the following meanings unless otherwise stated.

Me represents a methyl group, Et represents an ethyl group, Bu represents a butyl group, i-Pr represents an isopropyl group and t-Bu represents a tert-butyl group.

A hydrogen atom may be a heavy hydrogen atom or a light hydrogen atom.

In the formula representing a metal complex, the solid line representing a bond with the central metal means a covalent bond or a coordination bond.

"Polymer compound" means a polymer having molecular weight distribution and having a polystyrene-equivalent number-average molecular weight of $1 \times 10^3$ to $1 \times 10^8$.

"Low molecular compound" means a compound having no molecular weight distribution and having a molecular weight of $1 \times 10^4$ or less.

"Constitutional unit" means a unit occurring once or more times in the polymer compound.

"Alkyl group" may be any of linear and branched. The number of carbon atoms of the linear alkyl group is, not including the number of carbon atoms of the substituent, usually 1 to 50, preferably 3 to 30, more preferably 4 to 20. The number of carbon atoms of the branched alkyl group is, not including the number of carbon atoms of the substituent, usually 3 to 50, preferably 3 to 30, more preferably 4 to 20.

The alkyl group optionally has a substituent and examples thereof include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom and the like (for example, a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl)propyl group, a 6-ethyloxyhexyl group).

The number of carbon atoms of "cycloalkyl group" is, not including the number of carbon atoms of the substituent, usually 3 to 50, preferably 3 to 30, more preferably 4 to 20.

The cycloalkyl group optionally has a substituent and examples thereof include a cyclohexyl group, a cyclohexylmethyl group and a cyclohexylethyl group.

"Aryl group" means an atomic group remaining after removing from an aromatic hydrocarbon one hydrogen atom bonding directly to a carbon atom constituting the ring. The number of carbon atoms of the aryl group is, not including the number of carbon atoms of the substituent, usually 6 to 60, preferably 6 to 20, more preferably 6 to 10.

The aryl group optionally has a substituent and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group and a 4-phenylphenyl group, and groups obtained by substituting a hydrogen atom in these groups with an alkyl group, a cycloalkyl group, an alkoxy group, a cycloalkoxy group, an aryl group, a fluorine atom and the like.

"Alkoxy group" may be any of linear and branched. The number of carbon atoms of the linear alkoxy group is, not including the number of carbon atoms of the substituent, usually 1 to 40, preferably 4 to 10. The number of carbon atoms of the branched alkoxy group is, not including the number of carbon atoms of the substituent, usually 3 to 40, preferably 4 to 10.

The alkoxy group optionally has a substituent and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of the "cycloalkoxy group" is, not including the number of carbon atoms of the substituent, usually 3 to 40, preferably 4 to 10.

The cycloalkoxy group optionally has a substituent and examples thereof include a cyclohexyloxy group.

The number of carbon atoms of the "aryloxy group" is, not including the number of carbon atoms of the substituent, usually 6 to 60, preferably 6 to 48.

The aryloxy group optionally has a substituent and examples thereof include a phenoxy group, a 1-naphthyloxy group, a 2-naphthyloxy group, a 1-anthracenyloxy group, a 9-anthracenyloxy group and a 1-pyrenyloxy group, and groups obtained by substituting a hydrogen atom in these groups with an alkyl group, a cycloalkyl group, an alkoxy group, a cycloalkoxy group, a fluorine atom or the like.

"p-valent heterocyclic group" (p represents an integer of 1 or more) means an atomic group remaining after removing from a heterocyclic compound p hydrogen atoms among hydrogen atoms bonding directly to carbon atoms or hetero atoms constituting the ring. Of the p-valent heterocyclic groups, "p-valent aromatic heterocyclic group" as an atomic group remaining after removing from an aromatic heterocyclic compound p hydrogen atoms among hydrogen atoms bonding directly to carbon atoms or hetero atoms constituting the ring is preferable.

"Aromatic heterocyclic compound" means a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzophosphole and the like, and a compound in which an aromatic ring is condensed to the heterocyclic ring even if the heterocyclic ring itself shows no aromaticity such as phenoxazine, phenothiazine, dibenzoborole, dibenzosilole, benzopyran and the like.

The number of carbon atoms of the monovalent heterocyclic group is, not including the number of carbon atoms of the substituent, usually 2 to 60, preferably 4 to 20.

The monovalent heterocyclic group optionally has a substituent and examples thereof include a thienyl group, a pyrrolyl group, a furyl group, a pyridinyl group, a piperidinyl group, a quinolinyl group, an isoquinolinyl group, a pyrimidinyl group and a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferred. The substituent which the amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

"Alkenyl group" may be any of linear and branched. The number of carbon atoms of the linear alkenyl group is, not including the number of carbon atoms of the substituent, usually 2 to 30, preferably 3 to 20. The number of carbon atoms of the branched alkenyl group is, not including the number of carbon atoms of the substituent, usually 3 to 30, preferably 4 to 20.

The number of carbon atoms of the "cycloalkenyl group" is, not including the number of carbon atoms of the substituent, usually 3 to 30, preferably 4 to 20.

The alkenyl group and the cycloalkenyl group optionally have a substituent and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group and a 7-octenyl group, and these groups having a substituent.

"Alkynyl group" may be any of linear and branched. The number of carbon atoms of the alkynyl group is, not including the number of carbon atoms of the substituent, usually 2 to 20, preferably 3 to 20. The number of carbon atoms of the branched alkynyl group is, not including the number of carbon atoms of the substituent, usually 4 to 30, preferably 4 to 20.

The number of carbon atoms of the "cycloalkynyl group" is, not including the number of carbon atoms of the substituent, usually 4 to 30, preferably 4 to 20.

The alkynyl group and the cycloalkynyl group optionally have a substituent and examples thereof include an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and these groups having a substituent.

"Arylene group" means an atomic group remaining after removing from an aromatic hydrocarbon two hydrogen atoms bonding directly to carbon atoms constituting the ring. The number of carbon atoms of the arylene group is, not including the number of carbon atoms of the substituent, usually 6 to 60, preferably 6 to 30, more preferably 6 to 18.

The arylene group optionally has a substituent and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group and a chrysenediyl group, and these groups having a substituent, and groups represented by the formula (A-1) to the formula (A-20) are preferable. The arylene group includes groups obtained by bonding a plurality of these groups.

[Chemical Formula 13]
(A-1)
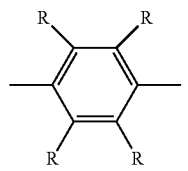
(A-2)
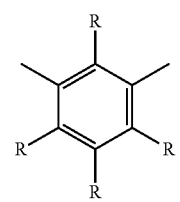
(A-3)
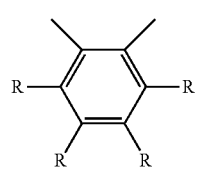
(A-4)
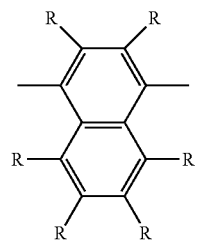
(A-5)
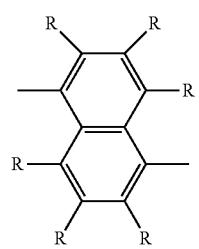
(A-6)
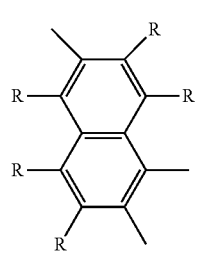
[Chemical Formula 14]
(A-7)
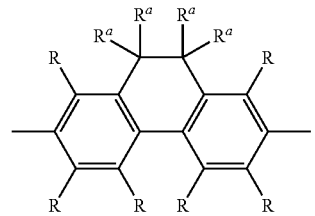
(A-8)
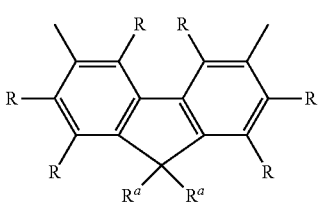
(A-9)
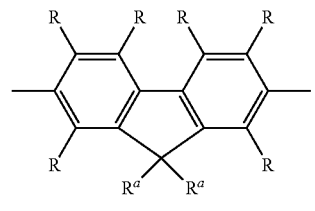
(A-10)
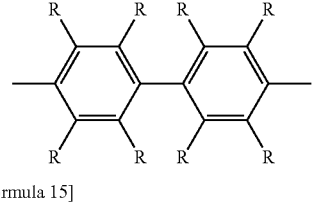
[Chemical Formula 15]
(A-11)
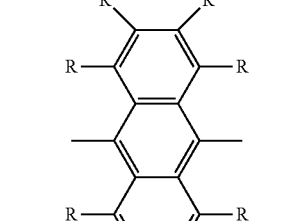
(A-12)
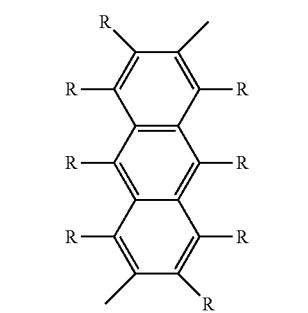

(A-13) (A-14) (A-15) (A-16) (A-17)

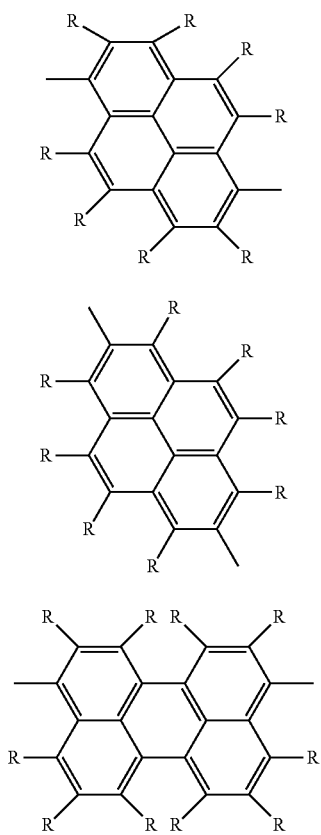

[Chemical Formula 16]

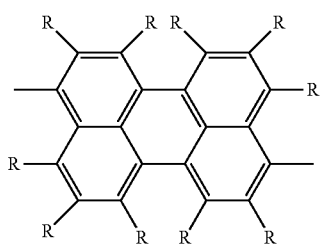

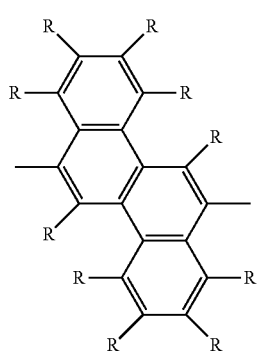

(A-18) (A-19) (A-20)

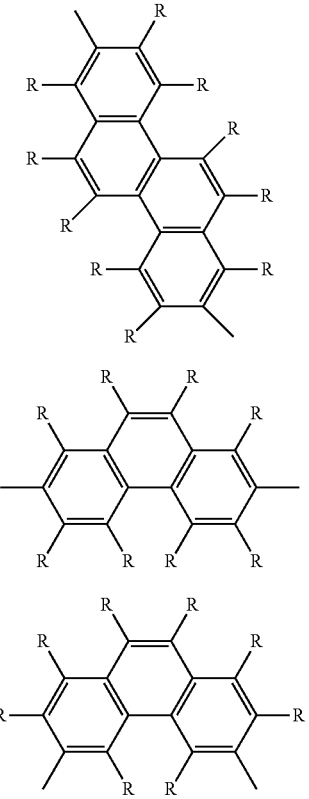

[wherein, R and $R^a$ each independently represent a hydrogen atom, an alkyl group, a cycloalkyl group, an aryl group or a monovalent heterocyclic group. A plurality of R and $R^a$ may be the same or different at each occurrence, and the plurality of $R^a$ may be combined together to form a ring together with atoms to which they are attached.]

The number of carbon atoms of the divalent heterocyclic group is, not including the number of carbon atoms of the substituent, usually 2 to 60, preferably 3 to 20, more preferably 4 to 15.

The divalent heterocyclic group optionally has a substituent and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms bonding directly to carbon atoms or hetero atoms constituting the ring, preferably groups represented by the formula (AA-1) to the formula (AA-34). The divalent heterocyclic group includes groups obtained by bonding a plurality of these groups.

[Chemical Formula 17]

(AA-1)

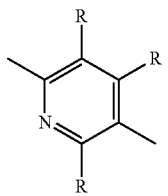

(AA-2) 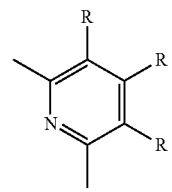
(AA-3) 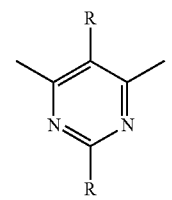
(AA-4) 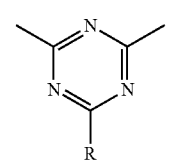
(AA-5) 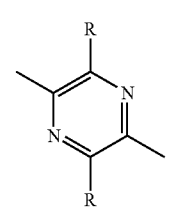
(AA-6) 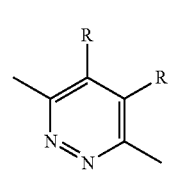
(AA-7) 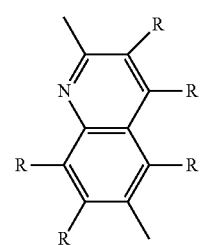
[Chemical Formula 18]
(AA-8) 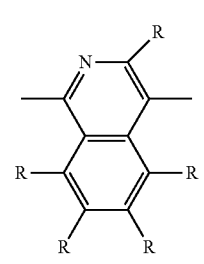
(AA-9) 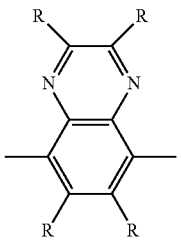
(AA-10) 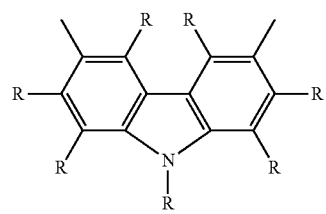
(AA-11) 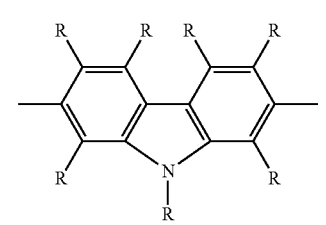
(AA-12) 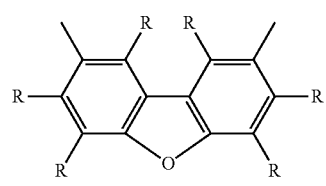
[Chemical Formula 19]
(AA-13) 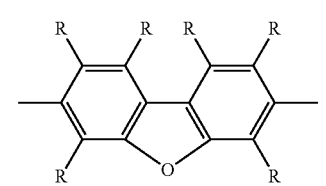
(AA-14) 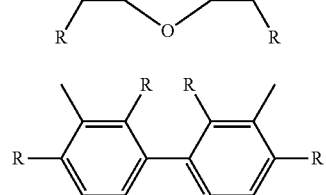
(AA-15) 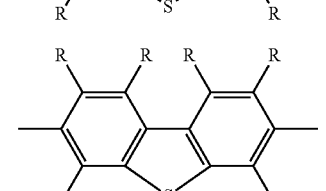
(AA-16) 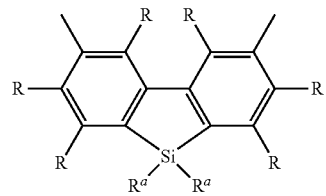

-continued
[Chemical Formula 20]
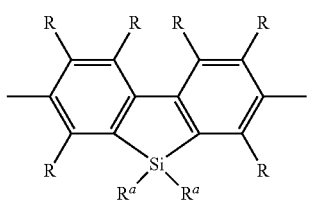 (AA-17)
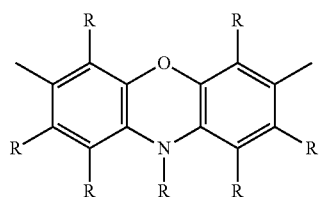 (AA-18)
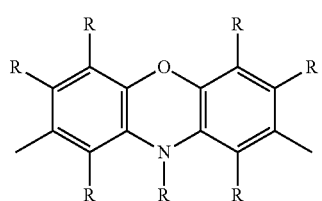 (AA-19)
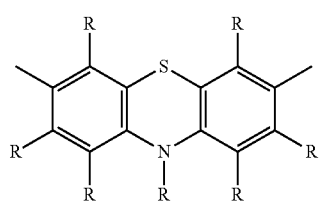 (AA-20)
[Chemical Formula 21]
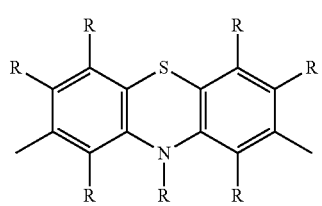 (AA-21)
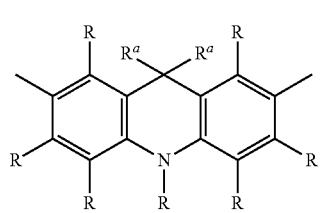 (AA-22)
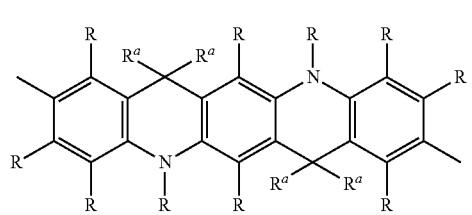 (AA-23)
-continued
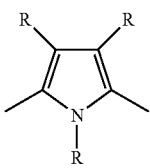 (AA-24)
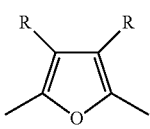 (AA-25)
[Chemical Formula 22]
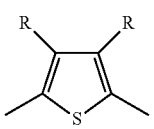 (AA-26)
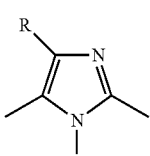 (AA-27)
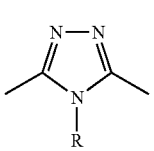 (AA-28)
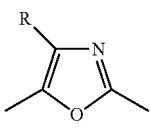 (AA-29)
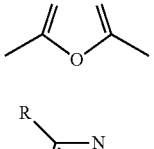 (AA-30)
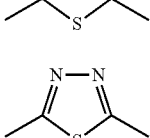 (AA-31)
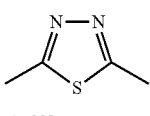 (AA-32)
[Chemical Formula 23]
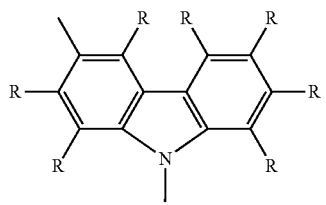 (AA-33)

-continued

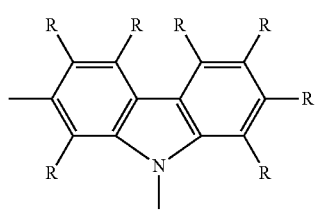

(AA-34)

[wherein, R and $R^a$ represent the same meaning as described above.]

"Substituent" denotes a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group.

<Polymer Compound>

The polymer compound of the present invention contains the above-described constitutional unit having a residue of a compound represented by the formula (1) and the above-described constitutional unit having no residue of a compound represented by the formula (1). The residue of a compound represented by the formula (1) is a group obtained by removing one or two or more hydrogen atoms from a skeleton structure of a compound represented by the formula (1) (namely, portion other than substituent). The residue of a compound represented by the formula (1) may be present at any of the main chain, side chain and end of a polymer compound. The constitutional units having a residue of a compound represented by the formula (1) and the constitutional units having no residue of a compound represented by the formula (1) each may be contained only singly or in combination of two or more in a polymer compound.

[Compound Represented by the Formula (1)]

The number of carbon atoms of the aromatic hydrocarbon ring represented by Ring A, Ring B and Ring C is, not including the number of carbon atoms of the substituent, usually 6 to 60, preferably 6 to 18, more preferably 6 to 10, particularly preferably 6. The aromatic hydrocarbon ring includes, for example, benzene, fluorene, naphthalene, anthracene and phenanthrene, preferably benzene.

The number of carbon atoms of the aromatic heterocyclic ring represented by Ring A, Ring B and Ring C is, not including the number of carbon atoms of the substituent, usually 2 to 60, preferably 3 to 20, more preferably 4 to 15. The aromatic heterocyclic ring includes, for example, pyridine, diazabenzene, azanaphthalene, diazanaphthalene, carbazole, indolocarbazole, dibenzofuran, dibenzothiophene, dibenzosilole, phenoxazine, phenothiazine, acridine, dihydroacridine, furan and thiophene.

The substituent which Ring A, Ring B and Ring C optionally have is preferably an alkyl group, an aryl group, a monovalent heterocyclic group or a substituted amino group, more preferably an alkyl group, an aryl group or a substituted amino group, since the light emitting device of the present invention is excellent in luminance life, and the foregoing groups optionally have a substituent.

Next, more specific structures (CA, CB and CC) of Ring A, Ring B and Ring C are explained.

[Chemical Formula 24]

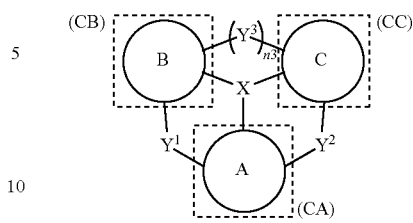

The specific structure (CA) of Ring A includes, for example, structures represented by the formula (CA01) to the formula (CA38), and is preferably a structure represented by the formula (CA01) to the formula (CA19), more preferably a structure represented by the formula (CA01) to the formula (CA05), further preferably a structure represented by the formula (CA01), since the light emitting device of the present invention is excellent in luminance life.

[Chemical Formula 25]

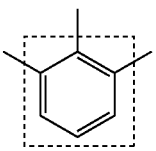

(CA01)

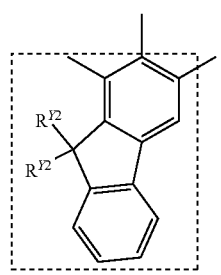

(CA02)

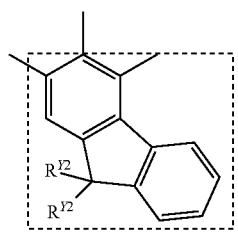

(CA03)

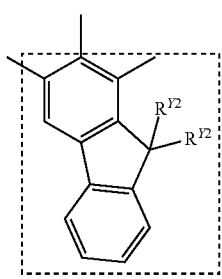

(CA04)

-continued
(CA05) 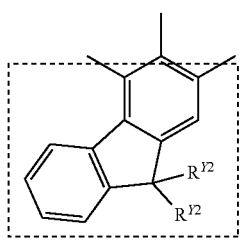
(CA06) 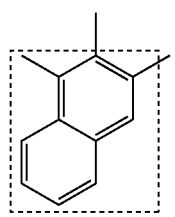
(CA07) 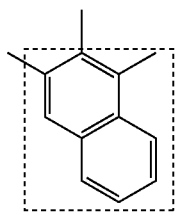
(CA08) 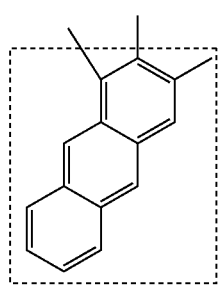
(CA09) 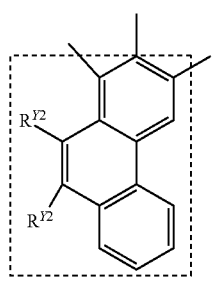
(CA10) 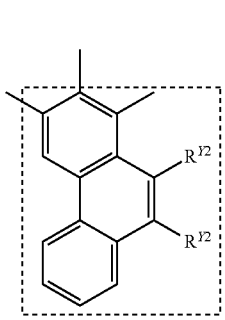
-continued
(CA11) 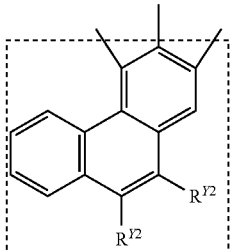
(CA12) 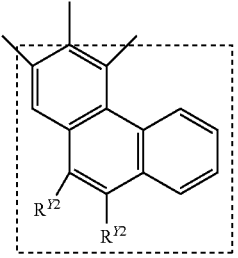
[Chemical Formula 26]
(CA13) 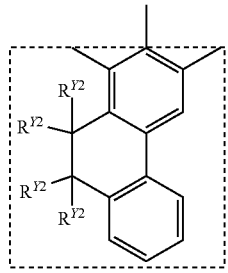
(CA14) 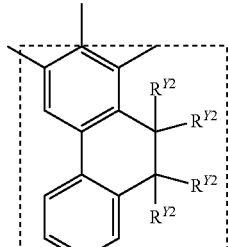
(CA15) 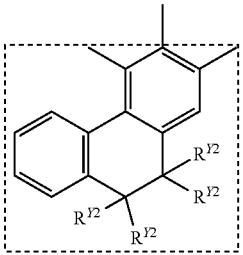

(CA16)
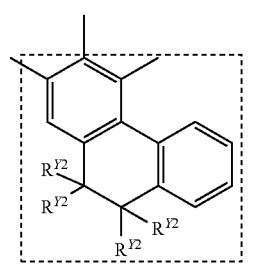
(CA17)
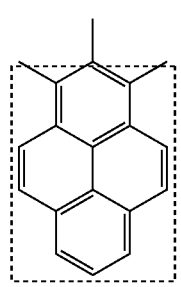
(CA18)
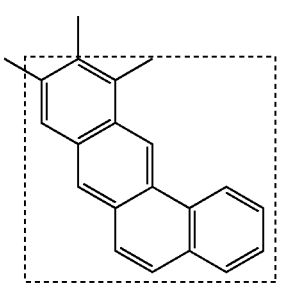
(CA19)
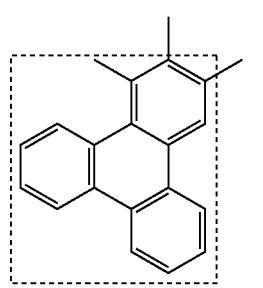
(CA20)
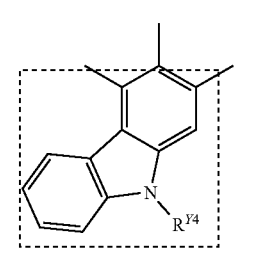
(CA21)
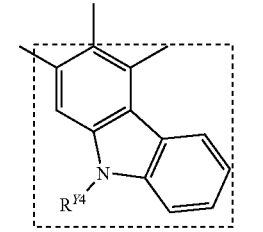
(CA22)
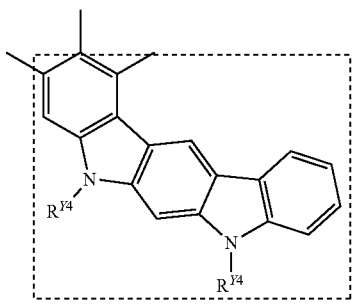
[Chemical Formula 27]
(CA23)
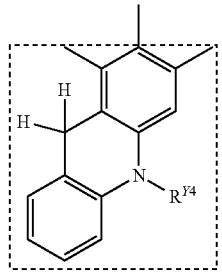
(CA24)
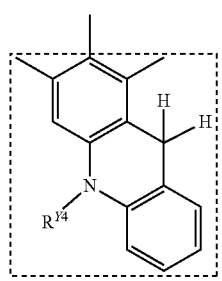
(CA25)
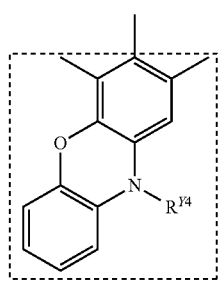
(CA26)
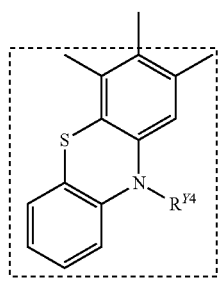

(CA27) 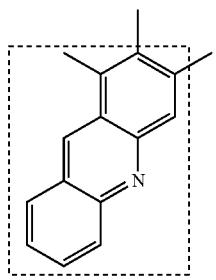

(CA28) 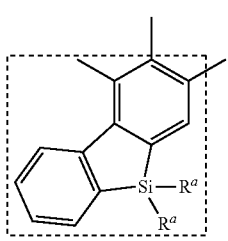

(CA29) 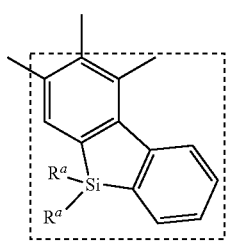

(CA30) 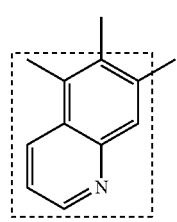

(CA31) 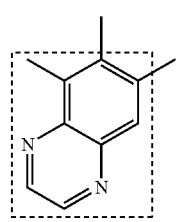

(CA33) 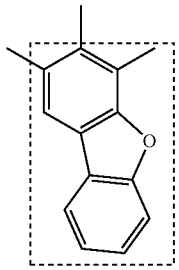

(CA34) 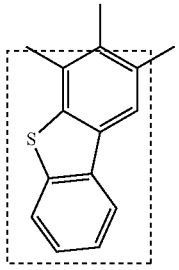

(CA35) 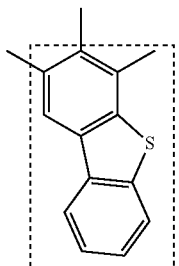

(CA36) 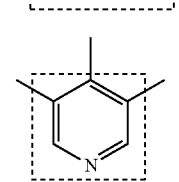

(CA37, CA38) 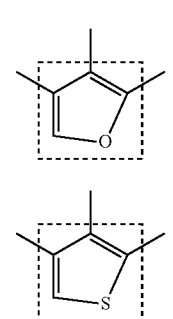

[Chemical Formula 28]

(CA32) 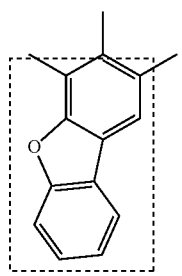

[wherein, $R^a$ represent the same meaning as described above.

A hydrogen atom may be replaced with a substituent which Ring A optionally has.

$R^{Y2}$ represents an alkyl group, a cycloalkyl group, an aryl group or a monovalent heterocyclic group, and the foregoing groups optionally have a substituent. In the group represented by —C($R^{Y2}$)$_2$—, —C$R^{Y2}$=C$R^{Y2}$— or C($R^{Y2}$)$_2$—C($R^{Y2}$)$_2$—, two of a plurality of $R^{Y2}$ may be combined together to form a ring. A plurality of $R^{Y2}$ may be the same or different.

$R^{Y4}$ represents a hydrogen atom, an alkyl group, a cycloalkyl group, an alkoxy group, a cycloalkoxy group, an aryl group or a monovalent heterocyclic group, and the foregoing groups optionally have a substituent. When a plurality of $R^{Y4}$ are present, they may be the same or different.]

$R^{Y2}$ is preferably an alkyl group, a cycloalkyl group or an aryl group, and the foregoing groups optionally have a substituent.

The specific structure (CB) of Ring B includes, for example, structures represented by the formula (CB01) to the formula (CB24), and is preferably a structure represented by the formula (CB01) to the formula (CB13), more preferably a structure represented by the formula (CB01) to the formula (CB05), particularly preferably a structure represented by the formula (CB01), since luminance life is excellent.

[Chemical Formula 29]

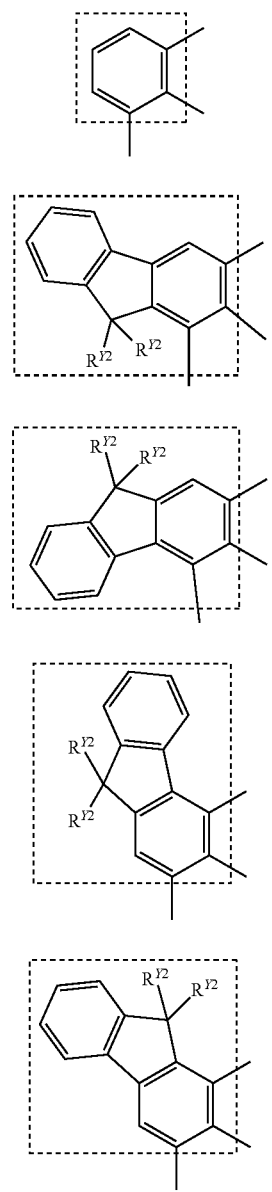

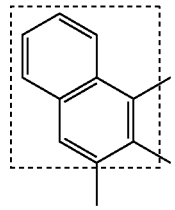
(CB06)

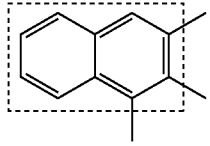
(CB07)

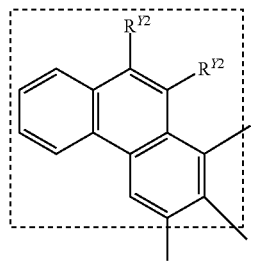
(CB08)

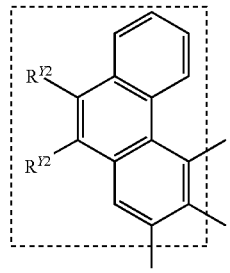
(CB09)

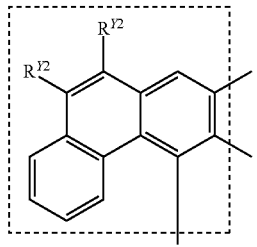
(CB10)

[Chemical Formula 30]

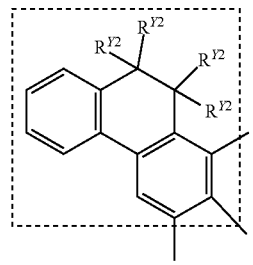
(CB11)

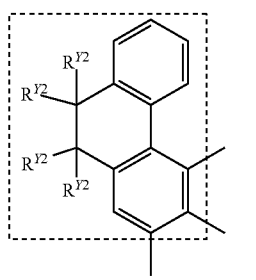 (CB12)
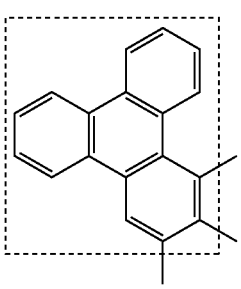 (CB13)
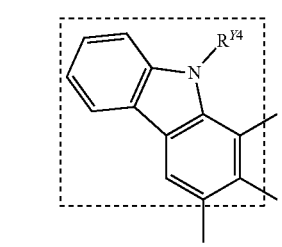 (CB14)
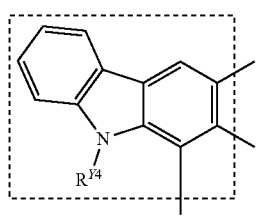 (CB15)
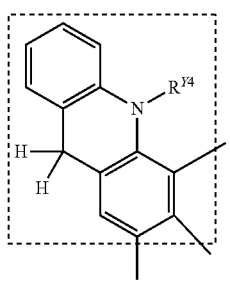 (CB16)
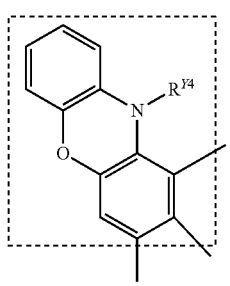 (CB17)
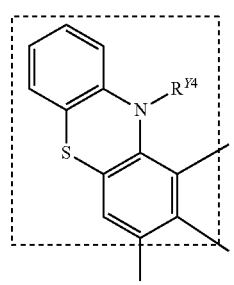 (CB18)
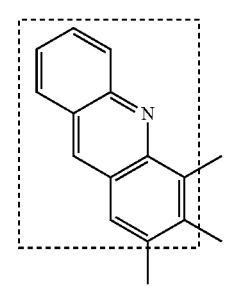 (CB19)
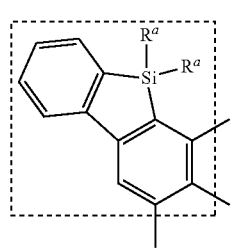 (CB20)
[Chemical Formula 31]
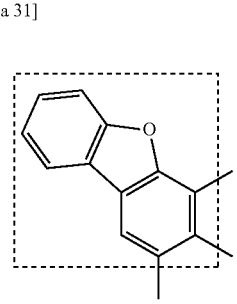 (CB21)
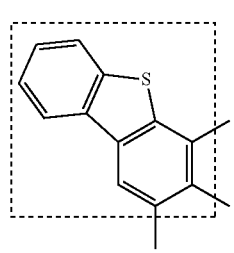 (CB22)
(CB23)

-continued (CB24)
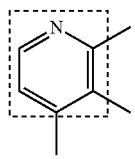

[wherein, $R^{Y2}$, $R^{Y4}$ and $R^a$ represent the same meaning as described above. A hydrogen atom may be replaced with a substituent which Ring B optionally has.]

The specific structure (CC) of Ring C includes, for example, structures represented by the formula (CC01) to the formula (CC24), and is preferably a structure represented by the formula (CC01) to the formula (CC13), more preferably a structure represented by the formula (CC01) to the formula (CC05), further preferably a structure represented by the formula (CC01).

[Chemical Formula 32]

(CC01)
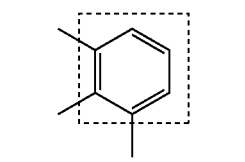

(CC02)
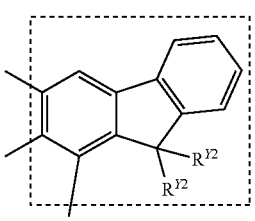

(CC03)
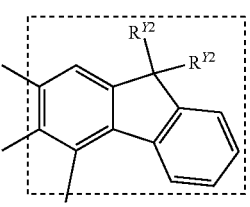

(CC04)
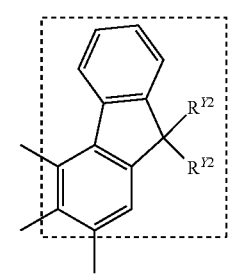

(CC05)
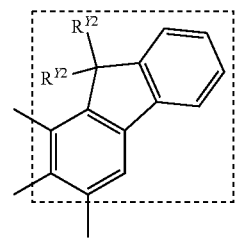

-continued (CC06)
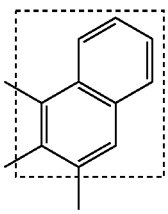

(CC07)
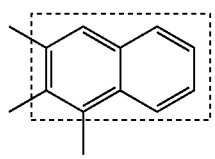

(CC08)
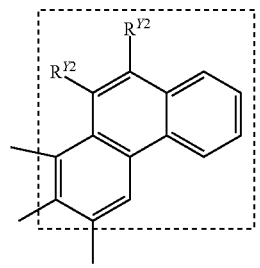

(CC09)
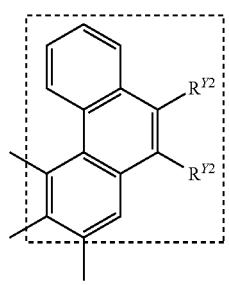

(CC10)
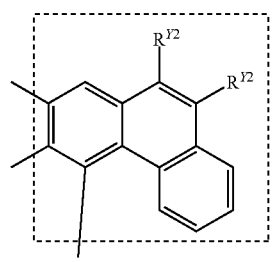

[Chemical Formula 33]

(CC11)
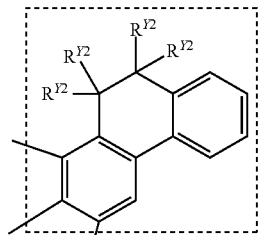

-continued
(CC12)
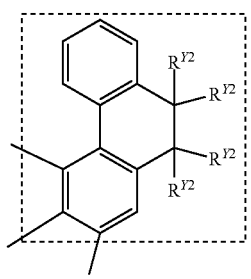
(CC13)
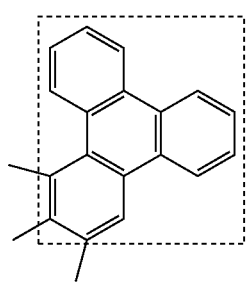
(CC14)
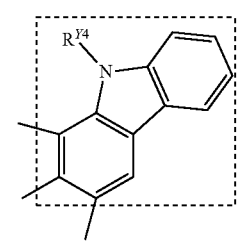
(CC15)
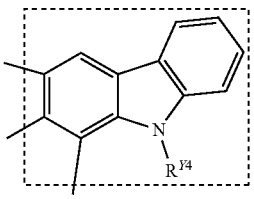
(CC16)
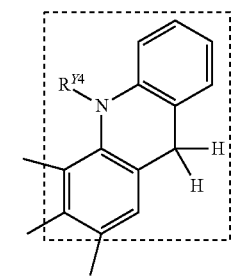
(CC17)
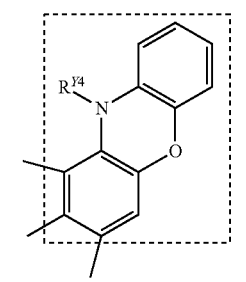
-continued
(CC18)
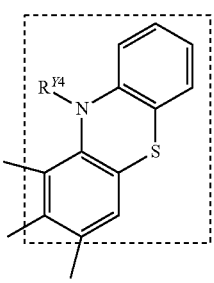
(CC19)
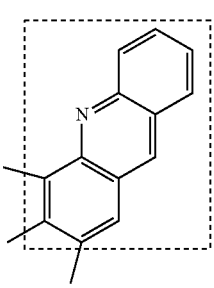
(CC20)
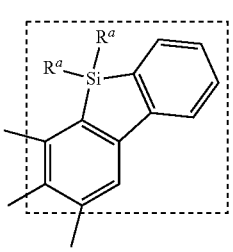
[Chemical Formula 34]
(CC21)
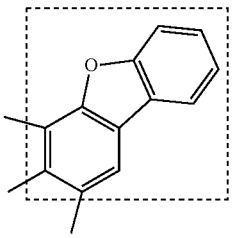
(CC22)
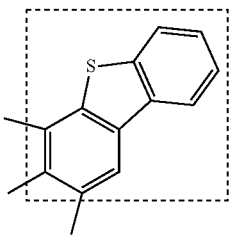
(CC23)
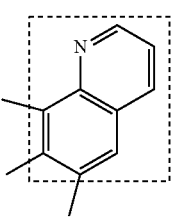

(CC24)

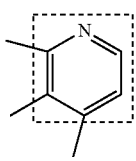

[wherein, $R^{Y2}$, $R^{Y4}$ and $R^a$ represent the same meaning as described above. A hydrogen atom may be replaced with a substituent which Ring C optionally has.]

In the formula (CA02) to the formula (CA05), the formula (CB02) to the formula (CB05) and the formula (CC02) to the formula (CC05), the combination of two $R^{Y2}$ in a group represented by —C($R^{Y2}$)$_2$— is preferably a combination in which both are alkyl groups or cycloalkyl groups, a combination in which both are aryl groups, a combination in which both are monovalent heterocyclic groups, or a combination in which one is an alkyl group or a cycloalkyl group and the other is an aryl group or a monovalent heterocyclic group, more preferably a combination in which one is an alkyl group or a cycloalkyl group and the other is an aryl group, and the foregoing groups optionally have a substituent. When two $R^{Y2}$ in a group represented by —C($R^{Y2}$)$_2$— are combined together to form a ring together with the carbon atom, the group represented by —C($R^{Y2}$)$_2$— is preferably a group represented by the formula (Y-A1) to the formula (Y-A5), more preferably a group represented by the formula (Y-A4), and the foregoing groups optionally have a substituent.

[Chemical Formula 35]

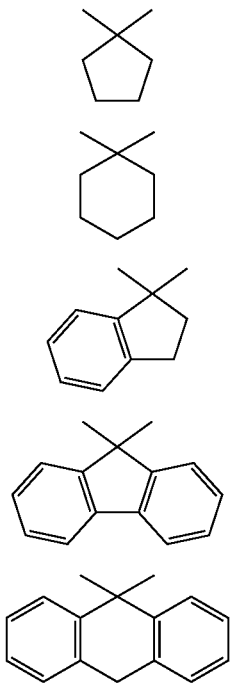

(Y-A1)

(Y-A2)

(Y-A3)

(Y-A4)

(Y-A5)

In the formula (CA09) to the formula (CA12), the formula (CB08) to the formula (CB10) and the formula (CC08) to the formula (CC10), the combination of two $R^{Y2}$ in a group represented by —C($R^{Y2}$)=C($R^{Y2}$)— is preferably a combination in which both are alkyl groups or cycloalkyl groups, or a combination in which one is an alkyl group or a cycloalkyl group and the other is an aryl group, and the foregoing groups optionally have a substituent.

In the formula (CA13) to the formula (CA16), the formula (CB11), the formula (CB12), the formula (CC11) and the formula (CC12), four $R^{Y2}$ in a group represented by —C($R^{Y2}$)$_2$—C($R^{Y2}$)$_2$— are each preferably an alkyl group optionally having a substituent or a cycloalkyl group optionally having a substituent. A plurality of $R^{Y2}$ may be combined together to form a ring together with carbon atoms to which they are attached, and when the plurality of $R^{Y2}$ form a ring, the group represented by —C($R^{Y2}$)$_2$—C($R^{Y2}$)$_2$— is preferably a group represented by the formula (Y-B1) to the formula (Y-B5), more preferably a group represented by the formula (Y-B3), and the foregoing groups optionally have a substituent.

[Chemical Formula 36]

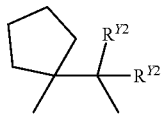

(Y-B1)

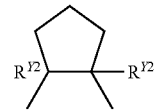

(Y-B2)

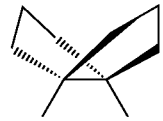

(Y-B3)

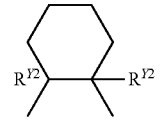

(Y-B4)

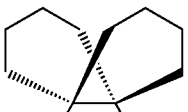

(Y-B5)

[wherein, $R^{Y2}$ represent the same meaning as described above.]

In the formula (CA20) to the formula (CA26), the formula (CB14) to the formula (CB18) and the formula (CC14) to the formula (CC18), $R^{Y4}$ is preferably an alkyl group, a cycloalkyl group, an alkoxy group, a cycloalkoxy group, an aryl group or a monovalent heterocyclic group, more preferably an aryl group, and the foregoing groups optionally have a substituent.

In the polymer compound of the present invention, the combination of Ring A, Ring B and Ring C is preferably a combination in which Ring A is a structure represented by the formula (CA01) to the formula (CA05), Ring B is a structure represented by the formula (CB01) to the formula (CB05) and Ring C is a structure represented by the formula (CC01) to the formula (CC05), more preferably a combination in which Ring A is a structure represented by the formula (CA01), Ring B is a structure represented by the formula (CB01) to the formula (CB05) and Ring C is a structure represented by the formula (CC01) to the formula (CC05), further preferably a combination in which Ring A is a structure represented by the formula (CA01), Ring B is a structure represented by the formula (CB01) and Ring C is a structure represented by the formula (CC01), since the light emitting device of the present invention is excellent in luminance life.

In the formula (1), X is preferably a boron atom, a phosphorus atom, P=O or an aluminum atom, more preferably a boron atom or P=O, further preferably a boron atom, since the light emitting device of the present invention is more excellent in luminance life.

n3 is preferably 0, since the light emitting device of the present invention is more excellent in luminance life.

In the formula (1), $Y^2$, $Y^2$ and $Y^3$ are each preferably N-Ry or a sulfur atom, more preferably N-Ry, since the polymer compound of the present invention is excellent in stability.

In the formula (1), at least one of $Y^2$, $Y^2$ and $Y^3$ is preferably N-Ry, all of $Y^2$, $Y^2$ and $Y^3$ represent more preferably N-Ry, since the polymer compound of the present invention is excellent in stability. When n3 is 0, both $Y^2$ and $Y^2$ represent N-Ry.

Ry is preferably a hydrogen atom, an aryl group optionally having a substituent or a monovalent heterocyclic group optionally having a substituent, more preferably a hydrogen atom or an aryl group optionally having a substituent, further preferably an aryl group optionally having a substituent, since the light emitting device of the present invention is more excellent in luminance life.

When Ry is bonded to Ring A, Ring B or Ring C via a connecting group, the connecting group includes, for example, divalent groups such as —O—, —S—, —CH$_2$— and the like, and trivalent groups such as a boron atom and the like.

When Ry is bonded to Ring A, Ring B or Ring C via a trivalent group, it is usually bonded to Ring A and a substituent on Ring A, or bonded to Ring B and a substituent on Ring B, or bonded to Ring C and a substituent on Ring C.

The structure in which Ry is bonded to Ring A, Ring B or Ring C directly or via a connecting group includes, for example, structures represented by the formula (E01) to the formula (E16).

[Chemical Formula 37]

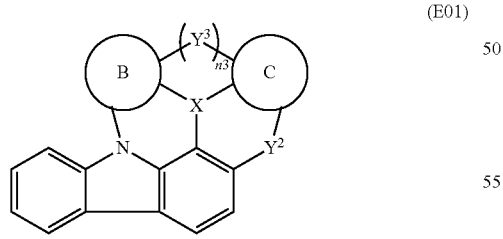
(E01)

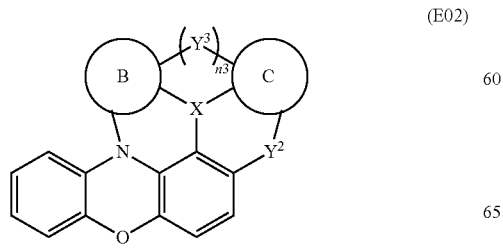
(E02)

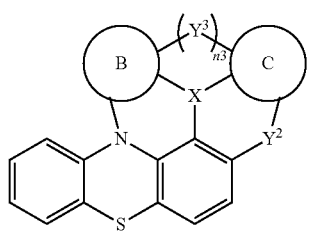
(E03)

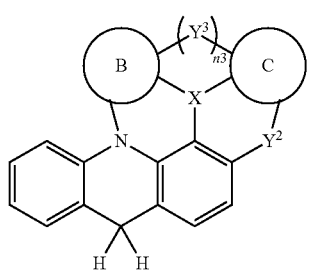
(E04)

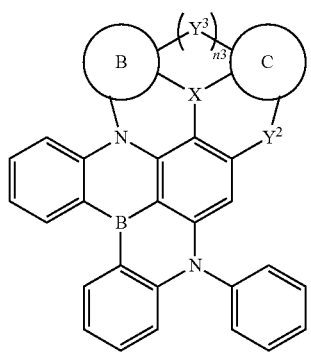
(E05)

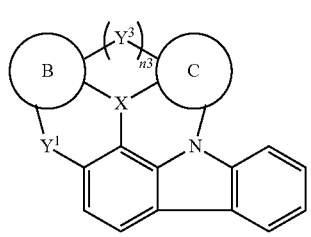
(E06)

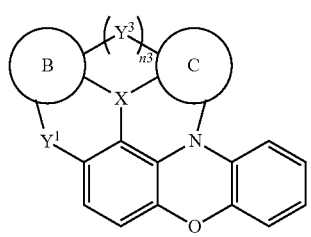
(E07)

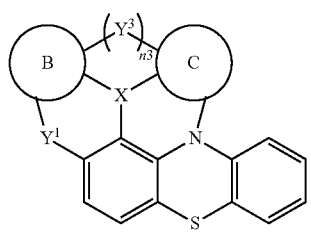
(E08)

[Chemical Formula 38]
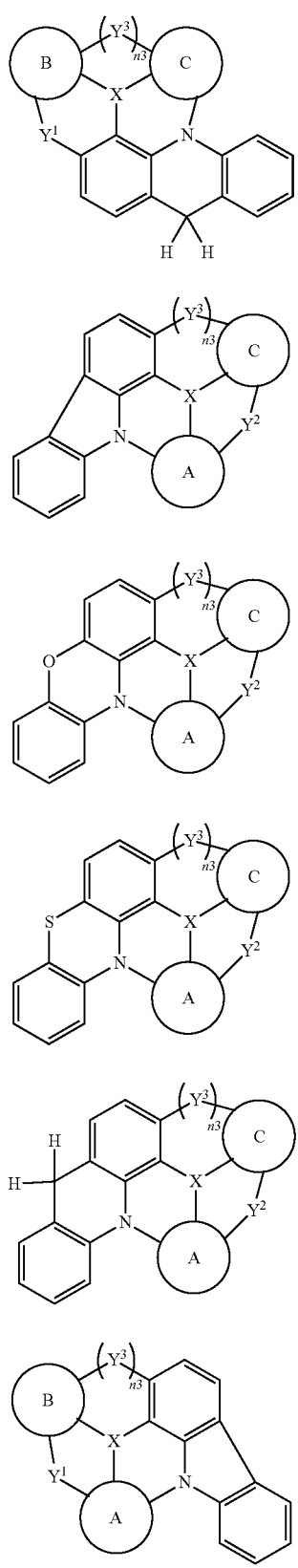
(E09) 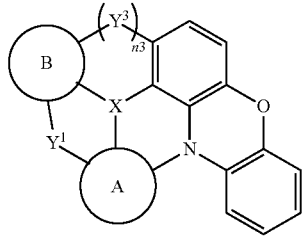
(E10) 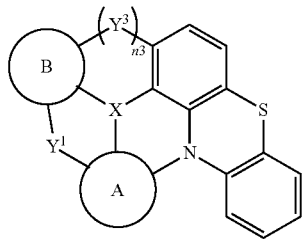
(E11) 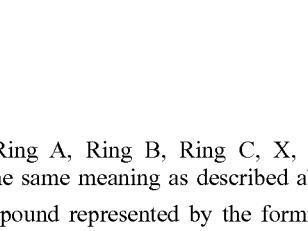
[wherein, Ring A, Ring B, Ring C, X, $Y^2$, $Y^3$ and n3 represent the same meaning as described above.]
The compound represented by the formula (1) includes compounds represented by the formula (1-201) to the formula (1-220), the formula (1-301) to the formula (1-305) and the formula (1-401) to the formula (1-432).
[Chemical Formula 39]
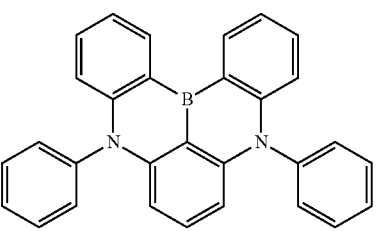
(1-201)
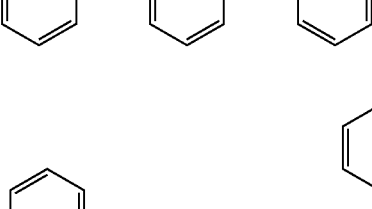
(1-202)
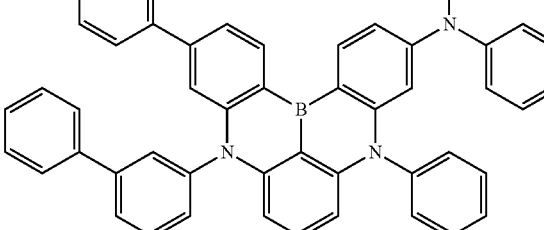

(1-203)
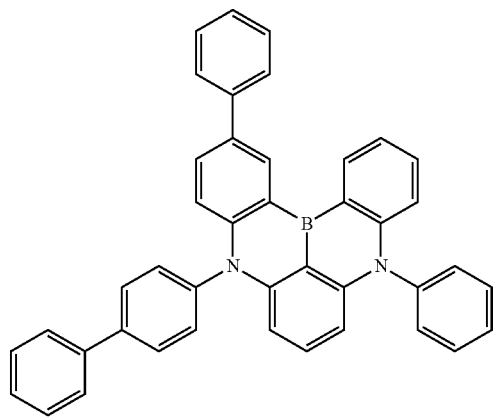
(1-204)
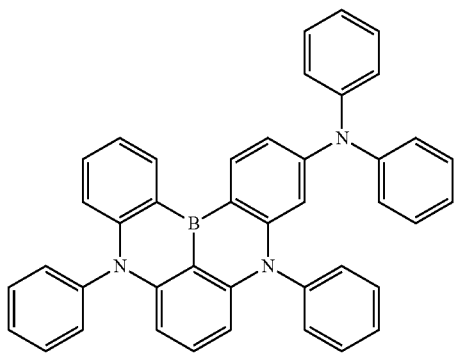
(1-205)
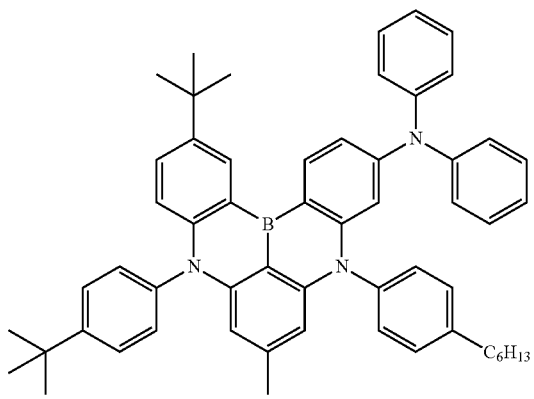
(1-206)
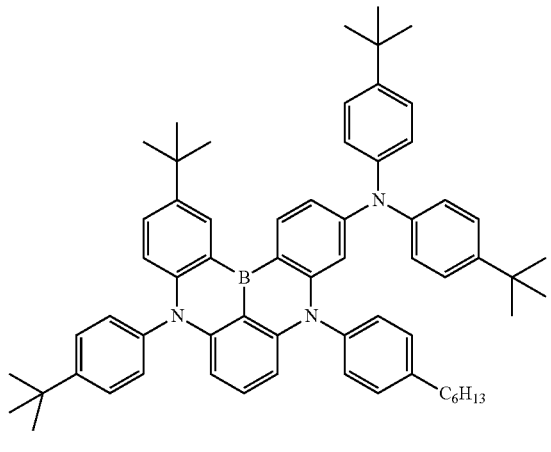
[Chemical Formula 40]
(1-207)
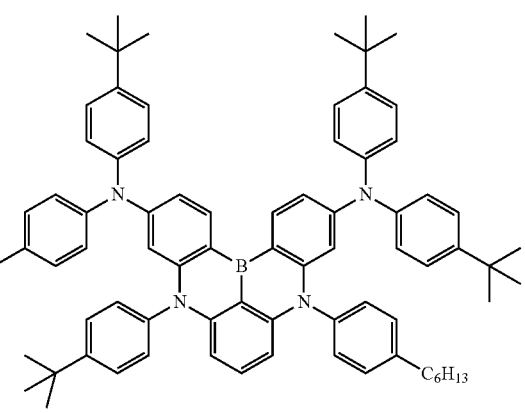
(1-208)
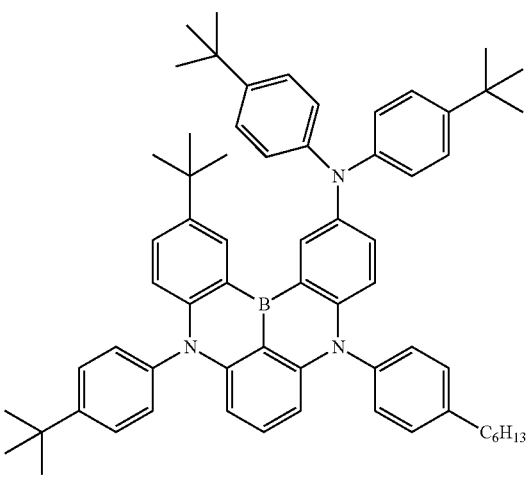

(1-209)
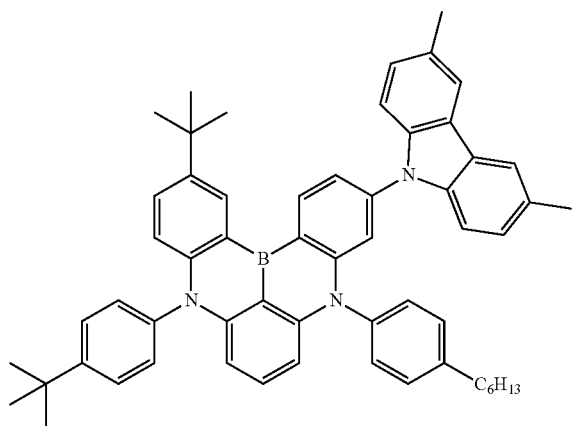
[Chemical Foruma 41]
(1-210)
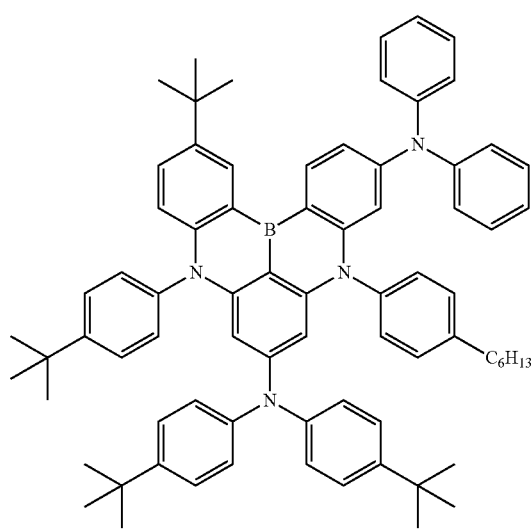
(1-211)
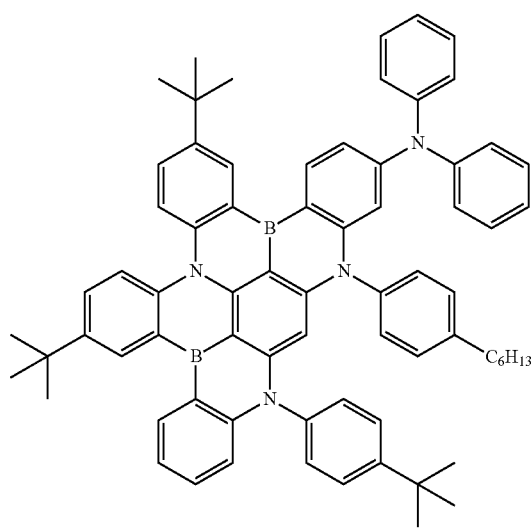
(1-212)
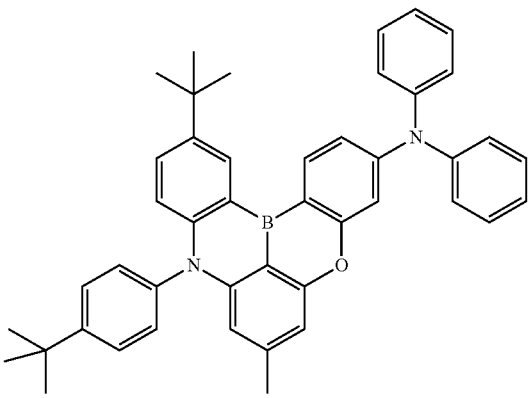
[Chemical Forumla 42]
(1-213)
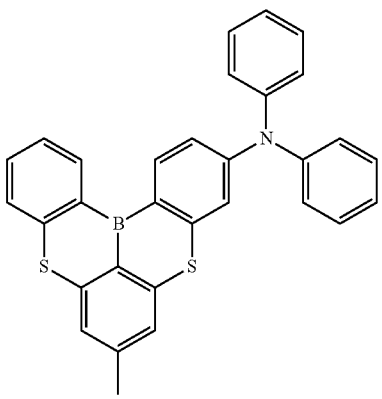
(1-214)
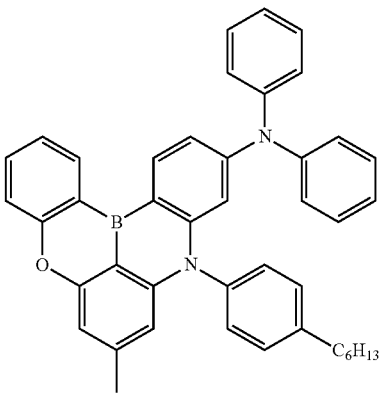

[Chemical Formula 43]
(1-215)
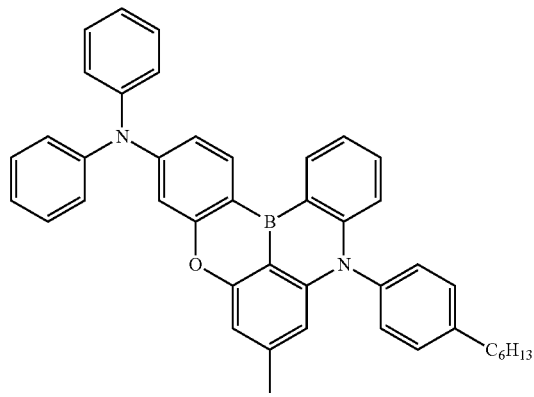
(1-216)
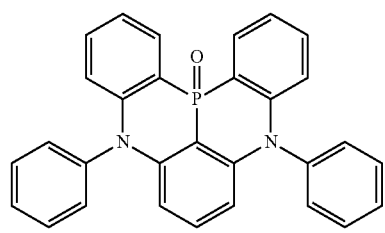
(1-217)
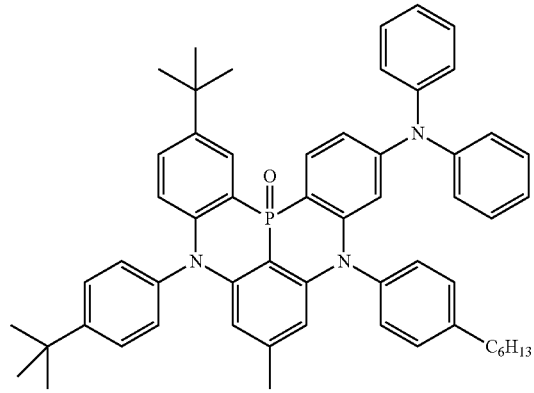
(1-218)
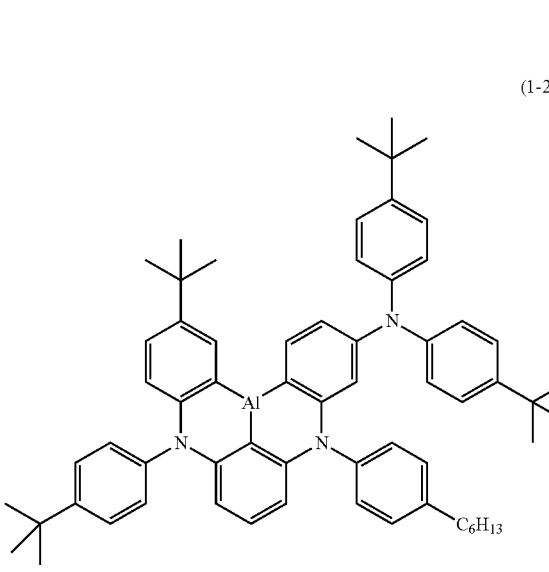
(1-219)
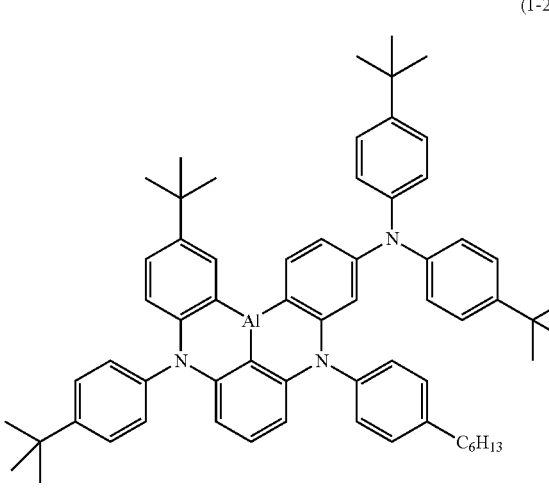
(1-220)
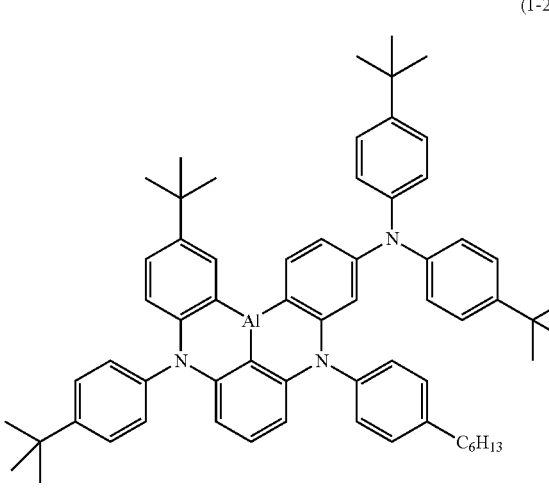
[Chemical Formula 44]
(1-301)
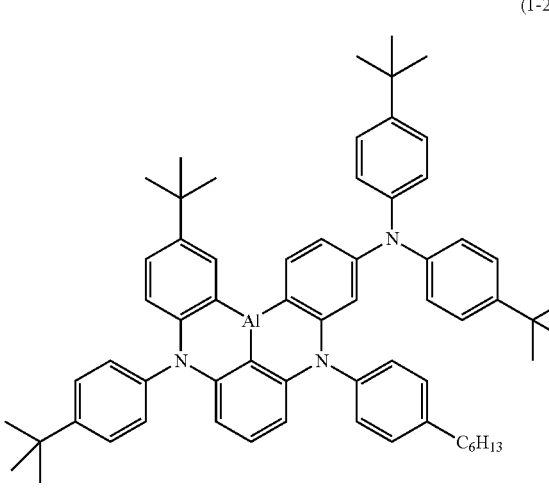

(1-302)
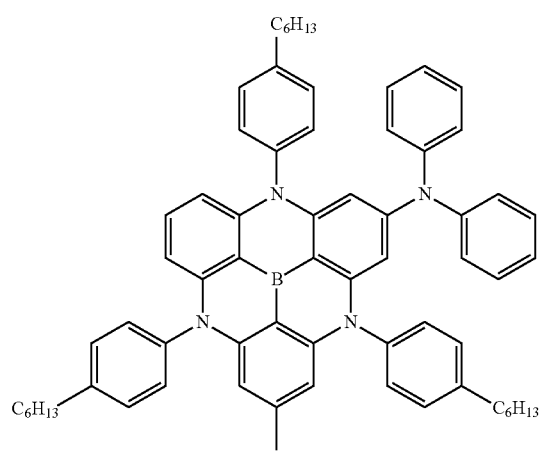
[Chemical Formula 45]
(1-401)
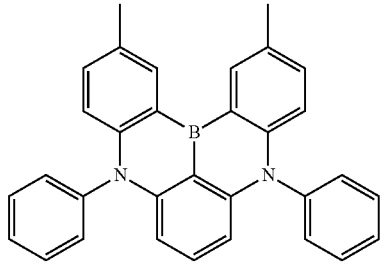
(1-303)
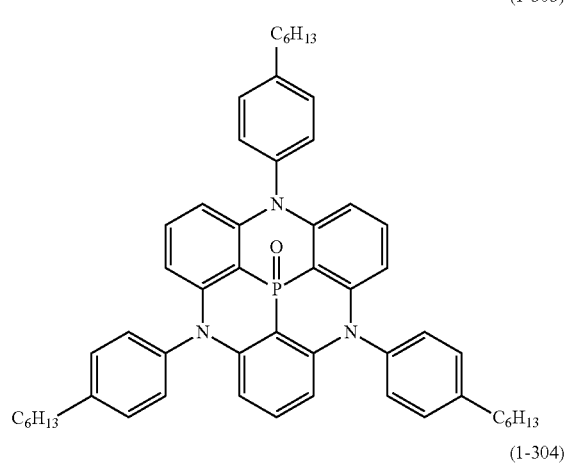
(1-402)
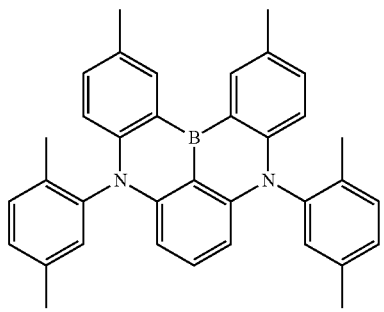
(1-403)
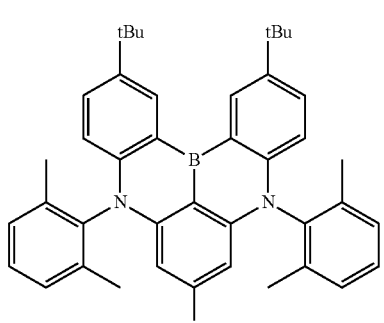
(1-304)
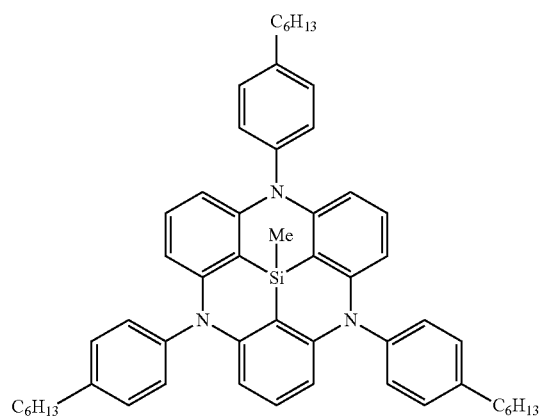
(1-404)
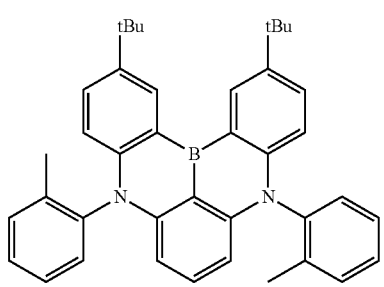
(1-305)
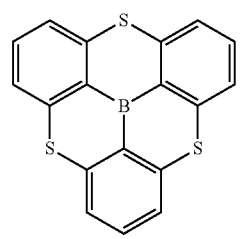
(1-405)

(1-406)
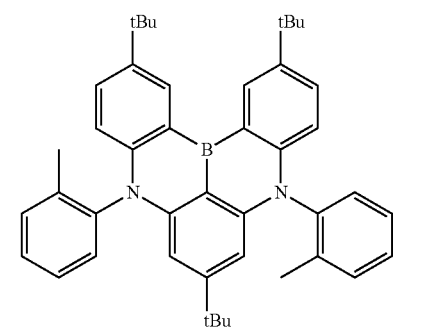
(1-407)
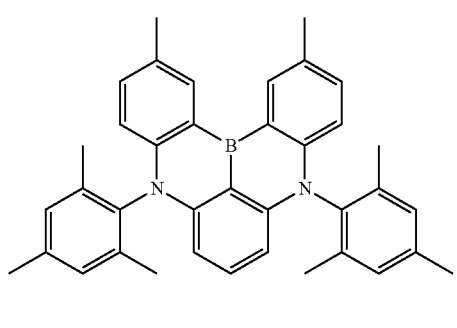
(1-408)
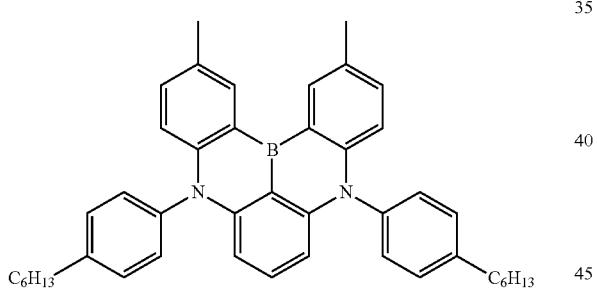
(1-409)
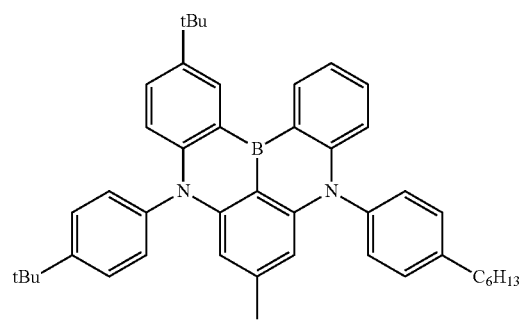
[Chemical Foruma 46]
(1-410)
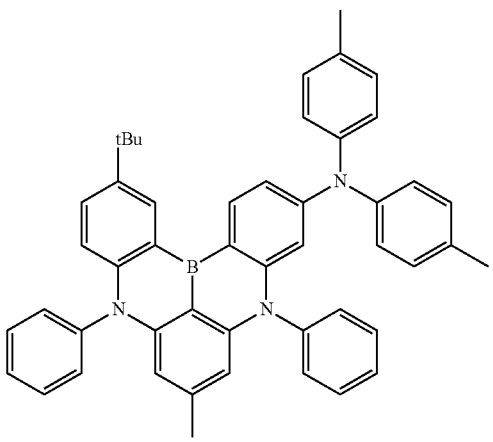
(1-411)
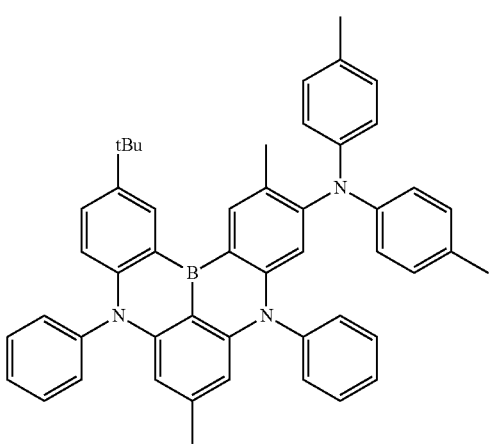
(1-412)
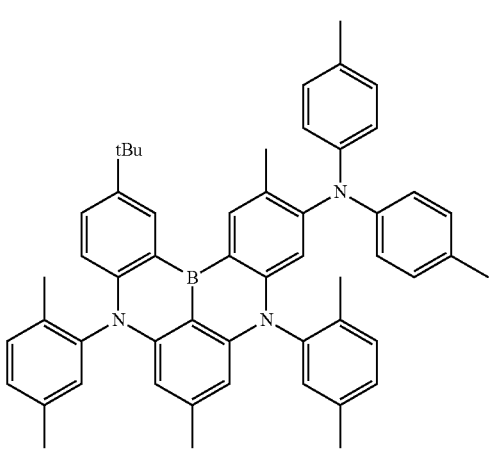

(1-413)
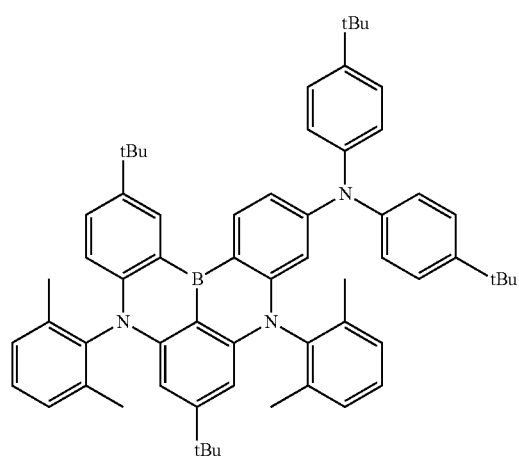
(1-414)
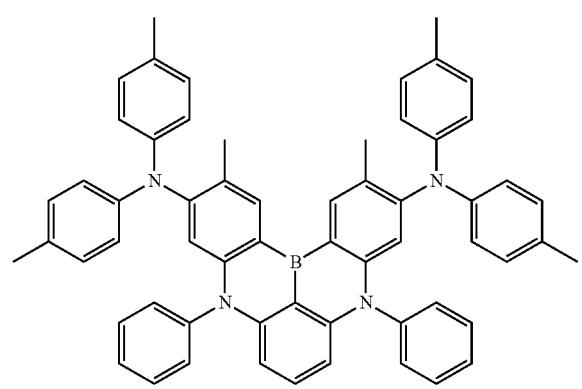
(1-415)
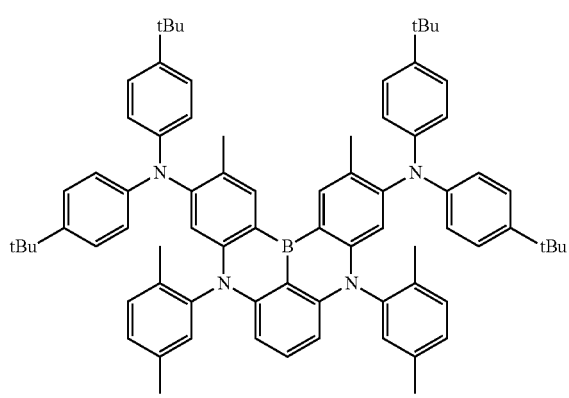
(1-416)
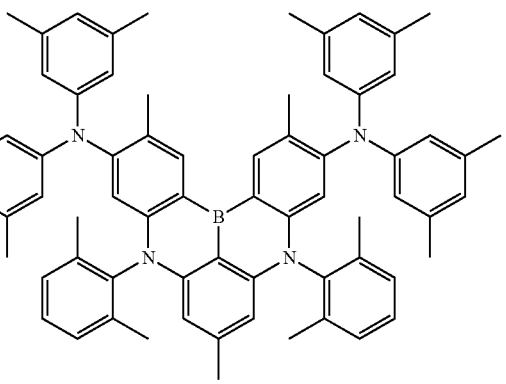
[Chemical Formula 47]
(1-417)
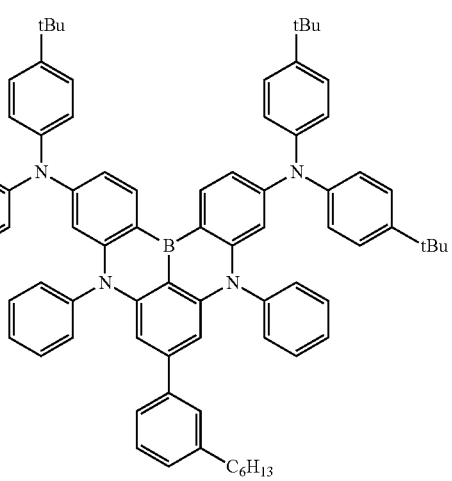
(1-418)
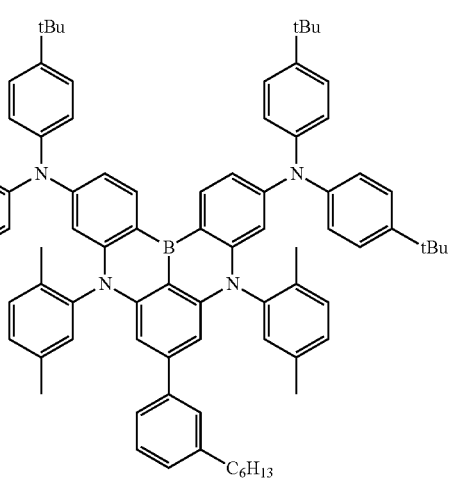

(1-419)
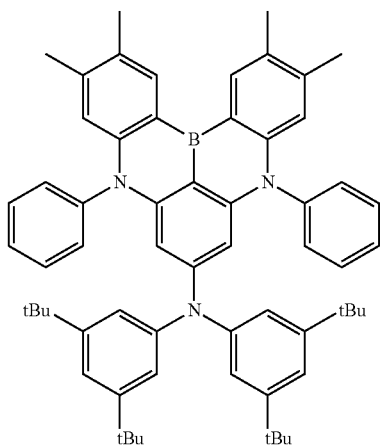
(1-420)
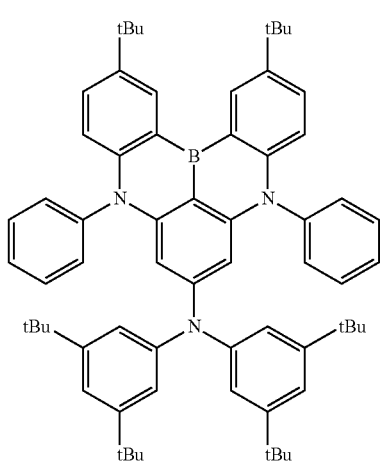
[Chemical Formula 48]
(1-421)
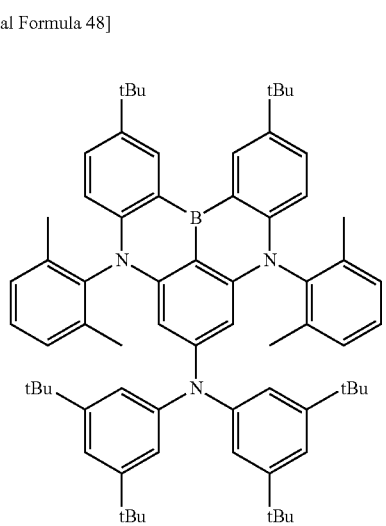
(1-422)
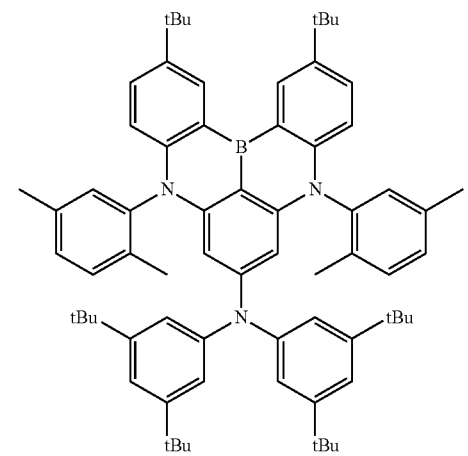
(1-425)
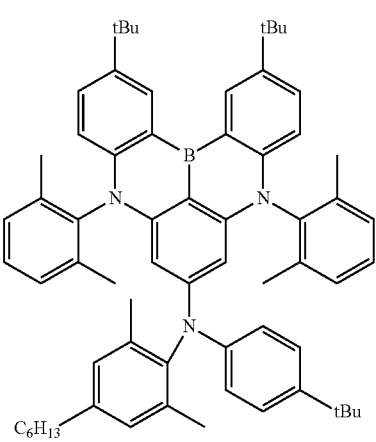
(1-426)
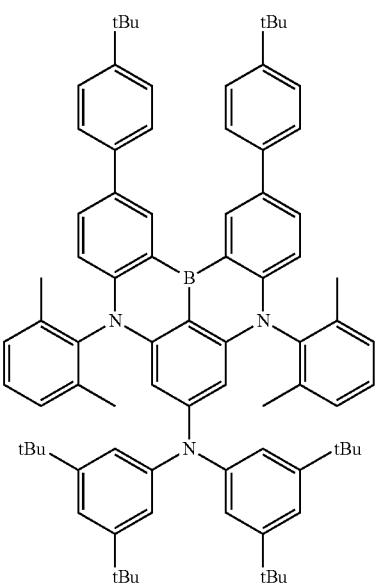

[Chemical Formula 49]

(1-427)
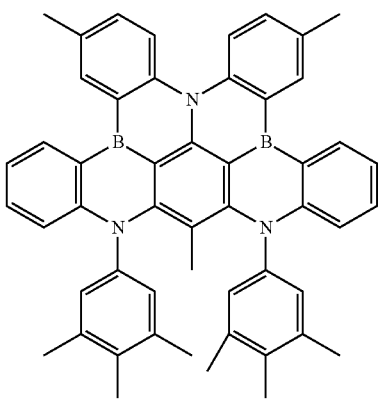

(1-428)
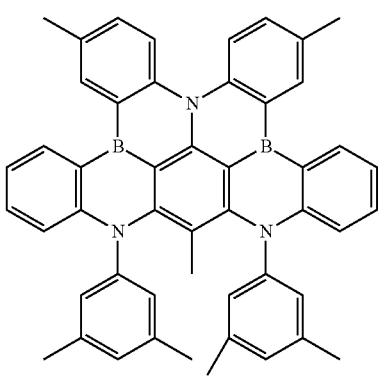

(1-429)
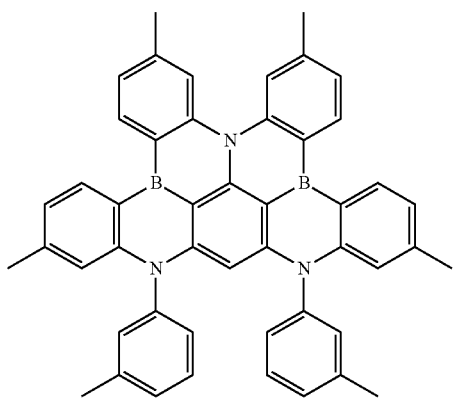

[Chemical Forumla 50]

(1-430)
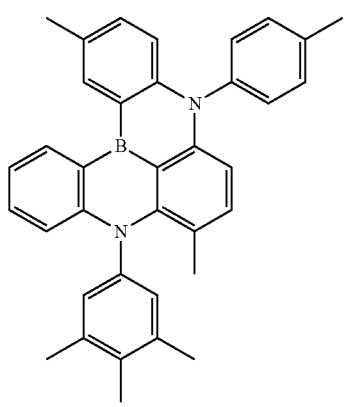

(1-431)
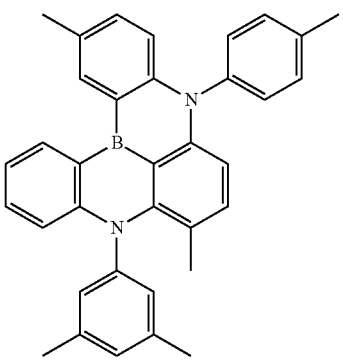

(1-432)
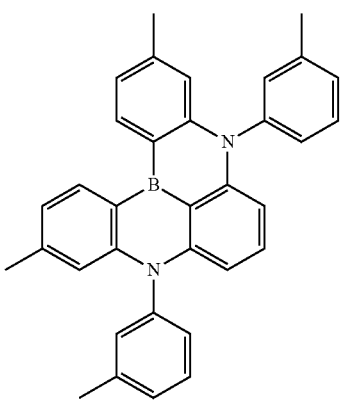

The constitutional unit having a residue of a compound represented by the formula (1) is preferably a constitutional unit represented by the formula (2), the formula (2') or the formula (3).

[Constitutional Unit Represented by the Formula (2)]

nA is preferably 0 or 1, more preferably 0, since the light emitting device of the present invention is more excellent in luminance life.

n is preferably 1, since the light emitting device of the present invention is more excellent in luminance life.

$Ar^3$ is preferably an aromatic hydrocarbon group optionally having a substituent, since the light emitting device of the present invention is more excellent in luminance life.

The number of carbon atoms of the aromatic hydrocarbon group represented by $Ar^3$ is, not including the number of carbon atoms of the substituent, usually 6 to 60, preferably 6 to 30, more preferably 6 to 18.

The arylene group portion obtained by removing n substituents from an aromatic hydrocarbon group represented by $Ar^3$ is preferably a group represented by the formula (A-1) to the formula (A-20), more preferably a group represented by the formula (A-1), the formula (A-2), the formula (A-6) to the formula (A-10), the formula (A-19) or the formula (A-20), further preferably a group represented by the formula (A-1), the formula (A-2), the formula (A-7), the formula (A-9) or the formula (A-19), and the foregoing groups optionally have a substituent.

The number of carbon atoms of the heterocyclic group represented by $Ar^3$ is, not including the number of carbon atoms of the substituent, usually 2 to 60, preferably 3 to 30, more preferably 4 to 18.

The divalent heterocyclic group portion obtained by removing n substituents from a heterocyclic group represented by $Ar^3$ is preferably a group represented by the formula (AA-1) to the formula (AA-34).

The aromatic hydrocarbon group and the heterocyclic group represented by $Ar^3$ optionally have a substituent, and the substituent includes an alkyl group, a cycloalkyl group, an alkoxy group, a cycloalkoxy group, an aryl group, an aryloxy group, a halogen atom, a monovalent heterocyclic group and a cyano group.

The number of carbon atoms of the alkylene group represented by $L^A$ is, not including the number of carbon atoms of the substituent, usually 1 to 20, preferably 1 to 15, more preferably 1 to 10. The number of carbon atoms of the cycloalkylene group represented by $L^A$ is, not including the number of carbon atoms of the substituent, usually 3 to 20.

The alkylene group and the cycloalkylene group optionally have substituent, and examples thereof include a methylene group, an ethylene group, a propylene group, a butylene group, a hexylene group, a cyclohexylene group and an octylene group. The substituent which the alkylene group and the cycloalkylene group optionally have includes, for example, an alkyl group, a cycloalkyl group, an alkoxy group, a cycloalkoxy group, a halogen atom and a cyano group.

The arylene group represented by $L^A$ optionally have a substituent. The arylene group includes o-phenylene, m-phenylene and p-phenylene. The substituent which the arylene group optionally has includes, for example, an alkyl group, a cycloalkyl group, an alkoxy group, a cycloalkoxy group, an aryl group, an aryloxy group, a monovalent heterocyclic group, a halogen atom and a cyano group.

The aryl group represented by R' includes a phenyl group, a naphthyl group and a fluorenyl group. The substituent which the aryl group optionally has includes, for example, an alkyl group, a cycloalkyl group, an alkoxy group, a cycloalkoxy group, an aryl group, an aryloxy group, a monovalent heterocyclic group, a halogen atom and a cyano group.

The definition, preferable range and examples of the residue of a compound represented by the formula (1) represented by Q are the same as the definition, preferable range and examples of the residue of a compound represented by the formula (1) described above.

The constitutional units represented by the formula (2) may be contained only singly or in combination of two or more in a polymer compound.

[Constitutional Unit Represented by the Formula (2')]

mA is preferably 0 or 1, more preferably 0, since the light emitting device of the present invention is more excellent in luminance life.

m is preferably 2, since the light emitting device of the present invention is more excellent in luminance life.

c is preferably 0, since production of the polymer compound of the present invention is easy and the light emitting device of the present invention is more excellent in luminance life.

$Ar^5$ is preferably an aromatic hydrocarbon group optionally having a substituent, since the light emitting device of the present invention is more excellent in luminance life.

The definition and examples of the arylene group portion obtained by removing m substituents in an aromatic hydrocarbon group represented by $Ar^5$ are the same as the definition and examples of the arylene group represented by $Ar^{X2}$ in the formula (X) described later.

The definition and examples of the divalent heterocyclic group portion obtained by removing m substituents in a heterocyclic group represented by $Ar^5$ are the same as the definition and examples of the divalent heterocyclic group portion represented by $Ar^{X2}$ in the formula (X) described later.

The definition and examples of the divalent group obtained by removing m substituents in a group in which at least one aromatic hydrocarbon ring and at least one heterocyclic ring are directly bonded represented by $Ar^5$ are the same as the definition and examples of the divalent group in which at least one arylene group and at least one divalent heterocyclic group are directly bonded represented by $Ar^{X2}$ in the formula (X) described later.

$Ar^4$ and $Ar^6$ are each preferably an arylene group optionally having a substituent, since the light emitting device of the present invention is more excellent in luminance life.

The definition and examples of the arylene group and the divalent heterocyclic group represented by $Ar^4$ and $Ar^6$ are the same as the definition and examples of the arylene group and the divalent heterocyclic group represented by $Ar^{X1}$ and $Ar^{X3}$ in the formula (X) described later, respectively.

The groups represented by $Ar^4$, $Ar^5$ and $Ar^6$ optionally have a substituent, and the substituent includes an alkyl group, a cycloalkyl group, an alkoxy group, a cycloalkoxy group, an aryl group, an aryloxy group, a halogen atom, a monovalent heterocyclic group and a cyano group.

The definition and examples of the alkylene group, the cycloalkylene group, the arylene group and the divalent heterocyclic group represented by $K^A$ are the same as the definition and examples of the alkylene group, the cycloalkylene group, the arylene group and the divalent heterocyclic group represented by $L^A$, respectively.

$K^A$ is preferably an alkylene group, an arylene group or a group represented by —NR'—, further preferably a phenylene group, an alkylene group or —N($C_6H_5$)—, since production of the polymer compound of the present invention is easy, and the foregoing groups optionally have a substituent.

The definition, preferable range and examples of the residue of a compound represented by the formula (1) represented by Q' are the same as the definition, preferable range and examples of the residue of a compound represented by the formula (1) described above.

The constitutional units represented by the formula (2') may be contained only singly or in combination of two or more in a polymer compound.

The total amount of a constitutional unit represented by the formula (2) and a constitutional unit represented by the formula (2') contained in the polymer compound of the present invention is preferably 0.1 to 50% by mole, more preferably 0.1 to 30% by mole, further preferably 0.1 to 10% by mole, particularly preferably 0.5 to 5% by mole, with respect to the total amount of all constitutional units contained in the polymer compound, since the polymer compound is excellent in stability.

[Preferable Embodiment of Constitutional Unit Represented by the Formula (2) or the Formula (2')]

The constitutional unit represented by the formula (2) includes, for example, constitutional units represented by the formula (2-1) to the formula (2-17). The constitutional unit represented by the formula (2') includes, for example, constitutional units represented by the formula (2'-1) to the formula (2'-14). Of them, constitutional units represented by the formula (2-1) to the formula (2-14) or the formula (2'-1) to the formula (2'-9) are preferable, constitutional units represented by the formula (2-5) to the formula (2-14) or the formula (2'-1) to the formula (2'-6) are more preferable, constitutional units represented by the formula (2-5) to the formula (2-10) or the formula (2'-1) to the formula (2'-3) are further preferable, since the light emitting device of the present invention is excellent in luminance life.

[Chemical Formula 51]
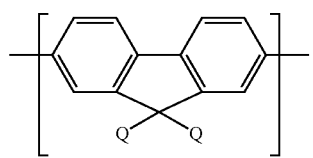 (2-1)
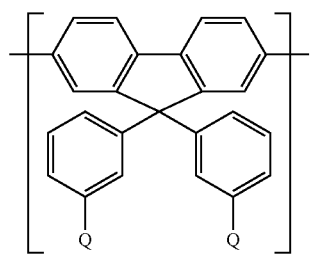 (2-2)
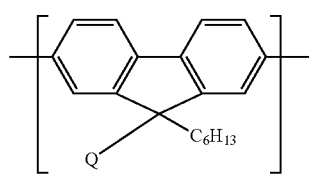 (2-3)
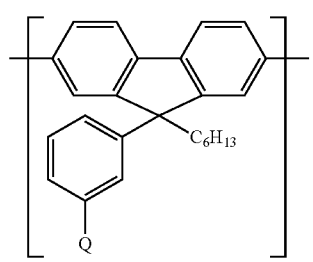 (2-4)
[Chemical Formula 52]
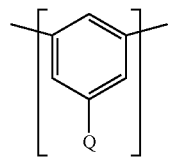 (2-5)
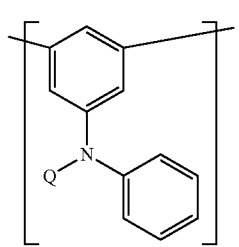 (2-6)
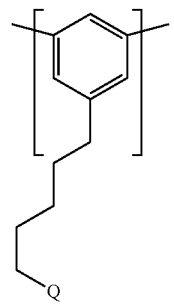 (2-7)
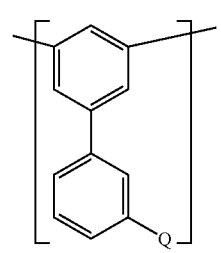 (2-8)
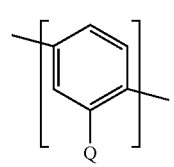 (2-9)
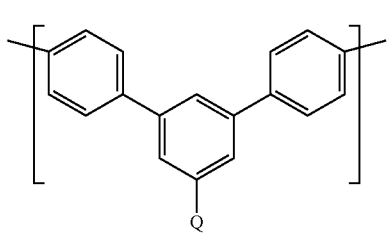 (2-10)
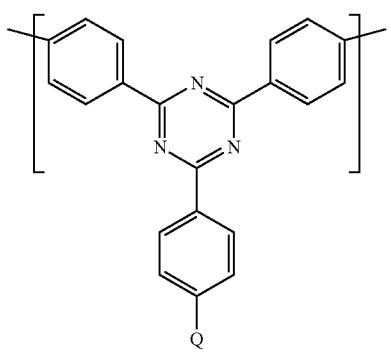 (2-11)

-continued
(2-12)
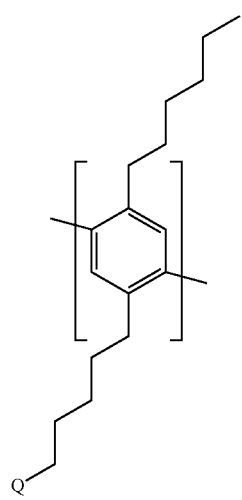
(2-13)
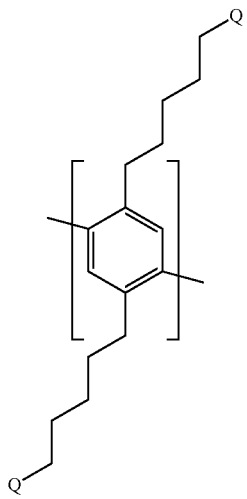
(2-14)
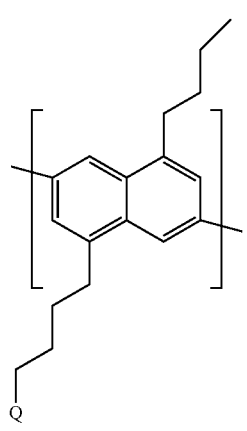
-continued
[Chemical Forumla 53]
(2-15)
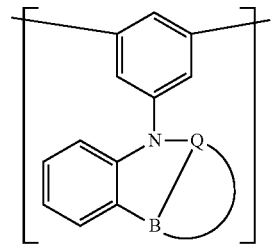
(2-16)
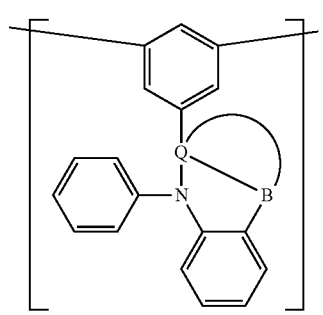
(2-17)
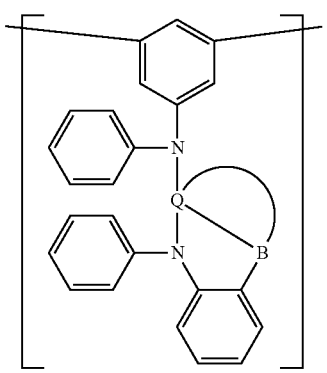
[Chemical Formula 54]
(2'-1)
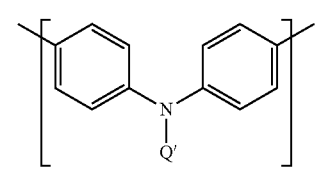
(2'-2)
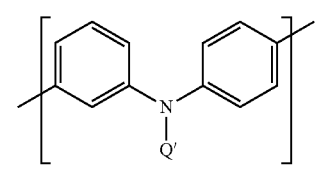
(2'-3)
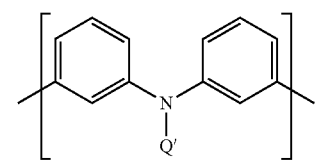

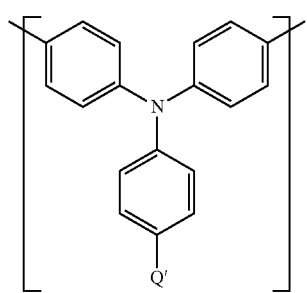 (2'-4)
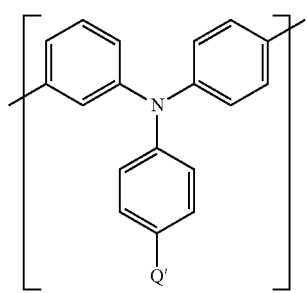 (2'-5)
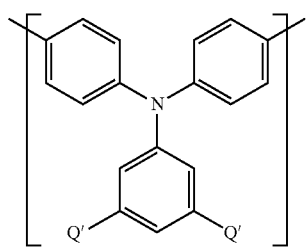 (2'-6)
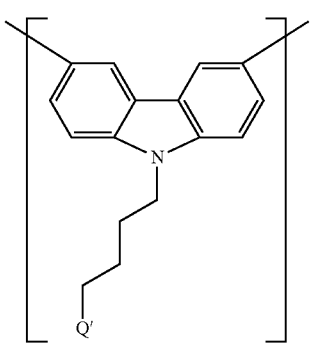 (2'-7)
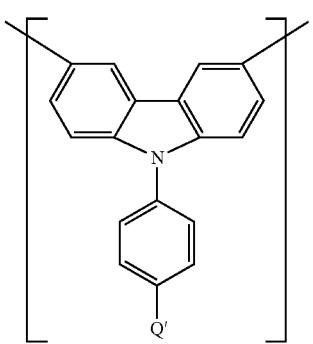 (2'-8)
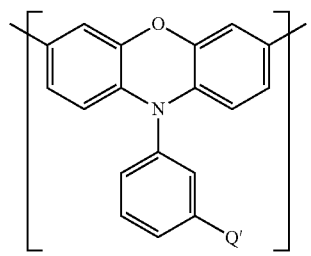 (2'-9)
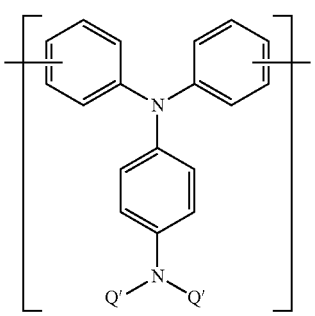 (2'-10)
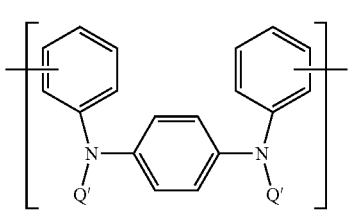 (2'-11)
[Chemical Formula 55]
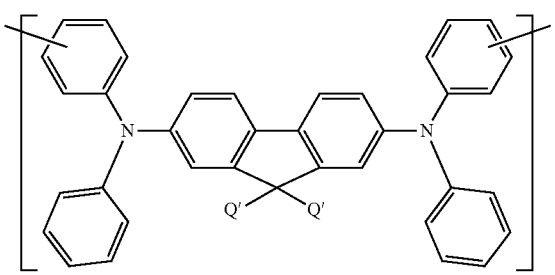 (2'-12)
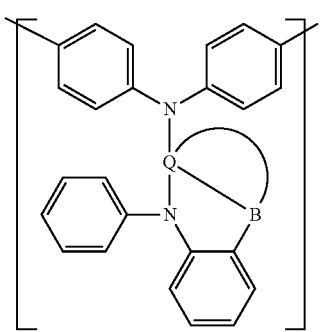 (2'-13)

-continued (2'-14)

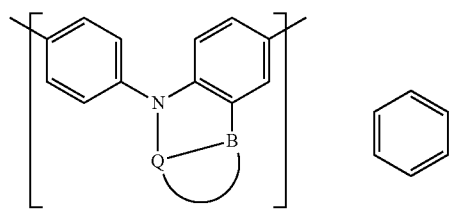

[wherein, Q and Q' represent the same meaning as described above. arc represents a direct bond.]

The constitutional unit represented by the formula (2) includes, for example, the above-described constitutional unit represented by the formula (31), and constitutional units represented by the formula (32), the formula (35), the formula (36), the formula (38) and the formula (39), and is preferably a constitutional unit represented by the formula (31) or the formula (32), more preferably a constitutional unit represented by the formula (31).

[Chemical Formula 56]

(32)

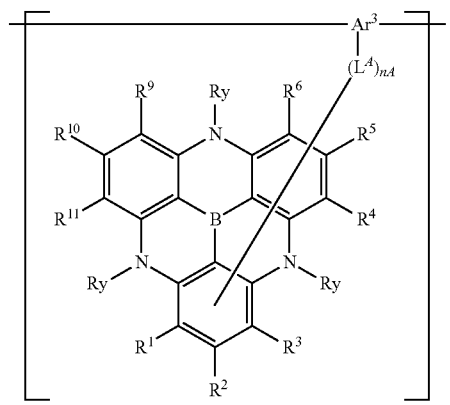

(35)

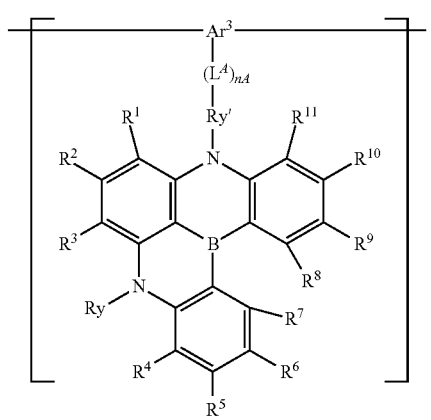

-continued (36)

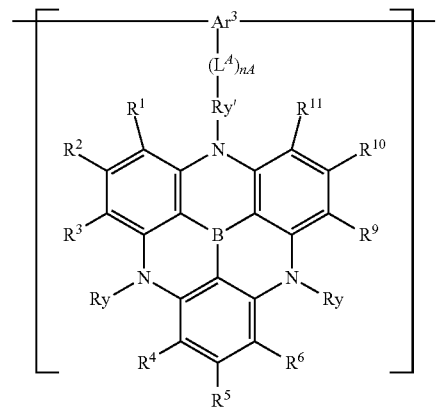

[Chemical Formula 57]

(38)

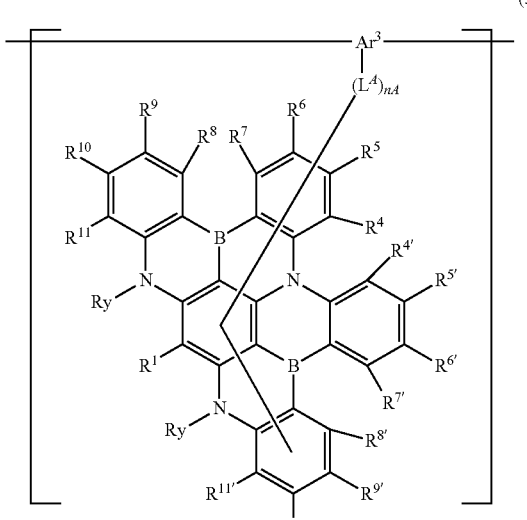

(39)

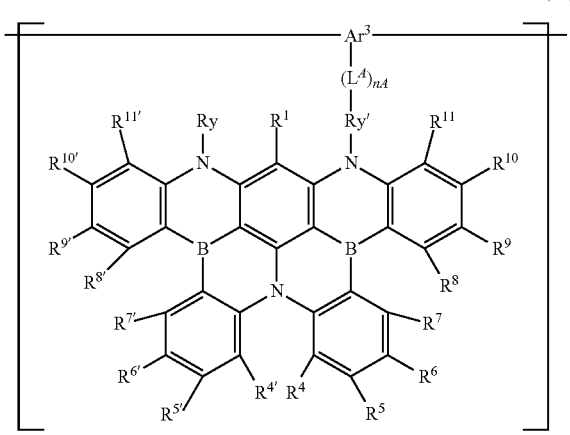

[wherein,
$R^1, R^2, R^3, R^4, R^5, R^6, R^7, R^8, R^9, R^{10}, R^{11}$, Ry, Ry', $Ar^3$, $L^A$ and nA represent the same meaning as described above.

$R^{4'}, R^{5'}, R^{6'}, R^{7'}, R^{8'}, R^{9'}, R^{10'}$ and $R^{11'}$ each independently represent a connecting bond, a hydrogen atom, an alkyl group, a cycloalkyl group, an alkoxy group, a cycloalkoxy group, an aryl group, an aryloxy group, a monovalent heterocyclic group or a substituted amino group, and the foregoing groups optionally have a substituent.

In the formula (32), one of $R^1$, $R^2$, $R^3$, $R^4$, $R^5$, $R^6$, $R^7$, $R^8$, $R^9$, $R^{10}$ and $R^{11}$ is a connecting bond, and in the formula (38), one of $R^1$, $R^4$, $R^5$, $R^6$, $R^9$, $R^{10}$, $R^{11}$, $R^{4'}$, $R^{5'}$, $R^{6'}$, $R^{7'}$, $R^{8'}$, $R^{9'}$, $R^{10'}$, and $R^{11'}$ is a connecting bond.]

The preferable range of $R^1$, $R^2$, $R^3$, $R^4$, $R^5$, $R^6$, $R^7$, $R^8$, $R^9$, $R^{10}$, $R^{11}$, $R^{4'}$, $R^{5'}$, $R^{6'}$, $R^{7'}$, $R^{8'}$, $R^{9'}$, $R^{10'}$, and $R^{11'}$ not being a connecting bond in constitutional units represented by the formula (31), the formula (32) and the formula (39) is a hydrogen atom or the same as the preferable range of the substituent which Ring A, Ring B and Ring C optionally have.

The constitutional unit represented by the formula (2') includes, for example, the above-described constitutional unit represented by the formula (41), and constitutional units represented by the formula (42), the formula (45), the formula (46), the formula (48) and the formula (49), and is preferably a constitutional unit represented by the formula (41) or the formula (42), more preferably a constitutional unit represented by the formula (41).

[Chemical Formula 58]

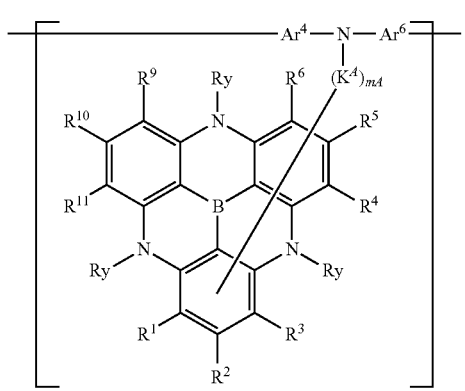

(42)

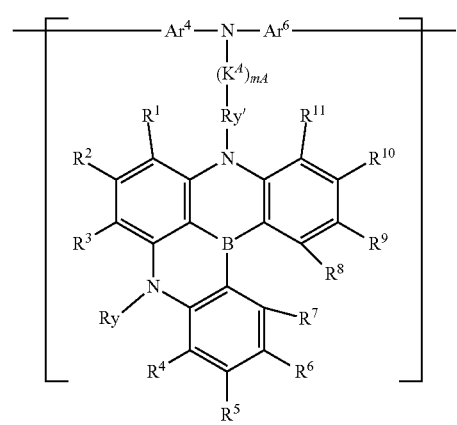

(45)

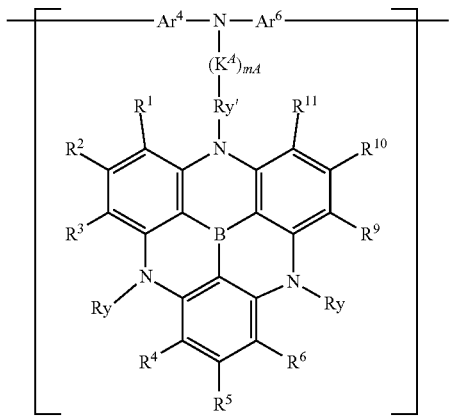

(46)

[Chemical Formula 59]

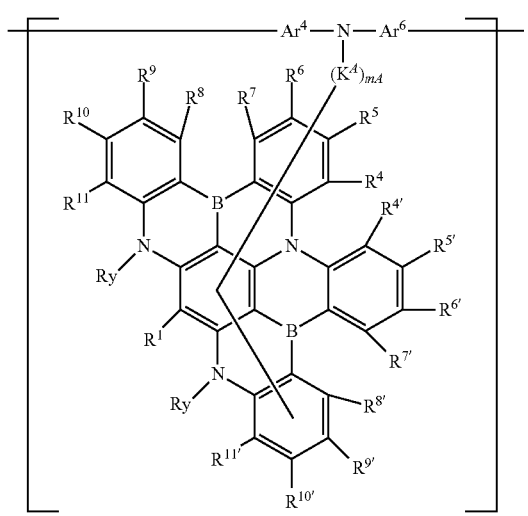

(48)

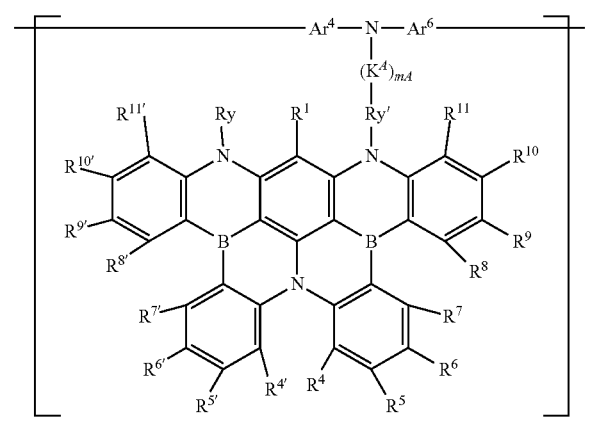

(49)

[wherein, $R^1$, $R^2$, $R^3$, $R^4$, $R^5$, $R^6$, $R^7$, $R^8$, $R^9$, $R^{10}$, $R^{11}$, Ry, Ry', $Ar^4$, $Ar^6$, $K^A$ and mA represent the same meaning as described above.

$R^{4'}$, $R^{5'}$, $R^{6'}$, $R^{7'}$, $R^{8'}$, $R^{9'}$, $R^{10'}$, and $R^{11'}$ represent the same meaning as described above.

In the formula (42), one of $R^1$, $R^2$, $R^3$, $R^4$, $R^5$, $R^6$, $R^7$, $R^8$, $R^9$, $R^{10}$ and $R^{11}$ is a connecting bond, and in the formula (48), one of $R^1$, $R^4$, $R^5$, $R^6$, $R^9$, $R^{10}$, $R^{11}$, $R^{4'}$, $R^{5'}$, $R^{6'}$, $R^{7'}$, $R^{8'}$, $R^{9'}$, $R^{10'}$ and $R^{11'}$ is a connecting bond.]

The preferable range of $R^1$, $R^2$, $R^3$, $R^4$, $R^5$, $R^6$, $R^7$, $R^8$, $R^9$, $R^{10}$, $R^{11}$, $R^{4'}$, $R^{5'}$, $R^{6'}$, $R^{7'}$, $R^{8'}$, $R^{9'}$, $R^{10'}$ and $R^{11'}$ not being a connecting bond in constitutional units represented by the formula (41), the formula (42) and the formula (48) is a hydrogen atom or the same as the preferable range of the substituent which Ring A, Ring B and Ring C optionally have.

The constitutional unit represented by the formula (2) and the formula (2') includes, for example, constitutional units represented by the formula (2-101) to the formula (2-104) and the formula (2'-101) to the formula (2'-104).

[Chemical Formula 60]

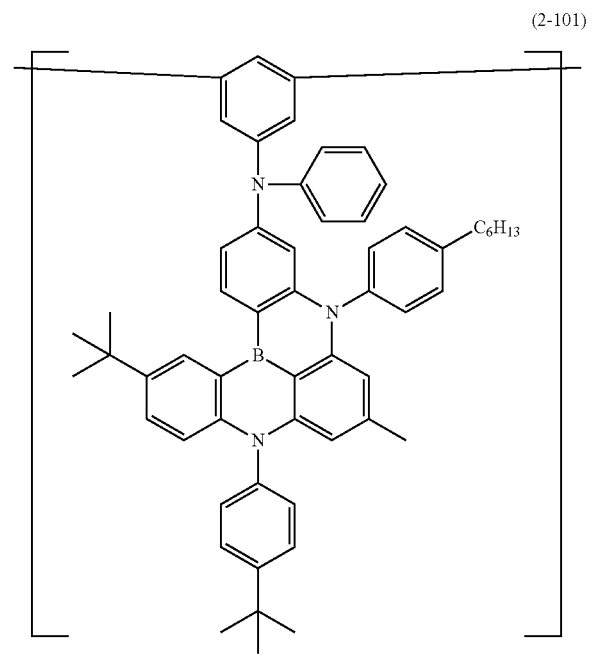

(2-101)

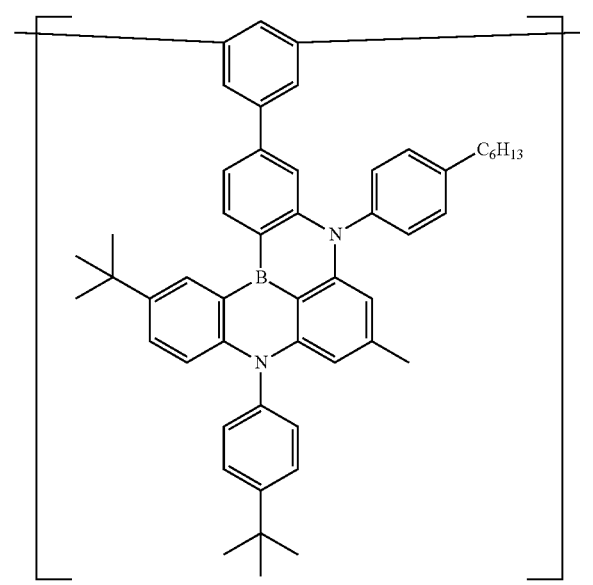

(2-102)

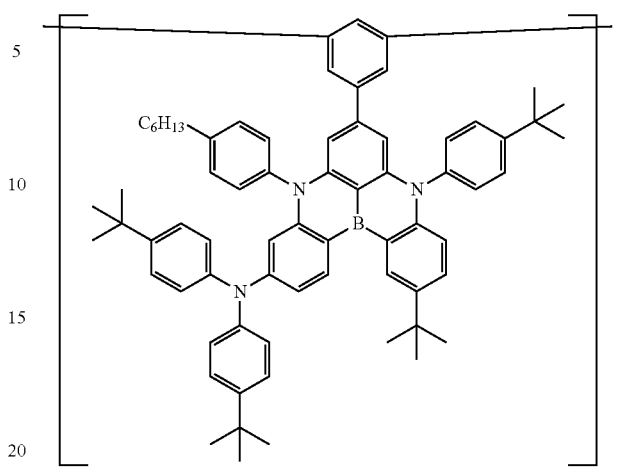

(2-103)

[Chemical Formula 61]

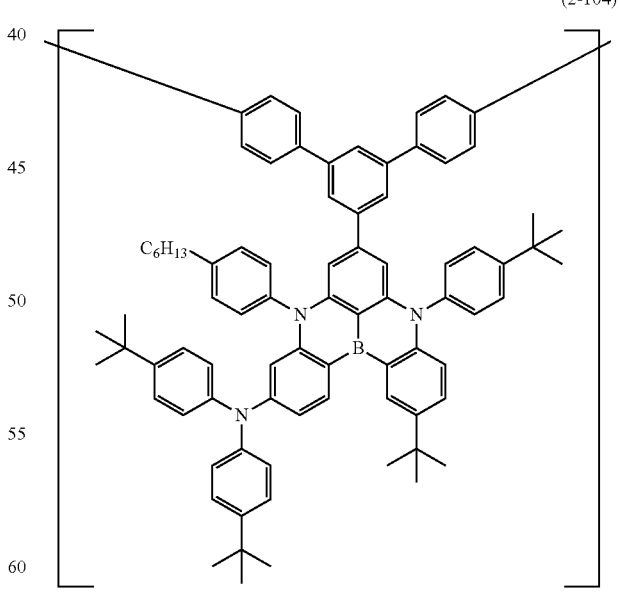

(2-104)

(2'-101)

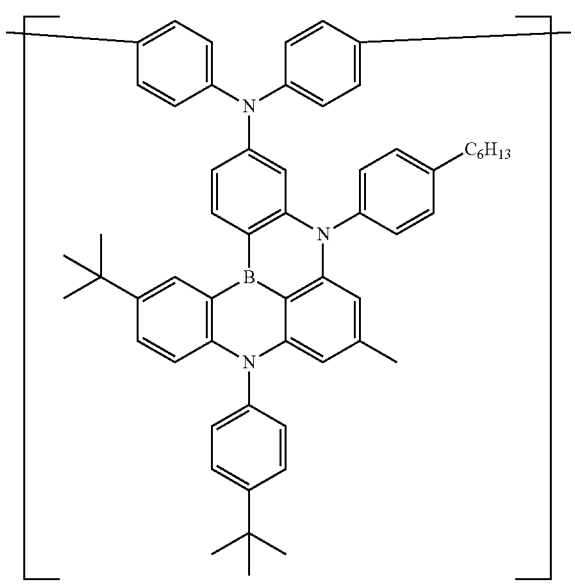

(2'-102)

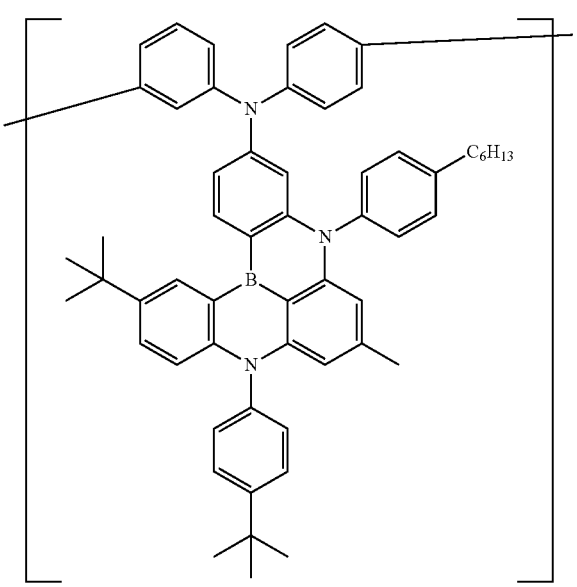

[Chemical Formula 62]

(2'-103)

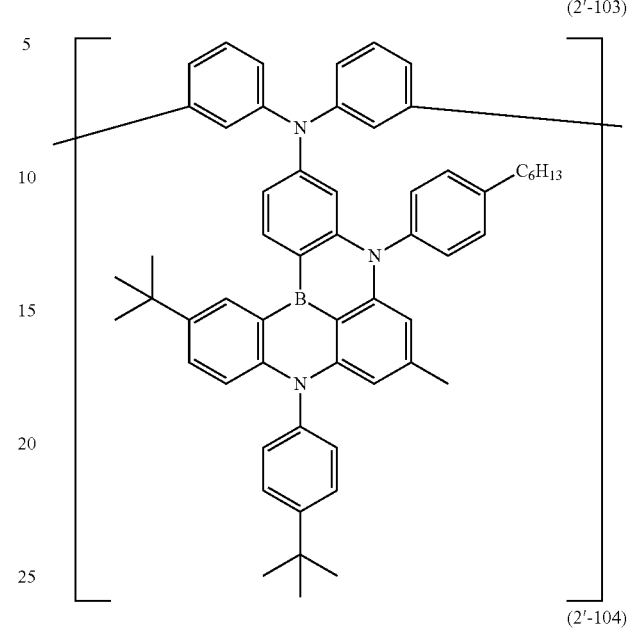

(2'-104)

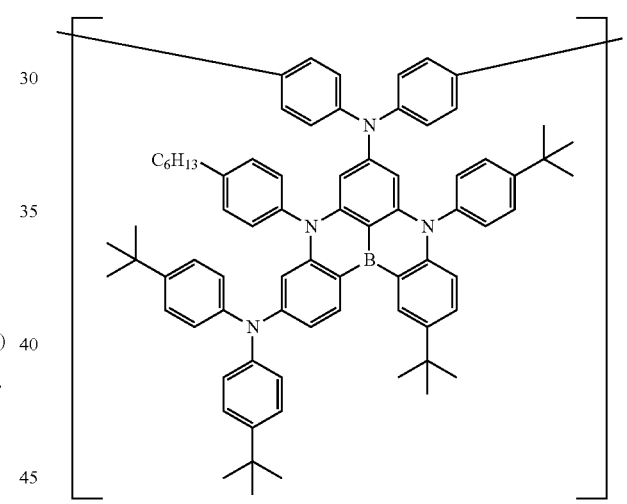

[Constitutional unit represented by the formula (3)]

d, e, f and g are each preferably 0 or 1, more preferably 0, since the light emitting device of the present invention is more excellent in luminance life.

pA is preferably 0 or 1, more preferably 0, since the light emitting device of the present invention is more excellent in luminance life.

The number of carbon atoms of the alkylene group represented by $J^4$ is, not including the number of carbon atoms of the substituent, usually 1 to 20, preferably 1 to 15, more preferably 1 to 10. The number of carbon atoms of the cycloalkylene group represented by $J^4$ is, not including the number of carbon atoms of the substituent, usually 3 to 20.

The alkylene group and the cycloalkylene group optionally have a substituent, and examples thereof include a methylene group, an ethylene group, a propylene group, a butylene group, a hexylene group, a cyclohexylene group and an octylene group. The substituent which the alkylene group and the cycloalkylene group optionally have includes, for example, an alkyl group, a cycloalkyl group, an alkoxy group, a cycloalkoxy group, a halogen atom and a cyano group.

The arylene group represented by $J^4$ optionally has a substituent. The arylene includes, for example, an o-phenylene group, a m-phenylene group and a p-phenylene group. The substituent which the arylene group optionally has includes, for example, an alkyl group, a cycloalkyl group, an alkoxy group, a cycloalkoxy group, an aryl group, an aryloxy group, a monovalent heterocyclic group, a halogen atom and a cyano group.

$Ar^7$, $Ar^8$ and $Ar^9$ are each preferably an arylene group optionally having a substituent, since the light emitting device of the present invention is more excellent in luminance life.

The number of carbon atoms of the arylene group represented by $Ar^7$, $Ar^8$ and $Ar^9$ is, not including the number of carbon atoms of the substituent, usually 6 to 60, preferably 6 to 30, more preferably 6 to 18.

The arylene group represented by $Ar^7$, $Ar^8$ and $Ar^9$ is preferably a group represented by the formula (A-1) to the formula (A-20), more preferably a group represented by the formula (A-1), the formula (A-2), the formula (A-6) to the formula (A-10), the formula (A-19) or the formula (A-20), further preferably a group represented by the formula (A-1), the formula (A-2), the formula (A-7), the formula (A-9) or the formula (A-19), and the foregoing groups optionally have a substituent.

The number of carbon atoms of the divalent heterocyclic group represented by $Ar^7$, $Ar^8$ and $Ar^9$ is, not including the number of carbon atoms of the substituent, usually 2 to 60, preferably 3 to 30, more preferably 4 to 18.

The divalent heterocyclic group represented by $Ar^7$, $Ar^8$ and $Ar^9$ is preferably a group represented by the formula (AA-1) to the formula (AA-34).

The arylene group and the divalent heterocyclic group represented by $Ar^7$, $Ar^8$ and $Ar^9$ optionally have a substituent, and the substituent includes an alkyl group, a cycloalkyl group, an alkoxy group, a cycloalkoxy group, an aryl group, an aryloxy group, a halogen atom, a monovalent heterocyclic group and a cyano group.

$R^{X4}$ is preferably an alkyl group, a cycloalkyl group, an aryl group or a monovalent heterocyclic group, more preferably an aryl group, and the foregoing groups optionally have a substituent.

The definition, preferable range and examples of the residue of a compound represented by the formula (1) represented by Q" are the same as the definition, preferable range and examples of the residue of a compound represented by the formula (1) described above.

[Preferable Embodiment of Constitutional Unit Represented by the Formula (3)]

The constitutional unit represented by the formula (3) includes, for example, constitutional units represented by the formula (3-1) to the formula (3-12). Of them, constitutional units represented by the formula (3-1) to the formula (3-6) are preferable, constitutional units represented by the formula (3-1) to the formula (3-3) are more preferable, a constitutional unit represented by the formula (3-1) is further preferable, since the light emitting device of the present invention is excellent in luminance life.

[Chemical Formula 63]

(3-1)

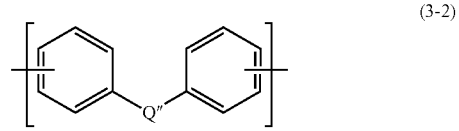
(3-2)

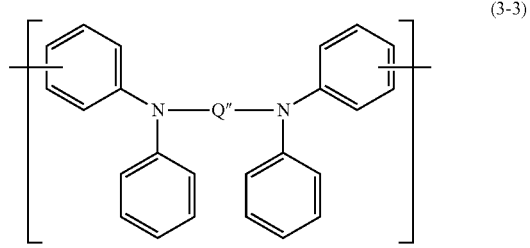
(3-3)

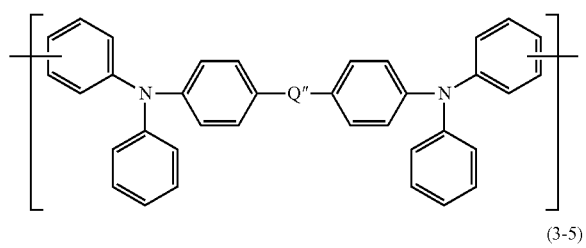
(3-4)

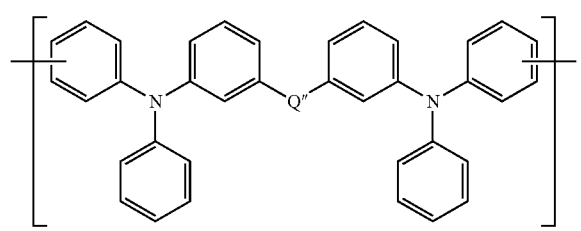
(3-5)

[Chemical Formula 64]

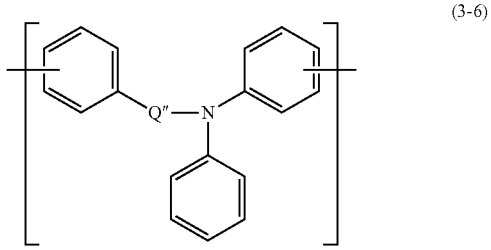
(3-6)

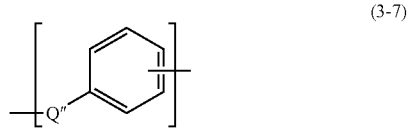
(3-7)

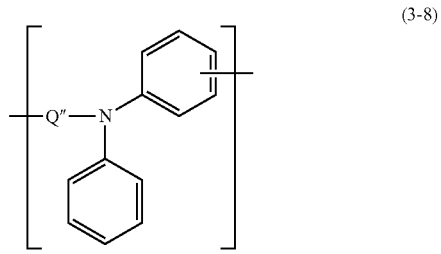
(3-8)

(3-9)

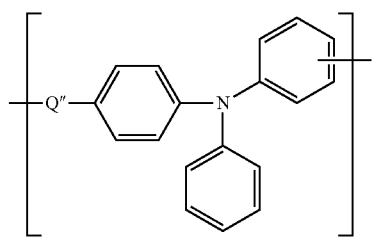

[Chemical Formula 65]

(3-10)

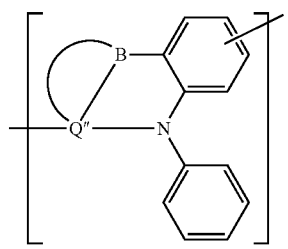

(3-11)

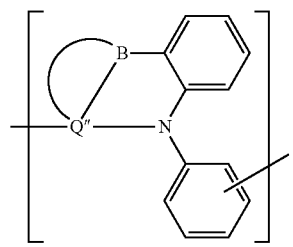

(3-12)

[wherein, Q" and arc represent the same meaning as described above.]

The constitutional unit represented by the formula (3) includes, for example, the above-described constitutional unit represented by the formula (51), and constitutional units represented by the formula (52) to the formula (55), and is preferably a constitutional unit represented by the formula (51) or the formula (53), more preferably a constitutional unit represented by the formula (51).

[Chemical Formula 66]

(52)

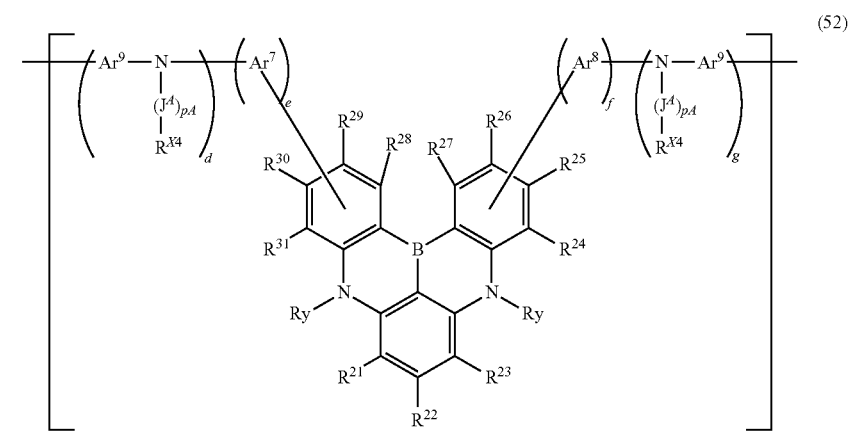

[Chemical Formula 67]

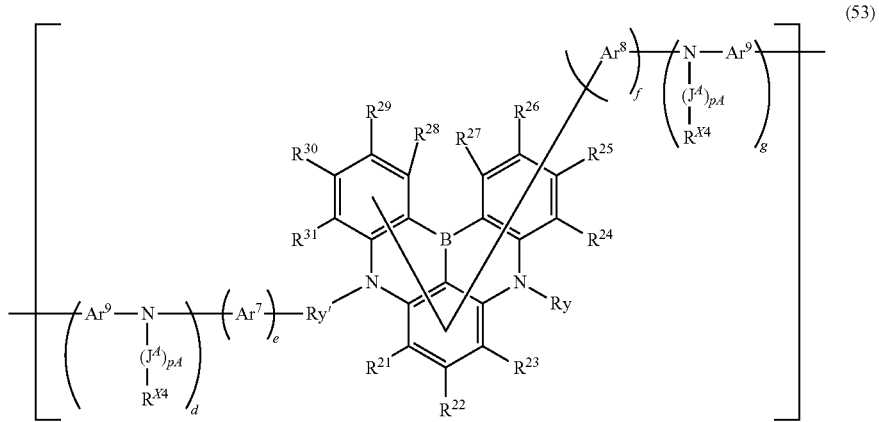

(53)

[Chemical Formula 68]

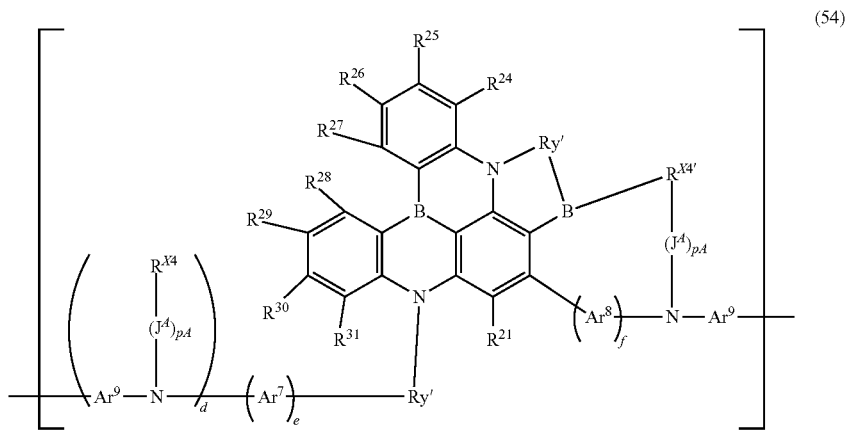

(54)

[Chemical Formula 69]

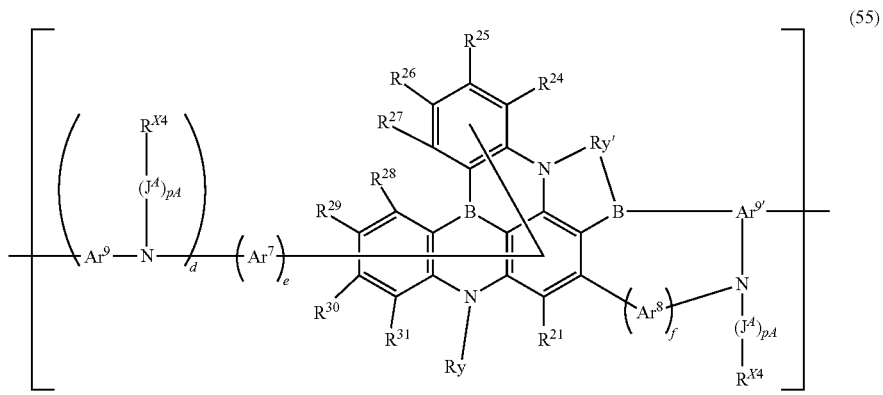

(55)

[wherein, $R^{21}$, $R^{22}$, $R^{23}$, $R^{24}$, $R^{25}$, $R^{26}$, $R^{27}$, $R^{28}$, $R^{29}$, $R^{30}$, $R^{31}$, Ry, Ry', $Ar^7$, $Ar^8$, $Ar^9$, $J^A$, $R^{X4}$, pA, d, e, f and g represent the same meaning as described above.

$R^{X4'}$ represents a direct bond, an alkylene group, a cycloalkylene group, an arylene group or a divalent heterocyclic group, and the foregoing groups optionally have a substituent.

$Ar^{9'}$ represents a trivalent aromatic hydrocarbon group or a trivalent heterocyclic group, and the foregoing groups optionally have a substituent.

In the formula (52), one of $R^{24}$, $R^{25}$, $R^{26}$ and $R^{27}$ is a connecting bond and one of $R^{28}$, $R^{29}$, $R^{30}$ and $R^{31}$ is a connecting bond, and in the formula (53), one of $R^{21}$, $R^{22}$, $R^{23}$, $R^{24}$, $R^{25}$, $R^{26}$, $R^{27}$, $R^{28}$, $R^{29}$, $R^{30}$ and $R^{31}$ is a connecting bond, and in the formula (55) one of $R^{21}$, $R^{24}$, $R^{25}$, $R^{26}$, $R^{27}$, $R^{28}$, $R^{29}$, $R^{30}$ and $R^{31}$ is a connecting bond.]

The constitutional unit represented by the formula (3) includes, for example, constitutional units represented by the formula (3-101) to the formula (3-129).

[Chemical Formula 70]
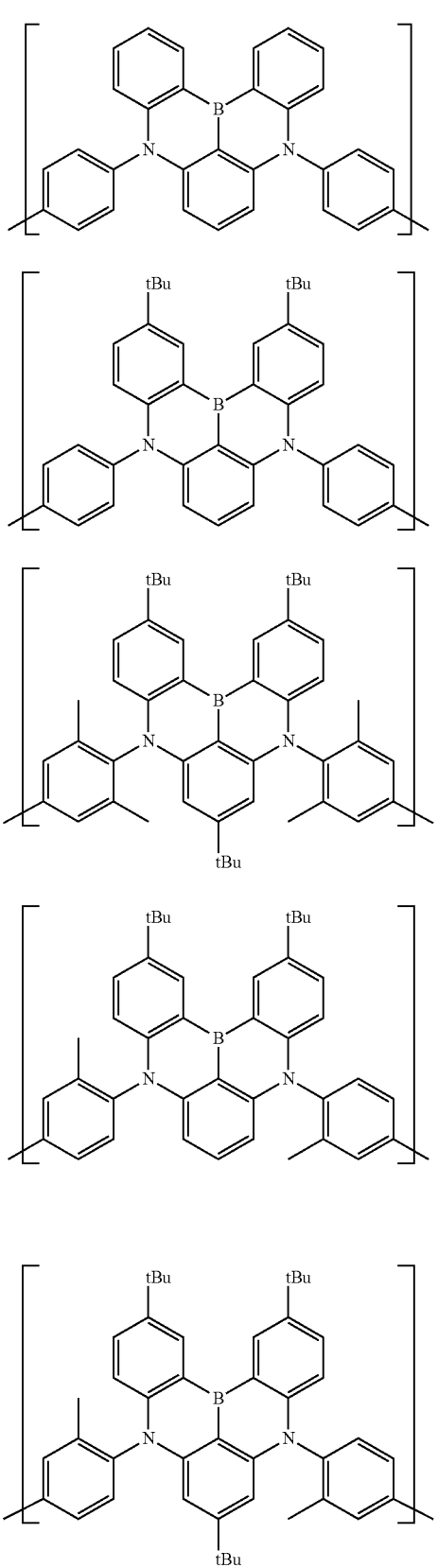
(3-101)
(3-102)
(3-103)
(3-104)
(3-105)
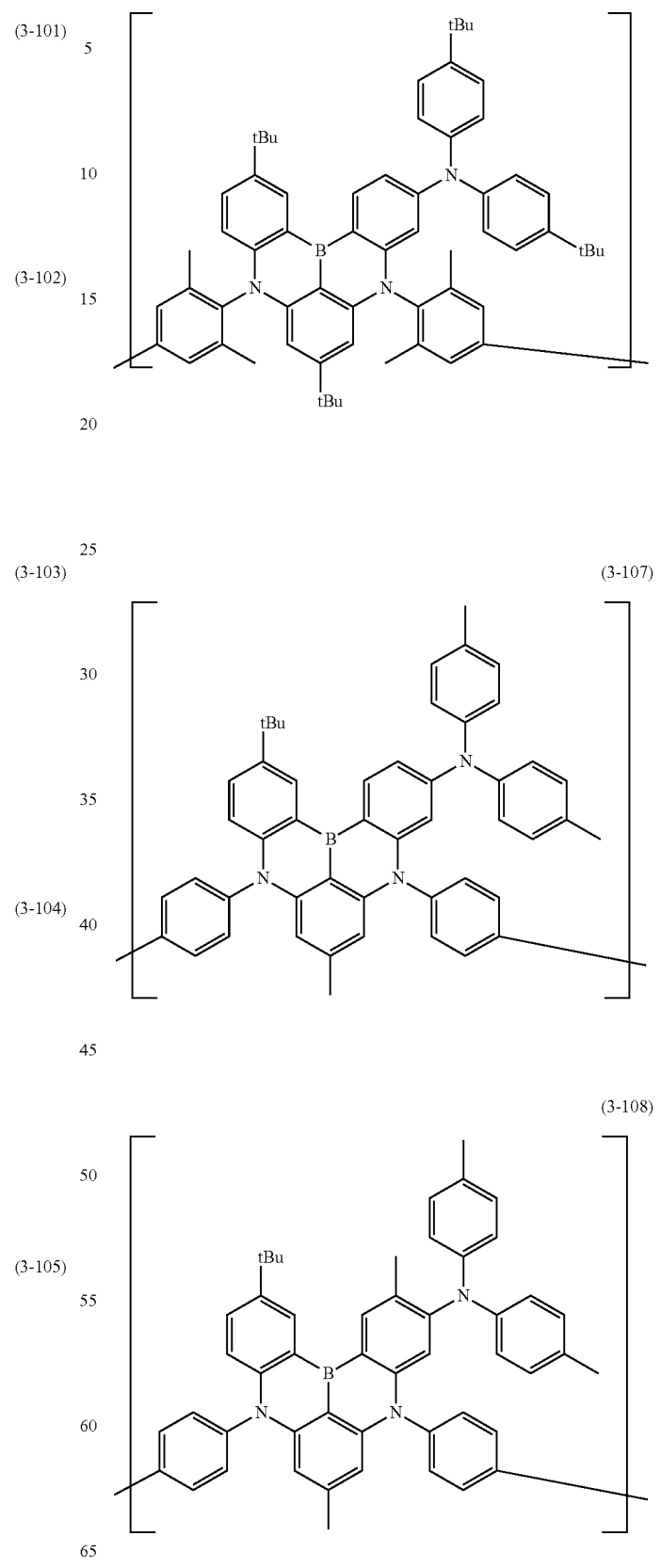
(3-106)
(3-107)
(3-108)
-continued

[Chemical Formula 71]
(3-109)
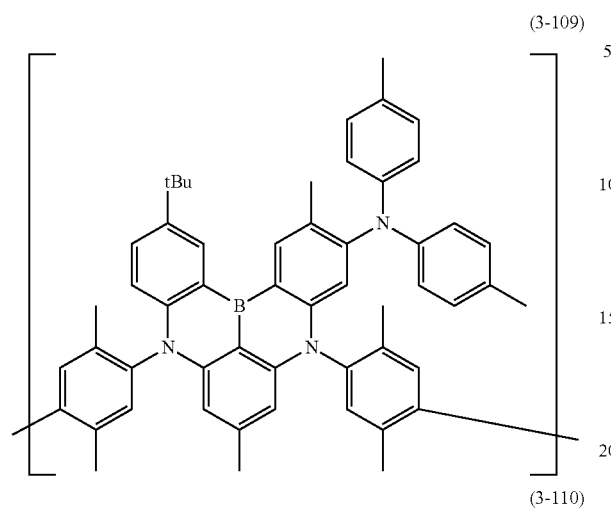
(3-110)
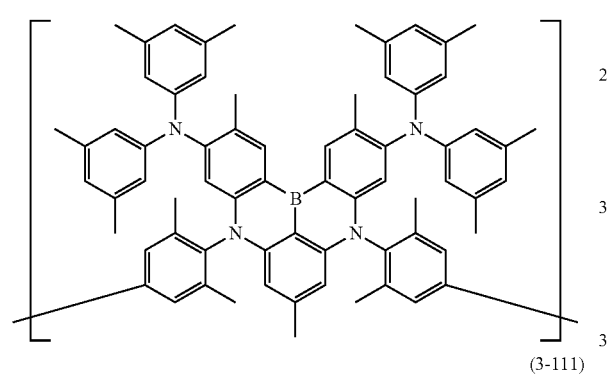
(3-111)
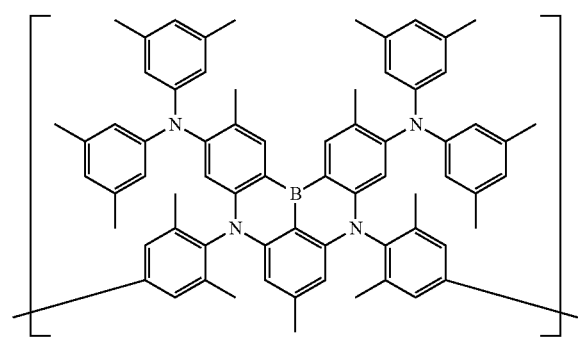
[Chemical Formula 72]
(3-112)
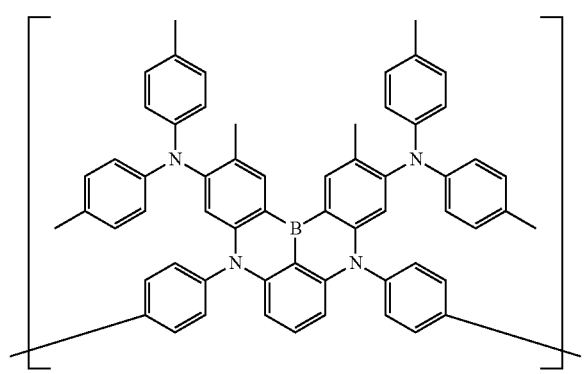
(3-113)
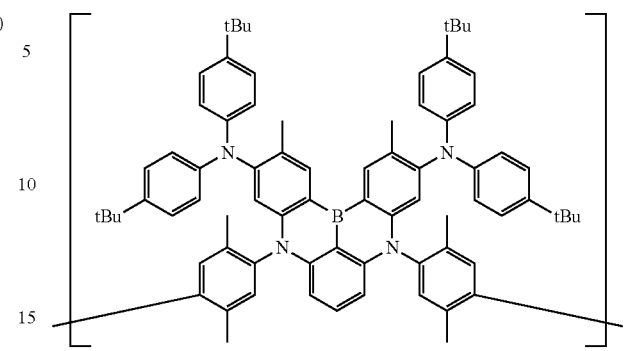
(1-114)
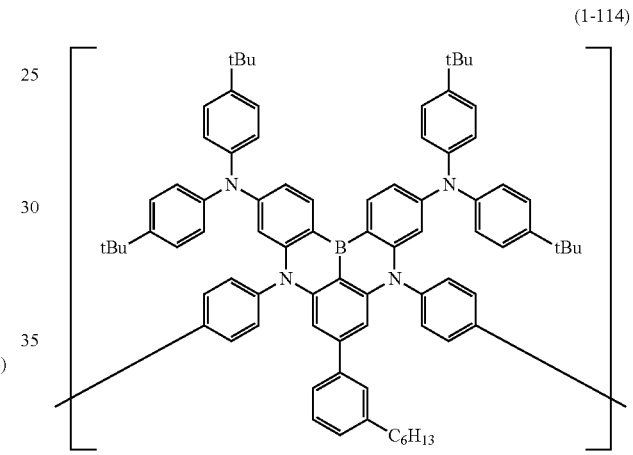
[Chemical Formula 73]
(3-115)
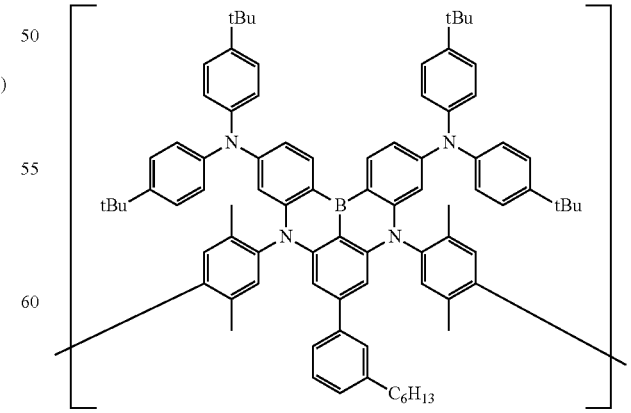

(3-116)
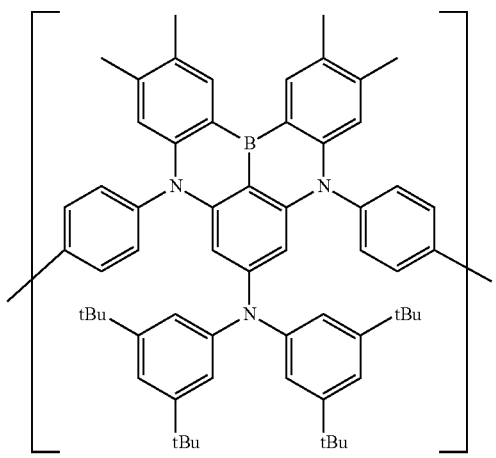
(3-117)
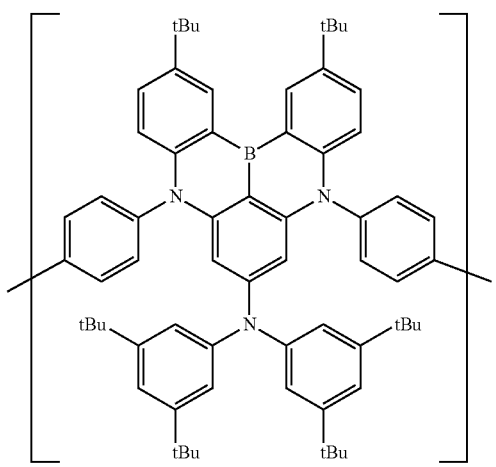
[Chemical Formula 74]
(3-118)
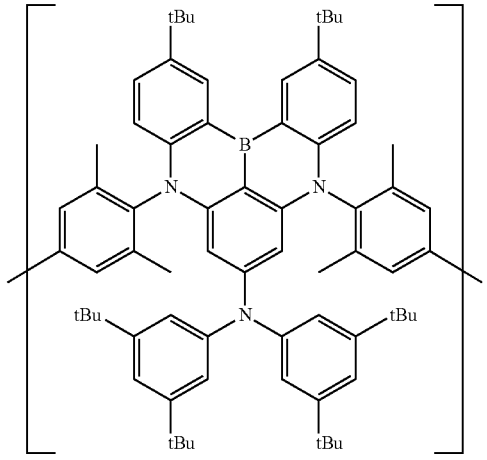
(3-119)
(3-120)
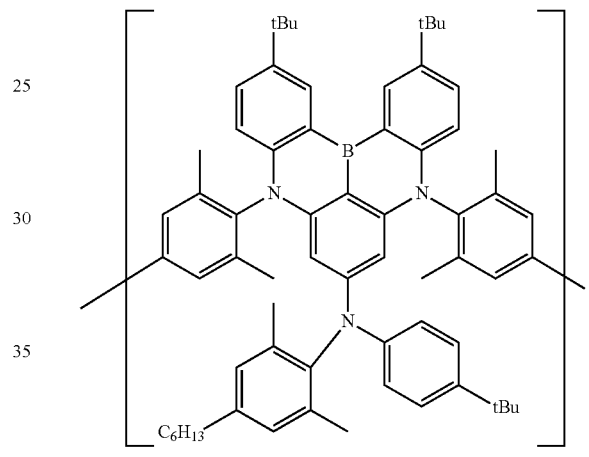
(3-121)
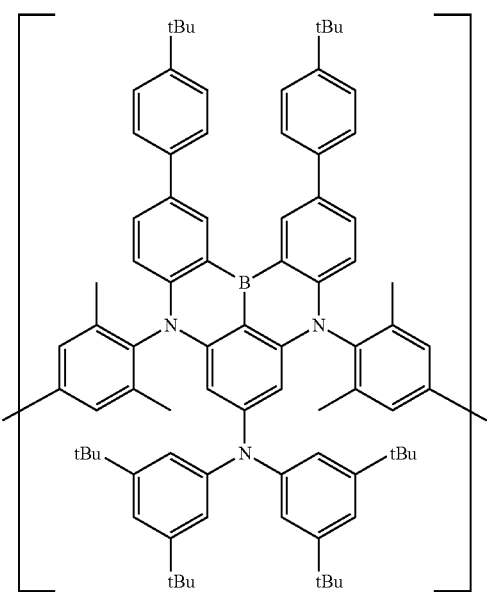

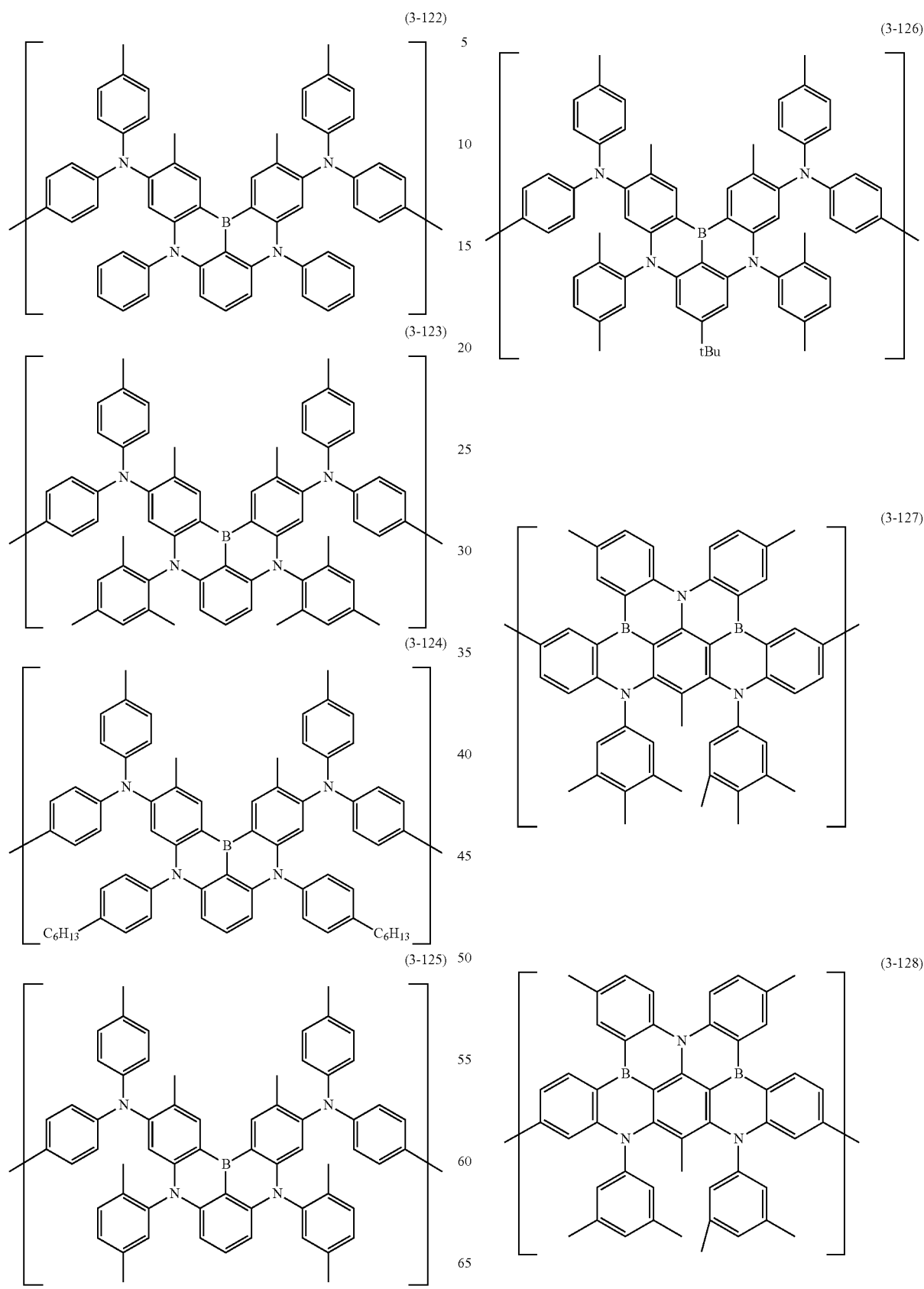

-continued (3-129)

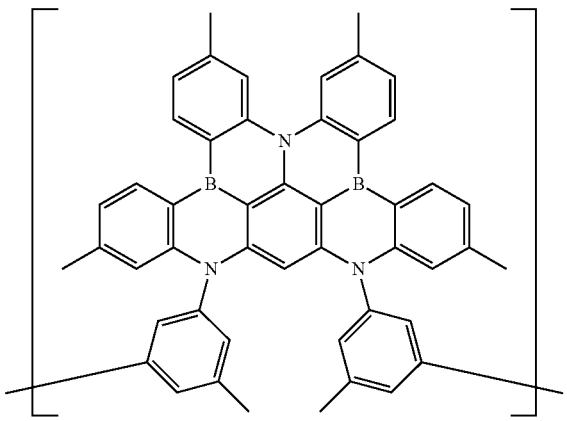

The total amount of the constitutional unit represented by the formula (3) is preferably 0.1 to 50% by mole, more preferably 0.1 to 30% by mole, further preferably 0.1 to 10% by mole, particularly preferably 0.5 to 5% by mole, with respect to the total amount of all constitutional units contained in the polymer compound, since the polymer compound of the present invention is excellent in stability.

[Constitutional Unit Having No Residue of Compound Represented by the Formula (1)]

The constitutional unit having no residue of a compound represented by the formula (1) includes, for example, a constitutional unit represented by the formula (X) and a constitutional unit represented by the formula (Y).

The constitutional units represented by the formula (X) and the constitutional units represented by the formula (Y) each may be contained only singly or in combination of two or more in a polymer compound.

[Constitutional Unit Represented by the Formula (X)]

$a^1$ is preferably 1, since the light emitting device of the present invention is more excellent in luminance life.

$a^2$ is preferably 0, since the light emitting device of the present invention is more excellent in luminance life.

$R^{X1}$, $R^{X2}$ and $R^{X3}$ are each preferably an alkyl group, a cycloalkyl group, an aryl group or a monovalent heterocyclic group, more preferably an aryl group, and the foregoing groups optionally have a substituent.

The arylene group represented by $Ar^{X1}$ and $Ar^{X3}$ is more preferably a group represented by the formula (A-1) or the formula (A-9), further preferably a group represented by the formula (A-1), and the foregoing groups optionally have a substituent.

The divalent heterocyclic group represented by $Ar^{X1}$ and $Ar^{X3}$ is more preferably a group represented by the formula (AA-1), the formula (AA-2) or the formula (AA-7) to the formula (AA-26), and the foregoing groups optionally have a substituent.

$Ar^{X1}$ and $Ar^{X3}$ are each preferably an arylene group optionally having a substituent.

The arylene group represented by $Ar^{X2}$ and $Ar^{X4}$ is more preferably a group represented by the formula (A-1), the formula (A-6), the formula (A-7), the formula (A-9) to the formula (A-11) or the formula (A-19), and the foregoing groups optionally have a substituent.

The more preferable range of the divalent heterocyclic group represented by $Ar^{X2}$ and $Ar^{X4}$ is the same as the more preferable range of the divalent heterocyclic group represented by $Ar^{X1}$ and $Ar^{X3}$.

The more preferable range and further preferable range of the arylene group and the divalent heterocyclic group in the divalent group in which at least one arylene group and at least one divalent heterocyclic group are directly bonded represented by $Ar^{X2}$ and $Ar^{X4}$ are the same as the more preferable range and further preferable range of the arylene group and the divalent heterocyclic group represented by $Ar^{X1}$ and $Ar^{X3}$, respectively.

The divalent group in which at least one arylene group and at least one divalent heterocyclic group are directly bonded represented by $Ar^{X2}$ and $Ar^{X4}$ includes, for example, groups represented by the following formulae, and these groups optionally have a substituent.

[Chemical Formula 77]

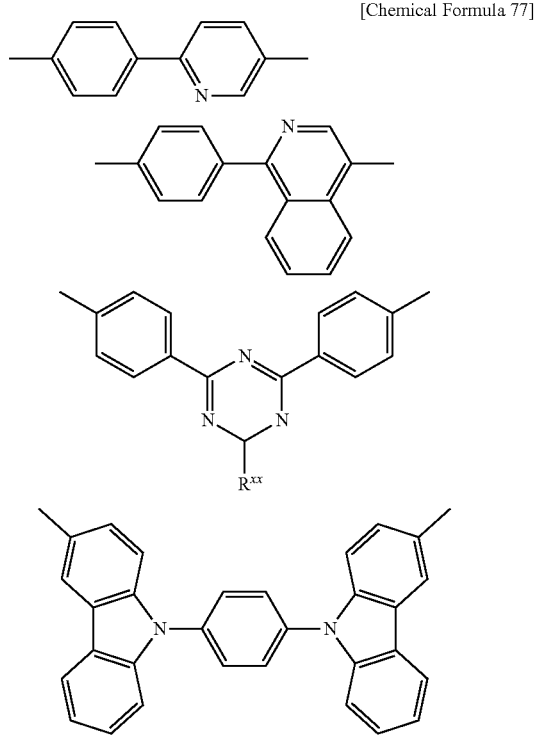

[wherein, $R^{XX}$ represents a hydrogen atom, an alkyl group, a cycloalkyl group, an aryl group or a monovalent heterocyclic group, and the foregoing groups optionally have a substituent.]

$R^{XX}$ is preferably an alkyl group, a cycloalkyl group or an aryl group, and the foregoing groups optionally have a substituent.

$Ar^{X2}$ and $Ar^{X4}$ are each preferably an arylene group optionally having a substituent.

The substituent which the group represented by $Ar^{X4}$ to $Ar^{X4}$ and $R^{X4}$ to $R^{X3}$ optionally has is preferably an alkyl group, a cycloalkyl group or an aryl group, and these groups optionally further have a substituent.

The constitutional unit represented by the formula (X) is preferably a constitutional unit represented by the formula (X-1) to the formula (X-7), more preferably a constitutional unit represented by the formula (X-3) to the formula (X-7), further preferably a constitutional unit represented by the formula (X-3) to the formula (X-6).

[Chemical Formula 78]

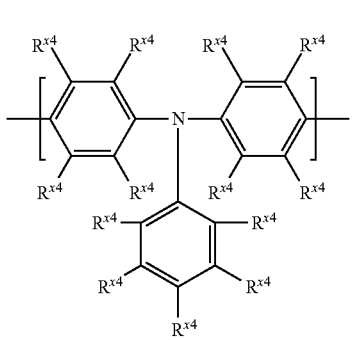

(X-1)

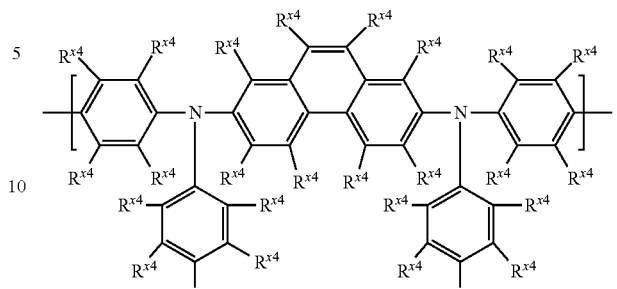

(X-5)

[Chemical Formula 81]

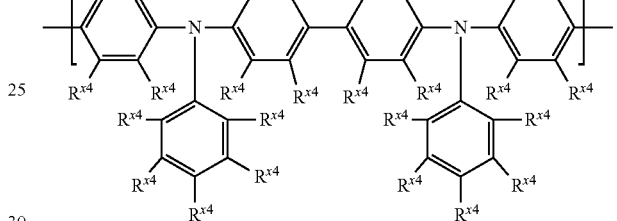

(X-6)

[Chemical Formula 79]

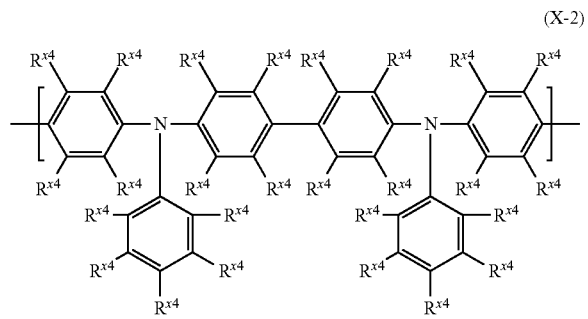

(X-2)

(X-3)

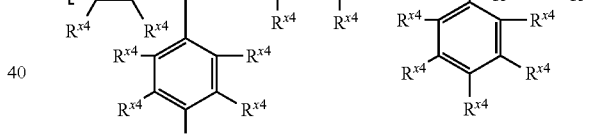

(X-7)

[Chemical Formula 80]

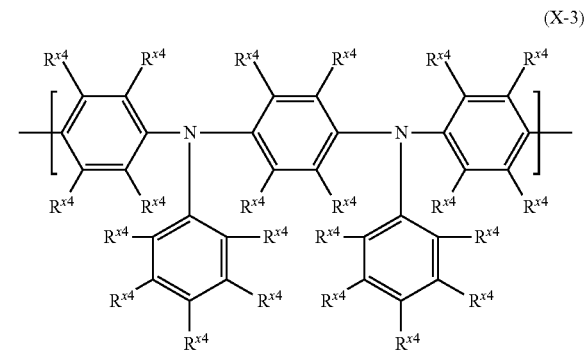

(X-4)

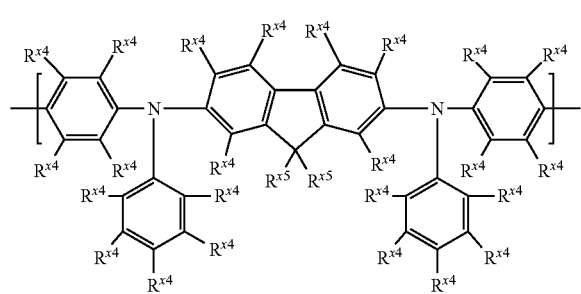

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group or a cyano group, and the foregoing groups optionally have a substituent. A plurality of $R^{X4}$ may be the same or different. A plurality of $R^{X5}$ may be the same or different, and adjacent $R^{X5}$ may be combined together to form a ring together with carbon atoms to which they are attached.]

The amount of the constitutional unit represented by the formula (X) is preferably 0.1 to 50% by mole, more preferably 0.5 to 30% by mole, further preferably 1 to 8% by mole, particularly preferably 1 to 5% by mole, with respect to the total amount of all constitutional units contained in the polymer compound, since hole transportability is excellent.

The constitutional unit represented by the formula (X) includes, for example, constitutional units represented by the formula (X1-1) to the formula (X1-7), and is preferably a constitutional unit represented by the formula (X1-1) and the formula (X1-5) to the formula (X1-7).

[Chemical Formula 82]

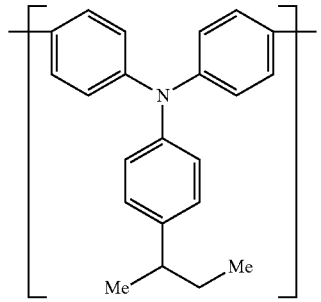
(X1-1)

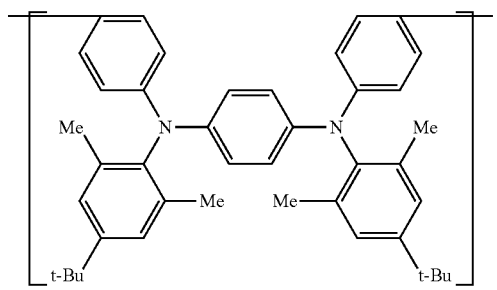
(X1-2)

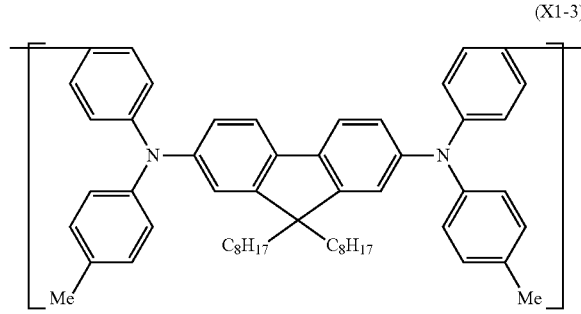
(X1-3)

[Chemical Formula 83]

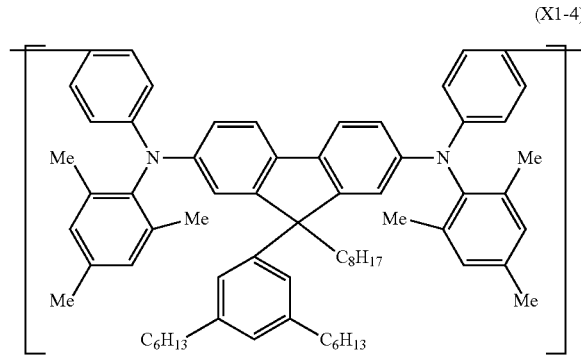
(X1-4)

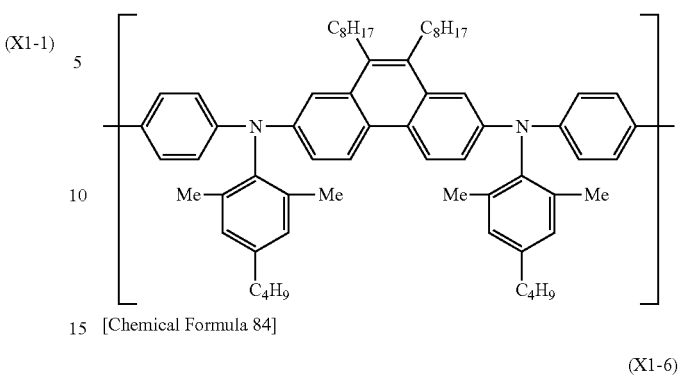
(X1-5)

[Chemical Formula 84]

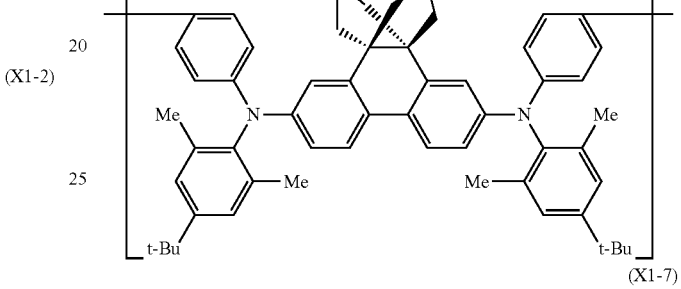
(X1-6)

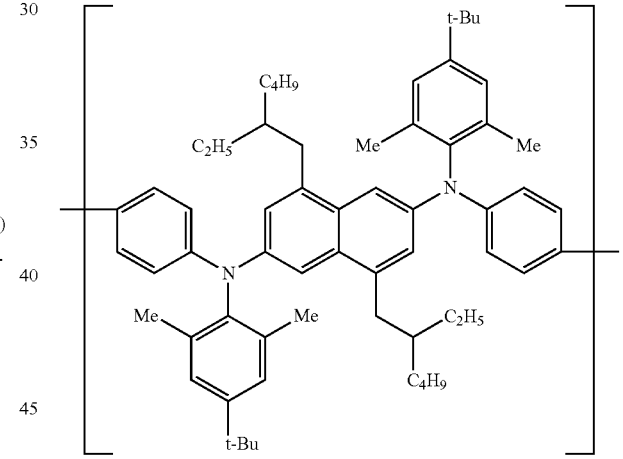
(X1-7)

[Constitutional Unit Represented by the Formula (Y)]

The arylene group represented by $Ar^{Y1}$ is more preferably a constitutional unit represented by the formula (A-1), the formula (A-6), the formula (A-7), the formula (A-9) to the formula (A-11), the formula (A-13) or the formula (A-19), further preferably a constitutional unit represented by the formula (A-1), the formula (A-7), the formula (A-9) or the formula (A-19), particularly preferably a constitutional unit represented by the formula (A-1) or the formula (A-9), and the foregoing groups optionally have a substituent.

The divalent heterocyclic group represented by $Ar^{Y1}$ is more preferably a constitutional unit represented by the formula (AA-4), the formula (AA-10), the formula (AA-13), the formula (AA-15), the formula (AA-18) or the formula (AA-20), further preferably a constitutional unit represented by the formula (AA-4), the formula (AA-10), the formula (AA-18) or the formula (AA-20), and the foregoing groups optionally have a substituent.

The more preferable range and further preferable range of the arylene group and the divalent heterocyclic group in the divalent group in which at least one arylene group and at least one divalent heterocyclic group are directly bonded represented by $Ar^{Y1}$ are the same as the more preferable range and further preferable range of the arylene group and the divalent heterocyclic group represented by $Ar^{Y1}$ described above, respectively.

The divalent group in which at least one arylene group and at least one divalent heterocyclic group are directly bonded represented by $Ar^{Y1}$ includes the same groups as the divalent group in which at least one arylene group and at least one divalent heterocyclic group are directly bonded represented by $Ar^{X2}$ and $Ar^{X4}$ in the formula (X).

The substituent which the group represented by $Ar^{Y1}$ optionally has is preferably an alkyl group, a cycloalkyl group or an aryl group, more preferably an alkyl group or aryl group, and the foregoing groups optionally further have a substituent.

The constitutional unit represented by the formula (Y) includes, for example, constitutional units represented by the formula (Y-1) to the formula (Y-7), and is preferably a constitutional unit represented by the formula (Y-1) or the formula (Y-2) from the standpoint of luminance life of the light emitting device of the present invention, preferably a constitutional unit represented by the formula (Y-3) or the formula (Y-4) from the standpoint of electron transportability, and is preferably a constitutional unit represented by the formula (Y-5) to the formula (Y-7) from the standpoint of hole transportability.

In the formula (Y-1), $R^{Y1}$ is preferably a hydrogen atom, an alkyl group, a cycloalkyl group or an aryl group, and the foregoing groups optionally have a substituent.

The constitutional unit represented by the formula (Y-1) is preferably a constitutional unit represented by the formula (Y-1').

[Chemical Formula 85]

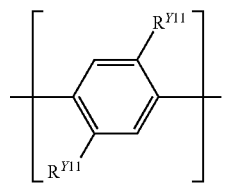

(Y-1')

[wherein, $R^{Y11}$ represents an alkyl group, a cycloalkyl group, an alkoxy group, a cycloalkoxy group, an aryl group or a monovalent heterocyclic group, and the foregoing groups optionally have a substituent. A plurality of $R^{Y11}$ may be the same or different.]

$R^{Y11}$ is preferably an alkyl group, a cycloalkyl group or an aryl group, more preferably an alkyl group or a cycloalkyl group, and the foregoing groups optionally have a substituent.

In the formula (Y-2), $R^{Y2}$ is preferably an alkyl group, a cycloalkyl group, an aryl group or a monovalent heterocyclic group, more preferably an alkyl group, a cycloalkyl group or an aryl group, further preferably an alkyl group or an aryl group, and the foregoing groups optionally have a substituent.

The combination of two $R^{Y2}$ in a group represented by —C($R^{Y2}$)$_2$— in $X^{Y1}$ is preferably a combination in which both are alkyl groups or cycloalkyl groups, a combination in which both are aryl groups, a combination in which both are monovalent heterocyclic groups, or a combination in which one is an alkyl group or a cycloalkyl group and the other is an aryl group or a monovalent heterocyclic group, more preferably a combination in which one is an alkyl group or a cycloalkyl group and the other is an aryl group, and the foregoing groups optionally have a substituent. Two $R^{Y2}$ may be combined together to form a ring together with atoms to which they are attached, and when two $R^{Y2}$ form a ring, the group represented by —C($R^{Y2}$)$_2$— is preferably a group represented by the formula (Y-A1) to the formula (Y-A5), more preferably a group represented by the formula (Y-A4), and the foregoing groups optionally have a substituent.

[Chemical Formula 86]

(Y-A1)

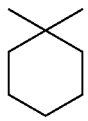

(Y-A2)

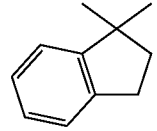

(Y-A3)

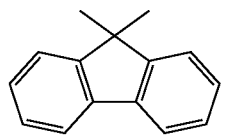

(Y-A4)

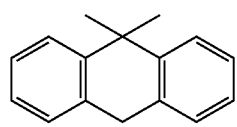

(Y-A5)

The combination of two $R^{Y2}$ in a group represented by —C($R^{Y2}$)=C($R^{Y2}$)— in $X^{Y1}$ is preferably a combination in which both are alkyl groups or cycloalkyl groups, or a combination in which one is an alkyl group or a cycloalkyl group and the other is an aryl group, and the foregoing groups optionally have a substituent.

Four $R^{Y2}$ in a group represented by —C($R^{Y2}$)$_2$—C($R^{Y2}$)$_2$— in $X^{Y1}$ are each preferably an alkyl group optionally having a substituent or a cycloalkyl group. A plurality of $R^{Y2}$ may be combined together to form a ring together with atoms to which they are attached, and when the plurality of $R^{Y2}$ form a ring, the group represented by —C($R^{Y2}$)$_2$—C($R^{Y2}$)$_2$— is preferably a group represented by the formulae (Y-B1) to (Y-B5), more preferably a group represented by the formula (Y-B3), and the foregoing groups optionally have a substituent.

[Chemical Formula 87]

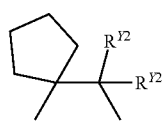 (Y-B1)

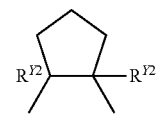 (Y-B2)

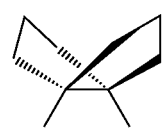 (Y-B3)

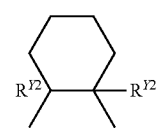 (Y-B4)

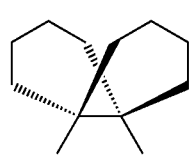 (Y-B5)

[wherein, $R^{Y2}$ represent the same meaning as described above.]

The constitutional unit represented by the formula (Y-2) is preferably a constitutional unit represented by the formula (Y-2′).

[Chemical Formula 88]

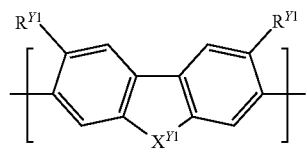 (Y-2′)

[wherein, $R^{Y1}$ and $X^{Y1}$ represent the same meaning as described above.]

[Chemical Formula 89]

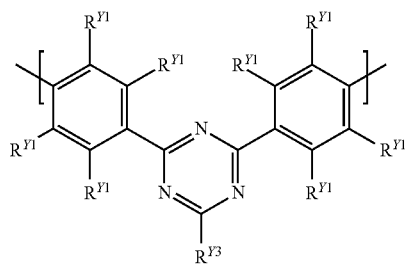 (Y-3)

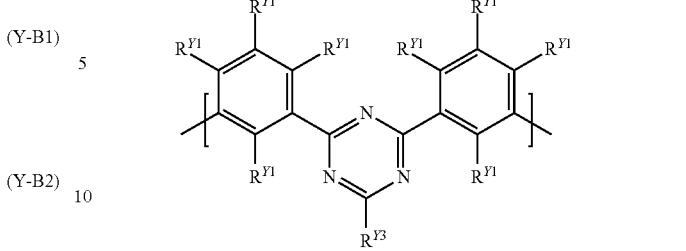 (Y-4)

[wherein,
$R^{Y1}$ represent the same meaning as described above.
$R^{Y3}$ represents a hydrogen atom, an alkyl group, a cycloalkyl group, an alkoxy group, a cycloalkoxy group, an aryl group or a monovalent heterocyclic group, and the foregoing groups optionally have a substituent.]
$R^{Y3}$ is preferably an alkyl group, a cycloalkyl group, an alkoxy group, a cycloalkoxy group, an aryl group or a monovalent heterocyclic group, more preferably an aryl group, and the foregoing groups optionally have a substituent.

[Chemical Formula 90]

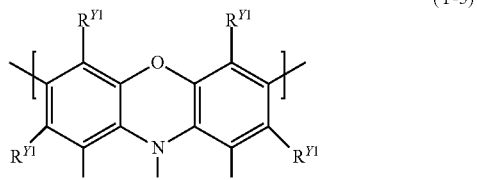 (Y-5)

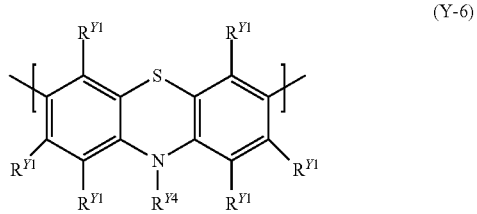 (Y-6)

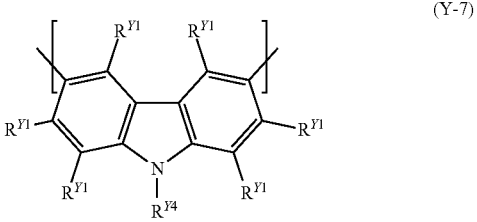 (Y-7)

[wherein,
$R^{Y1}$ represents the same meaning as described above.
$R^{Y4}$ represents a hydrogen atom, an alkyl group, a cycloalkyl group, an alkoxy group, a cycloalkoxy group, an aryl group or a monovalent heterocyclic group, and the foregoing groups optionally have a substituent.]
$R^{Y4}$ is preferably an alkyl group, a cycloalkyl group, an alkoxy group, a cycloalkoxy group, an aryl group or a monovalent heterocyclic group, more preferably an aryl group, and the foregoing groups optionally have a substituent.

The constitutional unit represented by the formula (Y) includes, for example, constitutional units represented by the formula (Y-11) to the formula (Y-30).

[Chemical Formula 91]
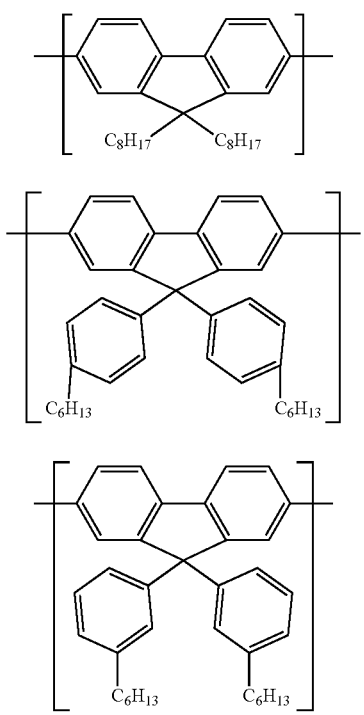
(Y-11)
(Y-12)
(Y-13)
[Chemical Formula 92]
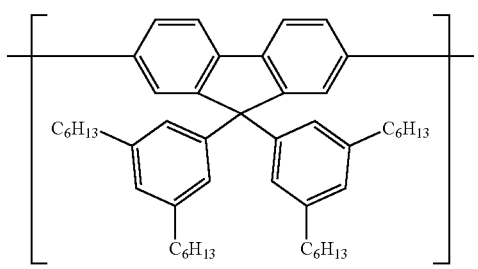
(Y-14)
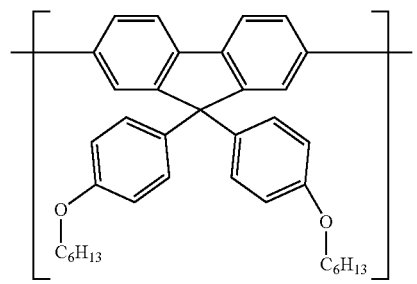
(Y-15)
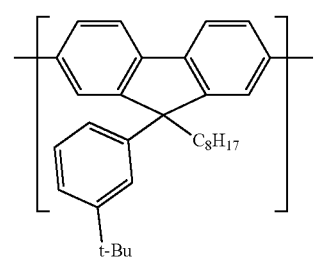
(Y-16)
[Chemical Formula 93]
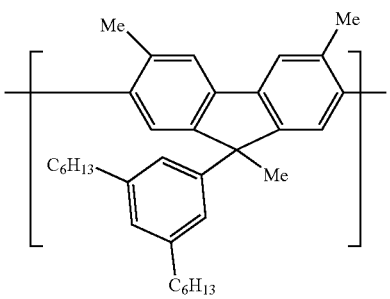
(Y-17)
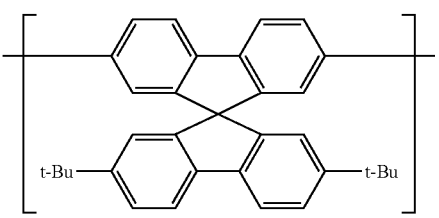
(Y-18)
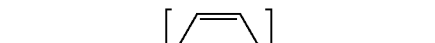
(Y-19)
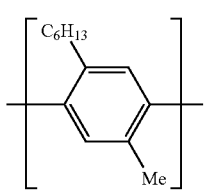
(Y-20)
[Chemical Formula 94]
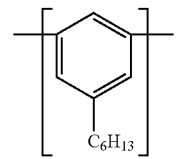
(Y-21)
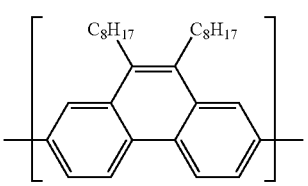
(Y-22)
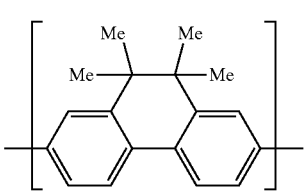
(Y-23)
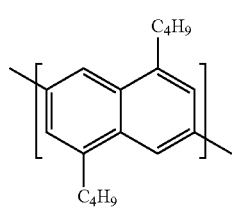
(Y-24)

-continued

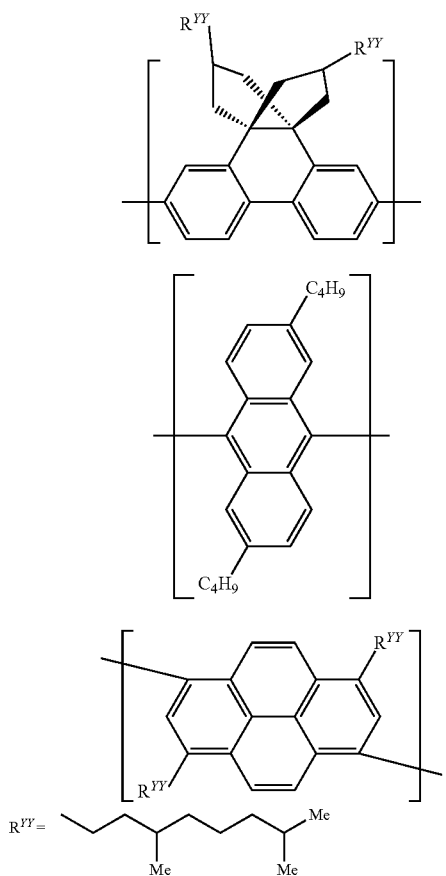

(Y-25)

(Y-26)

(Y-27)

[Chemical Formula 96]

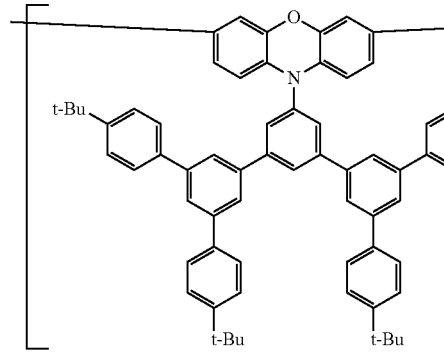

(Y-28)

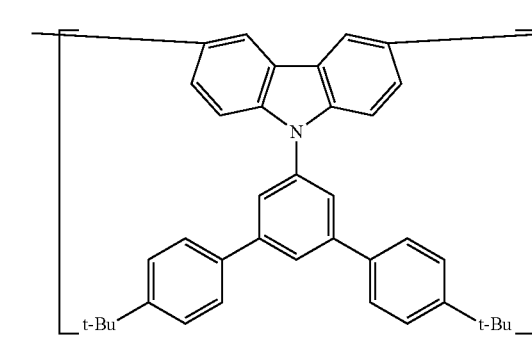

(Y-29)

-continued

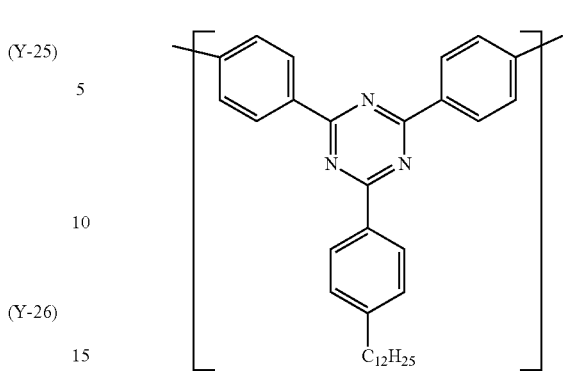

(Y-30)

The amount of the constitutional unit represented by the formula (Y) in which $Ar^{Y1}$ is an arylene group is preferably 50 to 99.5% by mole, more preferably 70 to 99.5% by mole, with respect to the total amount of all constitutional units contained in the polymer compound, since the light emitting device of the present invention is more excellent in luminance life.

The constitutional unit represented by the formula (Y) in which $Ar^{Y1}$ is a divalent heterocyclic group, or a divalent group in which at least one arylene group and at least one divalent heterocyclic group are directly bonded is preferably 1 to 30% by mole, more preferably 1 to 10% by mole, with respect to the total amount of all constitutional units contained in the polymer compound, since the light emitting device of the present invention is excellent in charge transportability.

The polymer compound of the present invention includes, for example, polymer compounds P-1 to P-16. "Other constitutional units" denote constitutional units other than constitutional units represented by the formula (2), the formula (2'), the formula (3), the formula (X) and the formula (Y), not including a residue of a compound represented by the formula (1).

| | constitutional unit and molar fraction thereof | | | | |
|---|---|---|---|---|---|
| polymer compound | formula (2) q | formula (2') r | formula (X) s | formula (Y) t | other u' |
| P-1 | 0.1 to 99.9 | 0 | 0 | 0 | 0.1 to 99.9 |
| P-2 | 0.1 to 99.9 | 0 | 0.1 to 99.9 | 0 | 0 to 30 |
| P-3 | 0.1 to 99.9 | 0 | 0 | 0.1 to 99.9 | 0 to 30 |
| P-4 | 0.1 to 99.8 | 0 | 0.1 to 99.8 | 0.1 to 99.8 | 0 to 30 |
| P-5 | 0 | 0.1 to 99.9 | 0 | 0 | 0.1 to 99.9 |
| P-6 | 0 | 0.1 to 99.9 | 0.1 to 99.9 | 0 | 0 to 30 |
| P-7 | 0 | 0.1 to 99.9 | 0 | 0.1 to 99.9 | 0 to 30 |
| P-8 | 0 | 0.1 to 99.8 | 0.1 to 99.8 | 0.1 to 99.8 | 0 to 30 |
| P-9 | 0.1 to 99.9 | 0.1 to 99.9 | 0 | 0 | 0.1 to 99.8 |
| P-10 | 0.1 to 99.8 | 0.1 to 99.8 | 0.1 to 99.8 | 0 | 0 to 30 |

-continued

| polymer compound | constitutional unit and molar fraction thereof | | | | |
|---|---|---|---|---|---|
| | formula (2) q | formula (2') r | formula (X) s | formula (Y) t | other u' |
| P-11 | 0.1 to 99.8 | 0.1 to 99.8 | 0 | 0.1 to 99.8 | 0 to 30 |
| P-12 | 0.1 to 99.7 | 0.1 to 99.7 | 0.1 to 99.7 | 0.1 to 99.7 | 0 to 30 |

[in the table, q, r, s, t and u represent the molar fraction of each constitutional unit. q+r+s+t+u=100 and 70≤q+r+s+t≤100.]

| polymer compound | constitutional unit and molar fraction thereof | | | |
|---|---|---|---|---|
| | formula (3) q' | formula (X) s' | formula (Y) t' | other u' |
| P-13 | 0.1 to 99.9 | 0 | 0 | 0.1 to 99.9 |
| P-14 | 0.1 to 99.9 | 0.1 to 99.9 | 0 | 0 to 30 |
| P-15 | 0.1 to 99.9 | 0 | 0.1 to 99.9 | 0 to 30 |
| P-16 | 0.1 to 99.8 | 0.1 to 99.8 | 0.1 to 99.8 | 0 to 30 |

[in the table, q', s', t' and u' represent the molar fraction of each constitutional unit. q'+s'+t'+u'=100 and 70≤q'+s'+t'≤100.]

The end group of the polymer compound of the present invention is preferably a stable group, because, if a polymerization active group remains as it is, there is a possibility of lowering of a light emitting property and luminance life in the case of use of the polymer compound in fabrication of a light emitting device. This end group is preferably a group conjugated to the main chain, and includes groups bonded to an aryl group or a monovalent heterocyclic group via a carbon-carbon bond.

The polymer compound of the present invention may be any of a block copolymer, a random copolymer, an alternative copolymer and a graft copolymer, and may also be a compound in another form, and copolymers obtained by copolymerizing several kinds of raw material monomers are preferable.

<Production Method of a Polymer Compound>

The production method of the polymer compound of the present invention will be described. A raw material monomer used for condensation polymerization is obtained by reacting a group selected from the group consisting of the substituent group A and the substituent group B described later with the compound represented by the formula (1) (see, following formula). A constitutional unit having the residue of the compound represented by the formula (1) is induced by subjecting this raw material monomer to condensation polymerization. In the present specification, compounds used for production of the polymer compound of the present invention are collectively called "raw material monomer" in some cases.

[Chemical Formula 97]

(M-0)

[wherein,

Q represent the same meaning as described above.

d represents an integer of 1 to 4.

$Z^{C0}$ represents a group selected from the group consisting of Group A of substituent and Group B of substituent described later. When a plurality of $Z^{C0}$ are present, they may be the same or different.]

Further, a compound represented by the formula (M-2) or the formula (M-3) is likewise obtained as the raw material monomer used for condensation polymerization also by reacting a compound represented by the formula (1) and a compound having a group selected from the group consisting of Group A of substituent and Group B of substituent. This raw material monomer is used as a constitutional unit having a residue of a compound represented by the formula (1).

These reactions are usually conducted in the presence of a catalyst, a base and a solvent, and if necessary, a phase transfer catalyst may co-exist. As the catalyst used in the reaction, the same one as the catalyst used in condensation polymerization described later can be utilized.

By the same reaction, for example, a compound represented by the formula (M-1), the formula (M-4) or the formula (M-5) is obtained as the raw material monomer used for condensation polymerization. This raw material monomer is used as a constitutional unit having no residue of a compound represented by the formula (1).

The polymer compound of the present invention can be produced, for example, by condensation-polymerizing a compound represented by the formula (M-1), a compound represented by the formula (M-2) and/or a compound represented by the formula (M-3), and the other compound (for example, a compound represented by the formula (M-4) and/or a compound represented by the formula (M-5)).

Further, the polymer compound of the present invention can be produced, for example, by condensation-polymerizing a compound represented by the formula (M-1), at least one compound selected from the group consisting of compounds represented by the formula (M-6), and the other compound (for example, a compound represented by the formula (M-4) and/or a compound represented by the formula (M-5)).

[Chemical Formula 98]

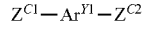

(M-1)

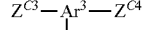

(M-2)

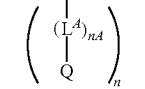

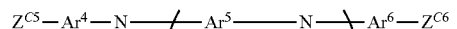

(M-3)

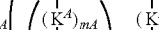

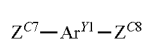

(M-4)

(M-5)

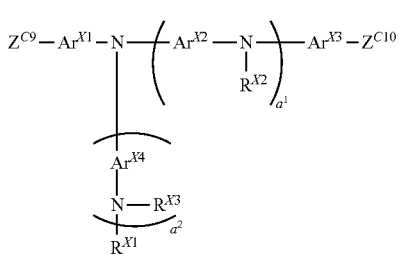

[wherein, nA, n, Ar$^3$, L$^A$, Q, mA, m, c, Ar$^4$ to Ar$^6$, K$^A$, Q', Ar$^{Y1}$, a$^1$, a$^2$, Ar$^{X1}$ to Ar$^{X4}$ and R$^{X1}$ to R$^{X3}$ represent the same meaning as described above.

Z$^{C1}$ to Z$^{C10}$ each independently represent a group selected from the group consisting of Group A of substituent and Group B of substituent.]

[Chemical Formula 99]

(M-6)

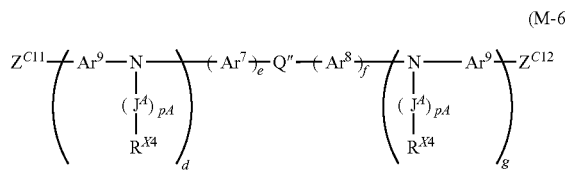

[wherein, pA, d, e, f, g, J$^A$, R$^{X4}$, Ar$^7$ to Ar$^9$ and Q" represent the same meaning as described above.

Z$^{C11}$ and Z$^{C12}$ each independently represent a group selected from the group consisting of Group A of substituent and Group B of substituent.]

For example, when Z$^{C1}$, Z$^{C2}$, Z$^{C3}$, Z$^{C4}$, Z$^{C5}$, Z$^{C6}$, z$^{C11}$ and Z$^{C12}$ are each a group selected Group A of substituent, a group selected from Group B of substituent is selected for Z$^{C7}$, Z$^{C8}$, Z$^{C9}$ and Z$^{C10}$, and when Z$^{C1}$, Z$^{C2}$, Z$^{C3}$, Z$^{C4}$, Z$^{C5}$, Z$^{C6}$, Z$^{C11}$ and Z$^{12}$ are each a group selected from Group B of substituent, a group selected from Group A of substituent is selected for Z$^{C7}$, Z$^{C8}$, Z$^{C9}$ and Z$^{C10}$.

<Group A of Substituent>

A chlorine atom, a bromine atom, an iodine atom, a group represented by —O—S(=O)$_2$R$^{C1}$ (wherein, R$^{C1}$ represents an alkyl group, a cycloalkyl group or an aryl group, and the foregoing groups optionally have a substituent.).

<Group B of Substituent>

A group represented by —B(OR$^{C2}$)$_2$ (wherein, R$^{C2}$ represents a hydrogen atom, an alkyl group, a cycloalkyl group or an aryl group, and the foregoing groups optionally have a substituent. A plurality of R$^{C2}$ may be the same or different, and may be combined together to form a ring structure together with an oxygen atom to which they are attached.);

a group represented by —BF$_3$Q' (wherein, Q' represents Li, Na, K, Rb or Cs.);

a group represented by —MgY' (wherein, Y' represents a chlorine atom, a bromine atom or an iodine atom.);

a group represented by —ZnY" (wherein, Y" represents a chlorine atom, a bromine atom or an iodine atom.); and a group represented by —Sn(R$^{C3}$)$_3$ (wherein, R$^{C3}$ represents a hydrogen atom, an alkyl group, a cycloalkyl group or an aryl group, and the foregoing groups optionally have a substituent. A plurality of R$^{C3}$ may be the same or different, and may be combined together to form a ring structure together with a tin atom to which they are attached.).

As the group represented by —B(OR$^{C2}$)$_2$, groups represented by the following formulae are exemplified.

[Chemical Formula 100]

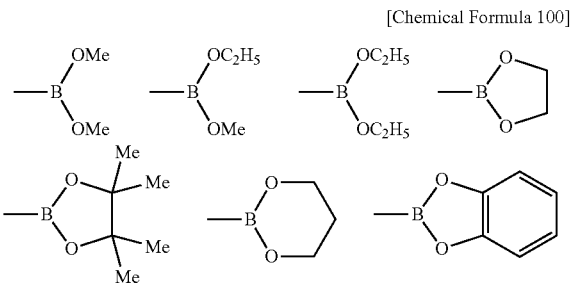

A compound having a group selected from Group A of substituent and a compound having a group selected from Group B of substituent are condensation-polymerized by a known coupling reaction, to form a carbon-carbon bond for connecting a group selected from Group A of substituent and a group selected from Group B of substituent. Thus, when a compound having two groups selected from Group A of substituent and a compound having two groups selected from Group B of substituent are subjected to a known coupling reaction, a condensation polymer of these compounds can be obtained by condensation polymerization.

The condensation polymerization is conducted usually in the presence of a catalyst, a base and a solvent, and if necessary, a phase transfer catalyst may co-exist.

The catalyst includes, for example, transition metal complexes such as palladium complexes such as bis(triphenylphosphine)palladium(II) dichloride, bis(tris-o-methoxyphenylphosphine)palladium(II) dichloride, tetrakis (triphenylphosphine)palladium(0), tris (dibenzylideneacetone)dipalladium(0), palladium acetate and the like, nickel complexes such as tetrakis(triphenylphosphine)nickel(0), [1,3-bis(diphenylphosphino)propane]nickel(II) dichloride, bis(1,4-cyclooctadiene)nickel(0) and the like; and these transition metal complexes further having a ligand such as triphenylphosphine, tri(o-tolyl) phosphine, tri(tert-butyl)phosphine, tricyclohexylphosphine, 1,3-bis(diphenylphosphino)propane, bipyridyl and the like. The catalysts may be used singly or in combination of two or more.

The use amount of the catalyst is usually 0.00001 to 3 molar equivalent, in terms of the amount of a transition metal with respect to the sum of moles of raw material monomers.

The base and the phase transfer catalyst include, for example, inorganic bases such as sodium carbonate, potassium carbonate, cesium carbonate, potassium fluoride, cesium fluoride, tripotassium phosphate and the like; organic bases such as tetrabutylammonium fluoride, tetraethylammonium hydroxide, tetrabutylammonium hydroxide and the like; and phase transfer catalysts such as tetrabutylammonium chloride, tetrabutylammonium bromide and the like. The bases and the phase transfer catalysts each may be used singly or in combination of two or more.

The use amounts of the base and the phase transfer catalyst are each usually 0.001 to 100 molar equivalent, with respect to the total number of moles of raw material monomers.

The solvent includes, for example, organic solvents such as toluene, xylene, mesitylene, tetrahydrofuran, 1,4-dioxane, dimethoxyethane, N,N-dimethylacetamide, N,N-dimethylformamide and the like, and water. The solvents may be used singly or in combination of two or more.

The use amount of the solvent is usually 10 to 100000 parts by mass, with respect to 100 parts by mass of the sum of raw material monomers.

The reaction temperature of condensation polymerization is usually −100 to 200° C. The reaction time of condensation polymerization is usually 1 hour more.

The post treatment of the polymerization reaction is conducted by known methods, for example, a method of removing water-soluble impurities by liquid separation, a method in which a precipitate deposited by adding a reaction liquid after the polymerization reaction to a lower alcohol such as methanol or the like is filtrated, then, dried, and other methods, singly or in combination. When the purity of the polymer compound is low, the compound can be purified by usual methods such as crystallization, re-precipitation, continuous extraction with a Soxhlet extractor, column chromatography and the like.

<Composition>

The composition of the present invention contains at least one material selected from the group consisting of a hole transporting material, a hole injection material, an electron transporting material, an electron injection material, a light emitting material, an antioxidant and a solvent, and the polymer compound of the present invention.

The composition containing the polymer compound of the present invention and a solvent (hereinafter, referred to as "ink" in some cases) is suitable for fabrication of a light emitting device using a printing method such as an inkjet printing method, a nozzle printing method and the like.

The viscosity of the ink may be adjusted by the kind of a printing method, and is preferably 1 to 20 mPa·s at 25° C. for preventing clogging and flying bend during discharge, when applied to a printing method in which a solution passes through a discharge device such as an inkjet printing method and the like.

The solvent is preferably a solvent capable of dissolving or uniformly dispersing solid components in the ink. The solvent includes, for example, chlorine-based solvents such as 1,2-dichloroethane, 1,1,2-trichloroethane, chlorobenzene, o-dichlorobenzene and the like; ether type solvents such as tetrahydrofuran, dioxane, anisole, 4-methylanisole and the like; aromatic hydrocarbon type solvents such as toluene, xylene, mesitylene, ethylbenzene, n-hexylbenzene, cyclohexylbenzene and the like; aliphatic hydrocarbon type solvents such as cyclohexane, methylcyclohexane, n-pentane, n-hexane, n-heptane, n-octane, n-nonane, n-decane, n-dodecane, bicyclohexyl and the like; ketone type solvents such as acetone, methyl ethyl ketone, cyclohexanone, acetophenone and the like; ester type solvents such as ethyl acetate, butyl acetate, ethyl cellosolve acetate, methyl benzoate, phenyl acetate and the like; polyhydric alcohol type solvents such as ethylene glycol, glycerin, 1,2-hexanediol and the like; alcohol type solvents such as isopropyl alcohol, cyclohexanol and the like; sulfoxide type solvents such as dimethyl sulfoxide and the like; and amide type solvents such as N-methyl-2-pyrrolidone, N,N-dimethylformamide and the like.

In the composition of the present invention, the compounding amount of the solvent is usually 1000 to 100000 parts by mass, preferably 2000 to 20000 parts by mass, with respect to 100 parts by mass of the polymer compound of the present invention.

The solvents may be used singly or in combination of two or more.

[Hole Transporting Material]

The hole transporting material is classified into low molecular compounds and polymer compounds, and polymer compounds are more preferable.

The polymer compound includes, for example, polyvinylcarbazole and derivatives thereof; polyarylenes having an aromatic amine structure in the side chain or main chain and derivatives thereof. The polymer compound may also be a compound in which an electron accepting site is bonded. The electron accepting site includes, for example, fullerene, tetrafluorotetracyanoquinodimethane, tetracyanoethylene, trinitrofluorenone and the like, and fullerene is preferable.

In the composition of the present invention, the compounding amount of the hole transporting material is usually 1 to 400 parts by mass, preferably 5 to 150 parts by mass, with respect to 100 parts by mass of the polymer compound of the present invention.

The hole transporting materials may be used singly or in combination of two or more.

[Electron Transporting Material]

The electron transporting material is classified into low molecular compounds and polymer compounds.

The low molecular compound includes, for example, metal complexes having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene and diphenoquinone, and derivatives thereof.

The polymer compound includes, for example, polyphenylene, polyfluorene and derivatives thereof. The polymer compound may be doped with a metal.

In the composition of the present invention, the compounding amount of the electron transporting material is usually 1 to 400 parts by mass, preferably 5 to 150 parts by mass, with respect to 100 parts by mass of the polymer compound of the present invention.

The electron transporting materials may be used singly or in combination of two or more.

[Hole Injection Material and Electron Injection Material]

The hole injection material and the electron injection material are each classified into low molecular compounds and polymer compounds.

The low molecular compound includes, for example, metal phthalocyanines such as copper phthalocyanine and the like; carbon; oxides of metals such as molybdenum, tungsten and the like; metal fluorides such as lithium fluoride, sodium fluoride, cesium fluoride, potassium fluoride and the like.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer containing an aromatic amine structure in the main chain or side chain, and the like.

In the composition of the present invention, the compounding amounts of the hole injection material and the electron injection material are each usually 1 to 400 parts by mass, preferably 5 to 150 parts by mass, with respect to 100 parts by mass of the polymer compound of the present invention.

The electron injection materials and the hole injection materials each may be used singly or in combination of two or more.

[Ion Doping]

When the hole injection material or the electron injection material contains an electrically conductive polymer, the electric conductivity of the electrically conductive polymer is preferably $1 \times 10^{-5}$ S/cm to $1 \times 10^{3}$ S/cm. For adjusting the electric conductivity of the electrically conductive polymer within such a range, the electrically conductive polymer can be doped with an appropriate amount of ions.

The kind of the ion to be doped is an anion for the hole injection material and a cation for the electron injection material. The anion includes, for example, a polystyrenesulfonic ion, an alkylbenzenesulfonic ion and a camphor sulfonic ion. The cation includes, for example, a lithium ion, a sodium ion, a potassium ion and a tetrabutylammonium ion.

The ions to be doped may be used singly or in combination of two or more.

[Light Emitting Material]

The light emitting material is classified into low molecular compounds and polymer compounds.

The low molecular compound includes, for example, naphthalene and derivatives thereof, anthracene and derivatives thereof and perylene and derivatives thereof, and triplet light emitting complexes having iridium, platinum or europium as the central metal.

The polymer compound includes polymer compounds containing, for example, a phenylene group, a naphthalenediyl group, a fluorenediyl group, a phenanthrenediyl group, a dihydrophenanthrenediyl group, a group represented by the formula (X), a carbazolediyl group, a phenoxazinediyl group, a phenothiazinediyl group, an anthracenediyl group, a pyrenediyl group and the like.

The light emitting material may contain a low molecular compound and a polymer compound, preferably contains a triplet light emitting complex and a polymer compound. As the triplet light emitting complex, iridium complexes such as metal complexes represented by the formulae Ir-1 to Ir-5, and the like, are preferable.

[Chemical Formula 101]

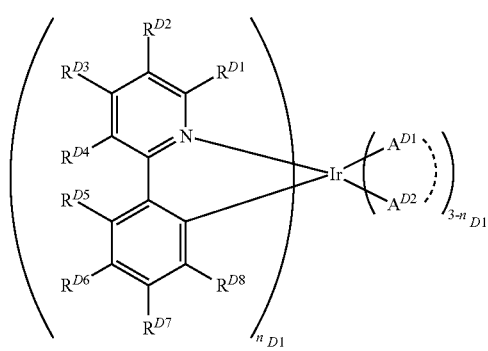

Ir-1

[Chemical Formula 102]

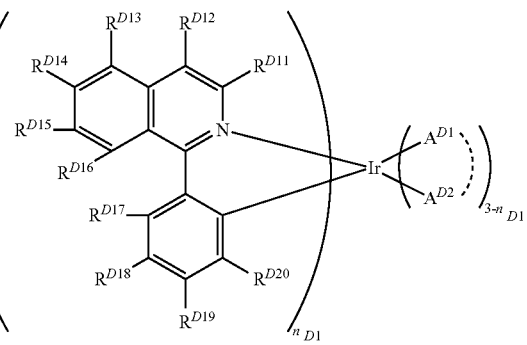

Ir-2

[Chemical Formula 103]

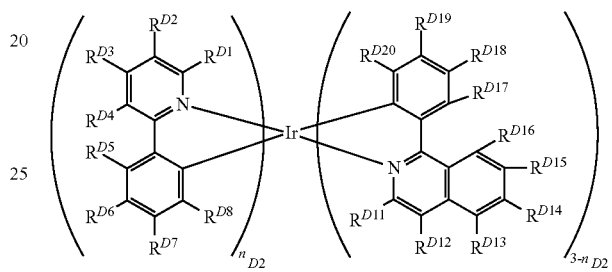

Ir-3

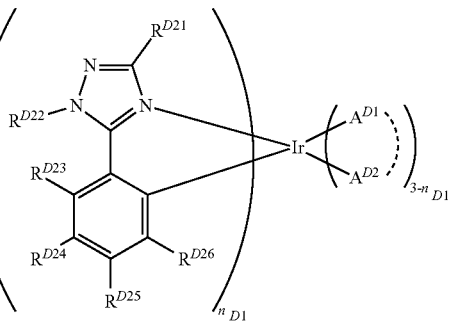

Ir-4

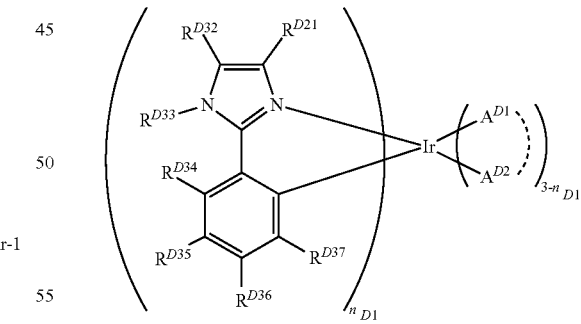

Ir-5

[wherein, $R^{D1}$ to $R^{D8}$, $R^{D11}$ to $R^{D20}$, $R^{D21}$ to $R^{D26}$ and $R^{D31}$ to $R^{D37}$ each independently represent a hydrogen atom, an alkyl group, a cycloalkyl group, an alkoxy group, a cycloalkoxy group, an aryl group, an aryloxy group, a monovalent heterocyclic group or a halogen atom, and the foregoing groups optionally have a substituent. When a plurality of $R^{D1}$ to $R^{D8}$, $R^{D11}$ to $R^{D20}$, $R^{D21}$ to $R^{D26}$ and $R^{D31}$ to $R^{D37}$ are present, they may be the same or different at each occurrence.

-A$^{D1}$-A$^{D2}$- represents an anionic bidentate ligand, A$^{D1}$ and A$^{D2}$ each independently represent a carbon atom, an oxygen atom or a nitrogen atom bonding to an iridium atom, and these atoms may be ring-constituent atoms. When a plurality of -A$^{D1}$-A$^{D2}$- are present, they may be the same or different.

n$_{D1}$ represents 1, 2 or 3, and n$_{D2}$ represents 1 or 2.]

In a metal complex represented by the formula Ir-1, at least one of R$^{D1}$ to R$^{D8}$ is preferably a group represented by the formula (D-A).

In a metal complex represented by the formula Ir-2, at least one of R$^{D11}$ to R$^{D20}$ is preferably a group represented by the formula (D-A).

In a metal complex represented by the formula Ir-3, at least one of R$^{D1}$ to R$^{D8}$ and R$^{D11}$ to R$^{D20}$ is preferably a group represented by the formula (D-A).

In a metal complex represented by the formula Ir-4, at least one of R$^{21}$ to R$^{D26}$ is preferably a group represented by the formula (D-A).

In a metal complex represented by the formula Ir-5, at least one of R$^{D31}$ to R$^{D37}$ is preferably a group represented by the formula (D-A).

[Chemical Formula 104]

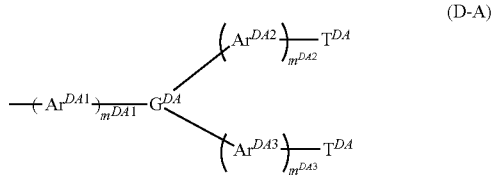

(D-A)

[wherein, m$^{DA1}$, m$^{DA2}$ and m$^{DA3}$ each independently represent an integer of 0 or more.

G$^{DA}$ represents a nitrogen atom, an aromatic hydrocarbon group or a heterocyclic group, and the foregoing groups optionally have a substituent.

Ar$^{DA1}$, Ar$^{DA2}$ and Ar$^{DA3}$ each independently represent an arylene group or a divalent heterocyclic group, and the foregoing groups optionally have a substituent. When a plurality of Ar$^{DA1}$, Ar$^{DA2}$ and Ar$^{DA3}$ are present, they may be the same or different at each occurrence.

T$^{DA}$ represents an aryl group or a monovalent heterocyclic group, and the foregoing groups optionally have a substituent. A plurality of T$^{DA}$ may be the same or different.]

m$^{DA1}$, m$^{DA2}$ and m$^{DA3}$ are each usually an integer of 10 or less, preferably an integer of 5 or less, more preferably 0 or 1. It is preferable that m$^{DA1}$, m$^{DA2}$ and m$^{DA3}$ are the same integer.

G$^{DA}$ is preferably a group represented by the formula (GDA-11) to the formula (GDA-15), and the foregoing groups optionally have a substituent.

[Chemical Formula 105]

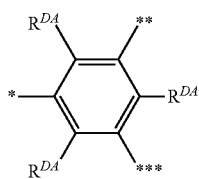

(GDA-11)

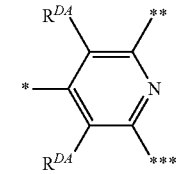

(GDA-12)

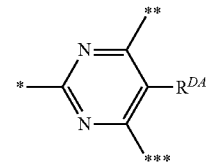

(GDA-13)

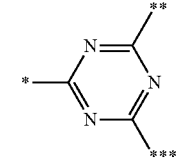

(GDA-14)

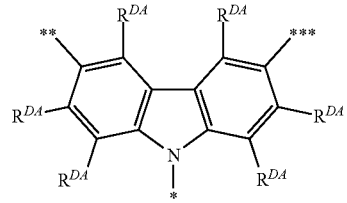

(GDA-15)

[wherein,

*,  and * represent a bond to Ar$^{DA1}$, Ar$^{DA2}$ and Ar$^{DA3}$, respectively.

R$^{DA}$ represents a hydrogen atom, an alkyl group, a cycloalkyl group, an alkoxy group, a cycloalkoxy group, an aryl group or a monovalent heterocyclic group, and the foregoing groups optionally further have a substituent. When a plurality of R$^{DA}$ are present, they may be the same or different.]

R$^{DA}$ is preferably a hydrogen atom, an alkyl group, a cycloalkyl group, an alkoxy group or a cycloalkoxy group, more preferably a hydrogen atom, an alkyl group or a cycloalkyl group, and the foregoing groups optionally have a substituent.

Ar$^{DA1}$, Ar$^{DA2}$ and Ar$^{DA3}$ are each preferably a group represented by the formula (ArDA-1) to the formula (ArDA-3).

[Chemical Formula 106]

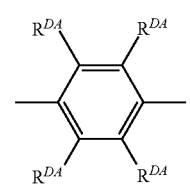

(ArDA-1)

-continued

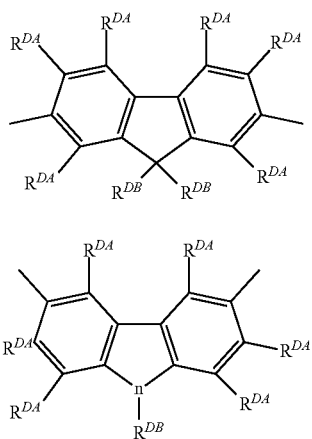
(ArDA-2)

(ArDA-3)

[wherein, $R^{DA}$ represent the same meaning as described above.

$R^{DB}$ represents a hydrogen atom, an alkyl group, a cycloalkyl group, an aryl group or a monovalent heterocyclic group, and the foregoing groups optionally have a substituent. When a plurality of $R^{DB}$ are present, they may be the same or different.]

$T^{DA}$ is preferably a group represented by the formula (TDA-1) to the formula (TDA-3).

[Chemical Formula 107]

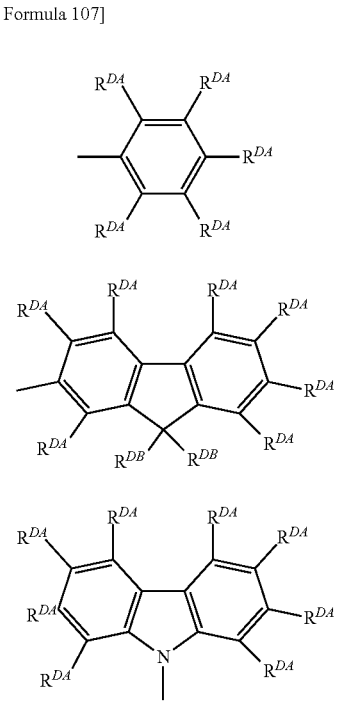
(TDA-1)

(TDA-2)

(TDA-3)

[wherein, $R^{DA}$ and $R^{DB}$ represent the same meaning as described above.]

The group represented by the formula (D-A) is preferably a group represented by the formula (D-A1) to the formula (D-A3).

[Chemical Formula 108]

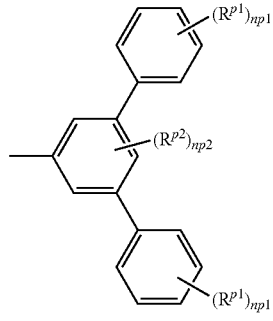
(D-A1)

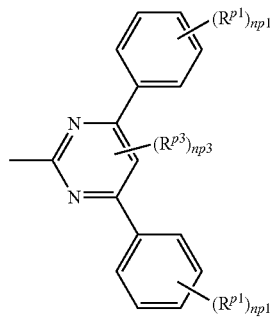
(D-A2)

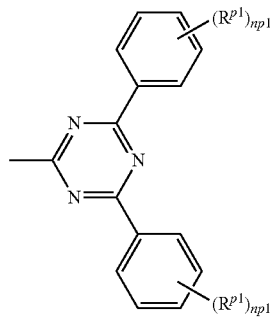
(D-A3)

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, and np3 represents 0 or 1. A plurality of np1 may be the same or different.]

np1 is preferably an integer of 0 to 3, more preferably an integer of 1 to 3, further preferably 1.

np2 is preferably 0 or 1, more preferably 0.

np3 is preferably 0.

$R^{p1}$, $R^{p2}$ and $R^{p3}$ are each preferably an alkyl group or a cycloalkyl group.

The anionic bidentate ligand represented by -$A^{D1}$-$A^{D2}$- includes, for example, ligands represented by the following formulae.

[Chemical Formula 109]

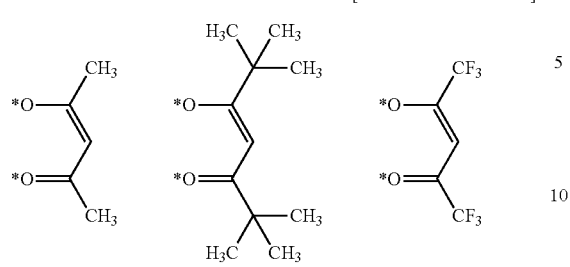

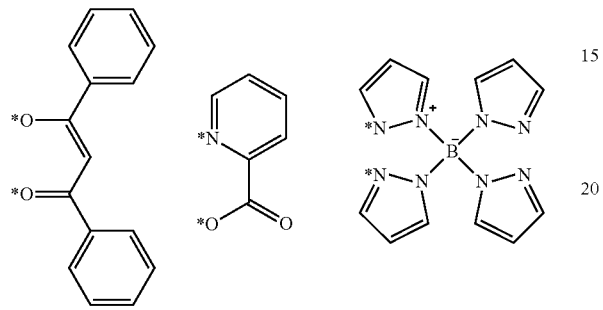

[wherein, * represents a site binding to Ir.]

The metal complex represented by the formula Ir-1 is preferably a metal complex represented by the formulae Ir-11 to Ir-13. The metal complex represented by the formula Ir-2 is preferably a metal complex represented by the formula Ir-21. The metal complex represented by the formula Ir-3 is preferably a metal complex represented by the formulae Ir-31 to Ir-33. The metal complex represented by the formula Ir-4 is preferably a metal complex represented by the formulae Ir-41 to Ir-43. The metal complex represented by the formula Ir-5 is preferably a metal complex represented by the formulae Ir-51 to Ir-53.

[Chemical Formula 110]

Ir-11

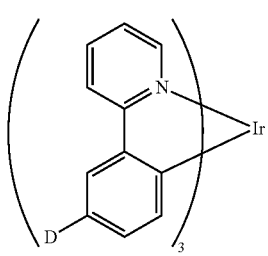

Ir-12

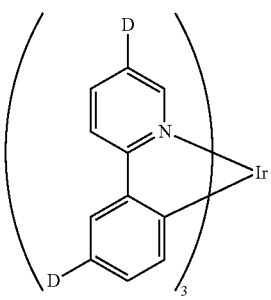

Ir-13

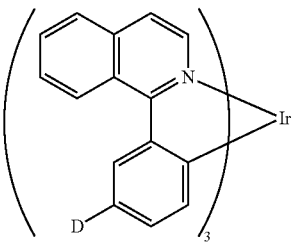

Ir-21

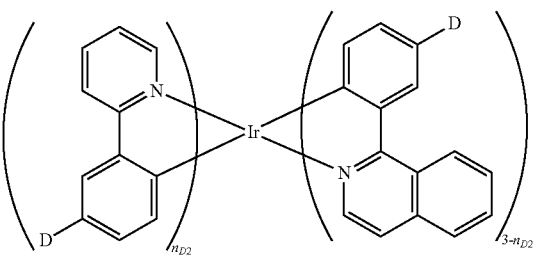

[Chemical Formula 111]

Ir-31

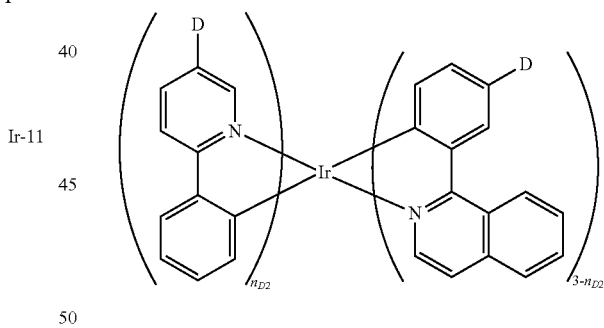

Ir-32

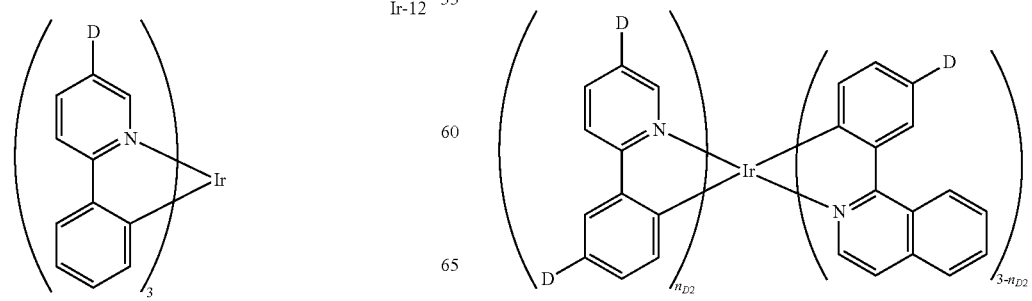

[Chemical Formula 112]

Ir-33

-continued

Ir-41 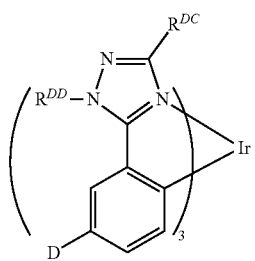

Ir-42 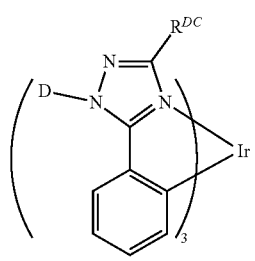

Ir-43 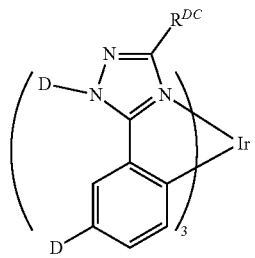

[Chemical Formula 113]

Ir-51 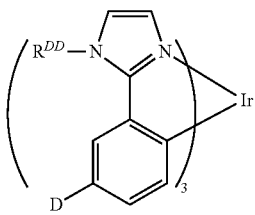

[Chemical Formula 114]

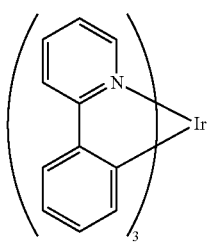
Ir(ppy)$_3$

-continued

Ir-52 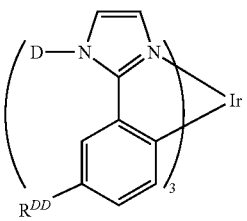

Ir-53 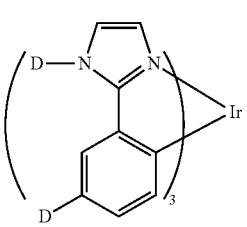

[wherein,
$n_{D2}$ represents 1 or 2.
D represents a group represented by the formula (D-A). A plurality of D may be the same or different.
$R^{DC}$ represents a hydrogen atom, an alkyl group, a cycloalkyl group, an aryl group or a monovalent heterocyclic group, and the foregoing groups optionally have a substituent. A plurality of $R^{DC}$ may be the same or different.
$R^{DD}$ represents an alkyl group, a cycloalkyl group, an aryl group or a monovalent heterocyclic group, and the foregoing groups optionally have a substituent. A plurality of $R^{DD}$ may be the same or different.]

The triplet light emitting complex includes, for example, metal complexes shown below.

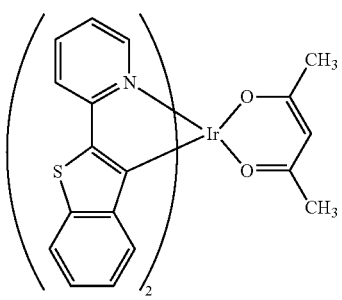
Btp$_2$Ir(acac)

-continued
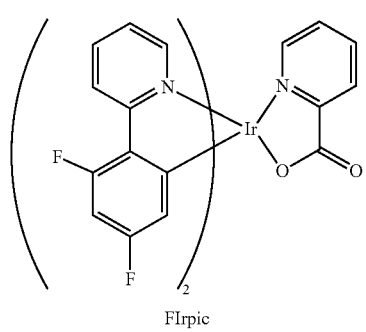
FIrpic
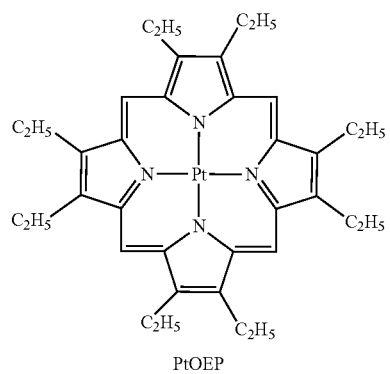
PtOEP
[Chemical Formula 115]
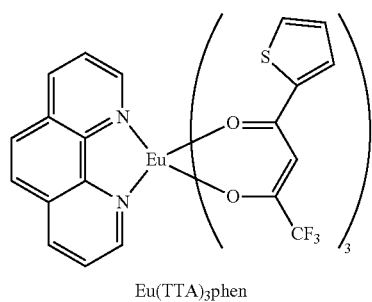
Eu(TTA)$_3$phen
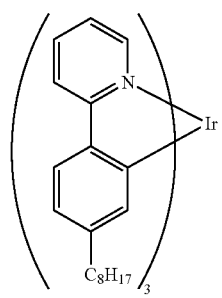
COM-1
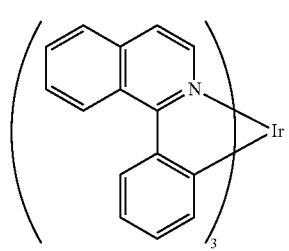
COM-2
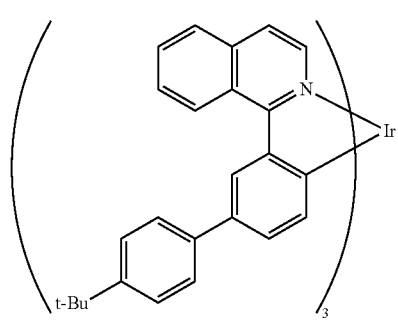
COM-3
[Chemical Formula 116]
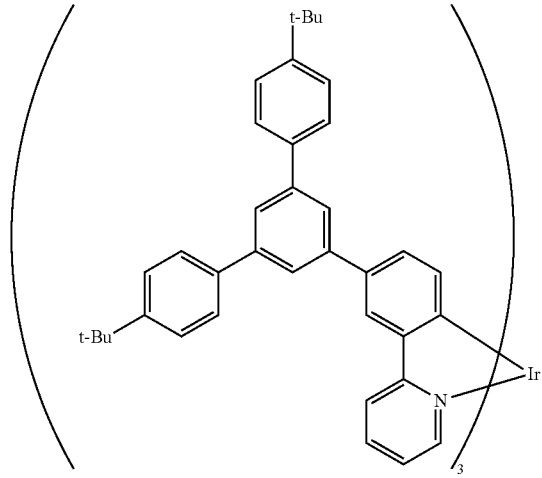
COM-4
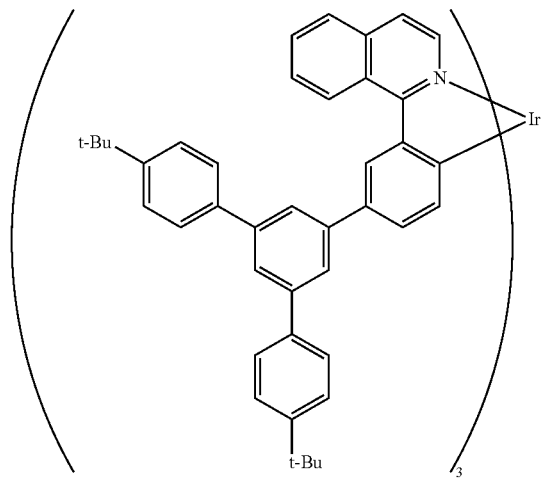
COM-5

COM-6
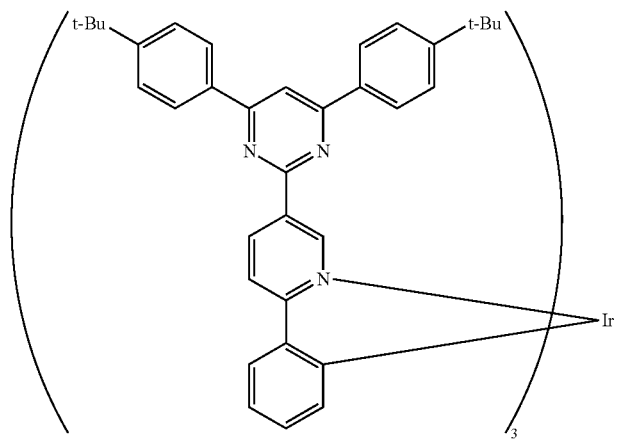
[Chemical Formula 117]
COM-7
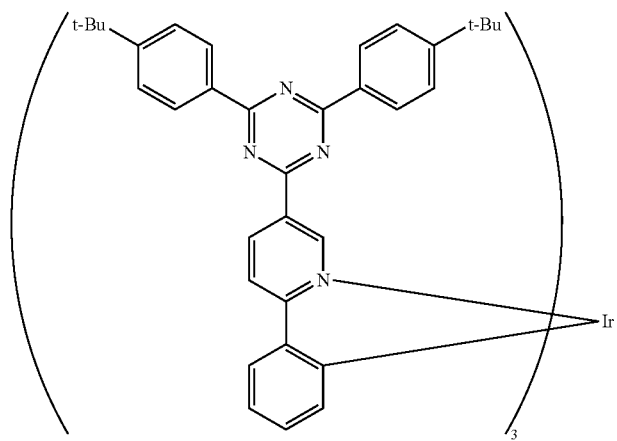
COM-8
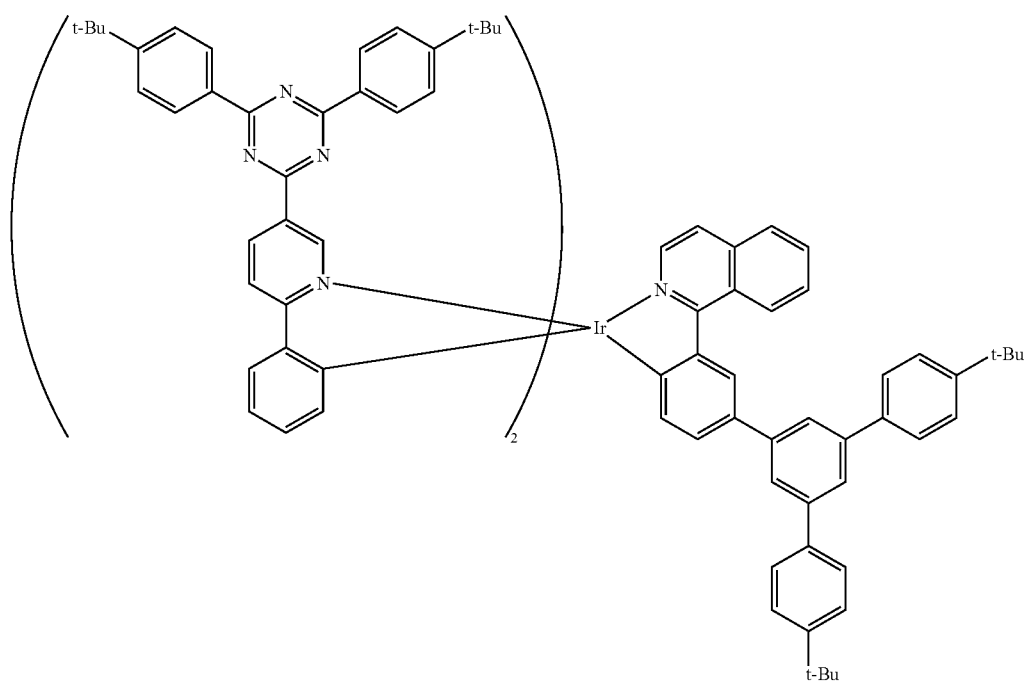

In the composition of the present invention, the compounding amount of the light emitting material is usually 0.1 to 400 parts by mass, with respect to 100 parts by mass of the polymer compound of the present invention.

The light emitting materials may be used singly or in combination of two or more.

[Antioxidant]

The antioxidant may be a compound which is soluble in a solvent which is the same as the solvent for the polymer compound of the present invention and does not inhibit light emission and charge transportation, and includes, for example, phenol type antioxidants and phosphorus-based antioxidants.

In the composition of the present invention, the compounding amount of the antioxidant is usually 0.001 to 10 parts by mass, with respect to 100 parts by mass of the polymer compound of the present invention.

The antioxidants may be used singly or in combination of two or more.

<Light Emitting Device>

The light emitting device of the present invention is a light emitting device having an organic layer containing the polymer compound of the present invention. The constitution of the light emitting device of the present invention has, for example, electrodes consisting of an anode and a cathode, and a layer containing the polymer compound of the present invention disposed between the electrodes.

[Layer Constitution]

The layer containing the polymer compound of the present invention is usually a layer selected from one or more of a light emitting layer, a hole transporting layer, a hole injection layer, an electron transporting layer and an electron injection layer, and preferably a light emitting layer. These layers contain a light emitting material, a hole transporting material, a hole injection material, an electron transporting material and an electron injection material, respectively. These layers can be formed by dissolving a light emitting material, a hole transporting material, a hole injection material, an electron transporting material and an electron injection material in the above-described solvent to prepare inks, respectively, and applying these inks by, for example, a spin coat method, a casting method, a microgravure coat method, a gravure coat method, a bar coat method, a roll coat method, a wire bar coat method, a dip coat method, a spray coat method, a screen printing method, a flexo printing method, an offset printing method, an inkjet printing method, a capillary coat method or a nozzle coat method.

The light emitting device has a light emitting layer between an anode and a cathode. The light emitting device of the present invention preferably has at least one of a hole injection layer and a hole transporting layer between an anode and a light emitting layer from the standpoint of hole injectability and hole transportability, and preferably has at least one of an electron injection layer and an electron transporting layer between a cathode and a light emitting layer from the standpoint of electron injectability and electron transportability.

The materials of a hole transporting layer, an electron transporting layer, a light emitting layer, a hole injection layer and an electron injection layer include the hole transporting material, the electron transporting material, the light emitting material, the hole injection material and the electron injection material described above, respectively, in addition to the polymer compound of the present invention.

The method for forming each of the light emitting layer, the hole transporting layer, the electron transporting layer, the hole injection layer, the electron injection layer and the like in the light emitting device of the present invention includes, when a low molecular compound is used, for example, a method of vacuum vapor deposition from a powder and a method of forming a film from a solution or melted state, and when a polymer compound is used, for example, a method of forming a film from a solution or melted state.

The order, the number and the thickness of layers to be laminated may be adjusted in consideration of light emission efficiency and device life.

[Substrate/Electrode]

The substrate in the light emitting device may advantageously be a substrate on which an electrode can be formed and which does not change chemically in forming an organic layer, and is, for example, a substrate made of a material such as glass, plastic, silicon and the like. When an opaque substrate is used, it is preferable that the electrode farthest from the substrate is transparent or semi-transparent.

The material of the anode includes, for example, electrically conductive metal oxides and semi-transparent metals, preferably includes indium oxide, zinc oxide, tin oxide; electrically conductive compounds such as indium-tin-oxide (ITO), indium-zinc-oxide and the like; argentine-palladium-copper (APC) complex; NESA, gold, platinum, silver and copper.

The material of the cathode includes, for example, metals such as lithium, sodium, potassium, rubidium, cesium, beryllium, magnesium, calcium, strontium, barium, aluminum, zinc, indium and the like; alloys composed of two or more of them; alloys composed of at least one of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The anode and the cathode each may take a laminated structure composed of two or more layer.

[Application]

In order to obtain planar light emission using a light emitting device, the planar anode and the planar cathode may be arranged so as to overlap each other. In order to obtain patterned light emission, there are a method of installing a mask having a patterned window on the surface of a planar light emitting device, a method in which a layer to be formed as a non-light emitting part is formed extremely thick so as to cause substantially non light emission and a method of forming an anode or a cathode, or both electrodes in a pattern. A segment type display capable of displaying numerals, letters and the like can be obtained by forming a pattern by any one of these methods and disposing several electrodes so that several electrodes can be turned on and off independently. In order to obtain a dot matrix display, both the anode and the cathode may be formed in a stripe shape and arranged so as to be orthogonal to each other. Partial color display and multicolor display become possible by a method of separately coating plural kinds of polymer compounds having different emission colors or a method using a color filter or a fluorescence conversion filter. The dot matrix display can be driven passively or can be driven actively in combination with a TFT and the like. These displays can be used for displays of computers, televisions, portable terminals, and the like. The planar light emitting device can be suitably used as a planar light source for backlight of a liquid crystal display, or as a planar light source for illumination. If a flexible substrate is used, it can be used as a curved light source and a curved display.

EXAMPLES

The present invention will be illustrated further in detail by examples below, but the present invention is not limited to these examples.

In examples, the polystyrene-equivalent number-average molecular weight (Mn) and the polystyrene-equivalent weight-average molecular weight (Mw) of polymer compounds were determined by any of the following size exclusion chromatography (SEC) using tetrahydrofuran as a mobile phase. Measurement conditions for SEC are as described below.

A polymer compound to be measured was dissolved in tetrahydrofuran at a concentration of about 0.05% by mass, and 10 μL of the solution was injected into SEC. The mobile phase was flowed at a flow rate of 1.0 mL/min. As a column, PLgel MIXED-B (manufactured by Polymer Laboratories Ltd.) was used. As a detector, a UV-VIS detector (trade name: UV-8320GPC manufactured by Tosoh Corp.) was used.

LC-MS was measured by the following method.

A sample to be measured was dissolved in chloroform or tetrahydrofuran so as to give a concentration of about 2 mg/mL, and about 1 μL of the solution was poured into LC-MS (manufactured by Agilent, trade name: 1290 Infinity LC and 6230 TOF LC/MS). As a mobile phase of LC-MS, acetonitrile and tetrahydrofuran were allowed to flow at a flow rate of 1.0 mL/min while changing the ratio of acetonitrile/tetrahydrofuran. As a column, SUMIPAX ODS Z-CLUE (manufactured by Sumika Chemical Analysis Service, Ltd., internal diameter: 4.6 mm, length: 250 mm, particle size: 3 μm) was used.

NMR was measured by the following method.

Five to ten mg of a measurement sample was dissolved in about 0.5 mL of deutero-chloroform (CDCl$_3$), deutero-tetrahydrofuran, deutero-dimethyl sulfoxide, deutero-acetone, deutero-N,N-dimethylformamide, deutero-toluene, deutero-methanol, deutero-ethanol, deutero-2-propanol or deutero-methylene chloride, and NMR thereof was measured using an NMR apparatus (trade name: INOVA300 manufactured by Agilent, or trade name: JNM-ECZ400S/L1 manufactured by JEOL RESONANCE).

As an indicator of the purity of the compound, high performance liquid chromatography (HPLC) area percentage value was used. This value is a value by HPLC (trade name: LC-20A manufactured by Shimadzu Corp.) at UV=254 nm. In this operation, the compound to be measured was dissolved in tetrahydrofuran or chloroform so as to give a concentration of 0.01 to 0.2% by mass, and 1 to 10 μL of the solution was poured into HPLC depending on the concentration. As a mobile phase of HPLC, acetonitrile/tetrahydrofuran were used while changing the ratio thereof from 100/0 to 0/100 (volume ratio), and flowed at a flow rate of 1.0 mL/min. As a column, SUMIPAX ODS Z-CLUE (manufactured by Sumika Chemical Analysis Service, Ltd., internal diameter: 4.6 mm, length: 250 mm, particle size: 3 μm) or an ODS column having the equivalent performance was used. As a detector, a photodiode array detector (trade name: SPD-M20A manufactured by Shimadzu Corp.) was used.

<Synthesis Example 1> Synthesis of Compound 1

(Synthesis of Compound 1a)

[Chemical Formual 118]

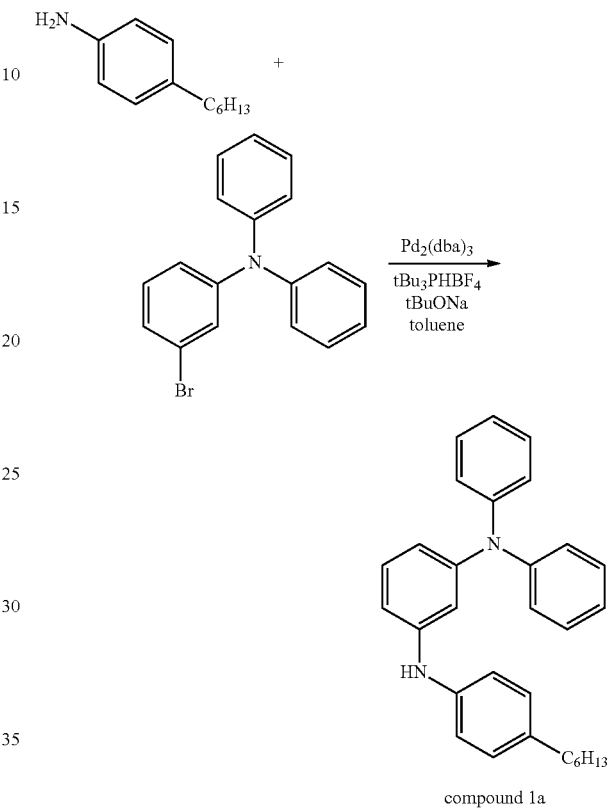

compound 1a

A nitrogen gas atmosphere was prepared in a reaction vessel, then, 4-hexylaniline (19.2 g), 3-bromotriphenylamine (28.0 g), Pd$_2$(dba)$_3$(dba)$_{0.73}$ (1.45 g), t-Bu$_3$PHBF$_4$ (0.75 g), t-BuONa (16.6 g) and toluene (350 mL) were added, and the mixture was stirred at 50° C. for 2.5 hours. The resultant mixture was cooled down to room temperature, then, filtrated through a silica gel short column. The resultant filtrate was concentrated under reduced pressure to obtain a brown oil. The resultant oil was purified by silica gel column chromatography (a mixed solvent of hexane and toluene), then, concentrated under reduced pressure, and dried, to obtain a compound 1a (29.6 g, colorless oil). The compound 1a had an HPLC area percentage value of 99.2%.

(Synthesis of Compound 1b)

[Chemical Formula 119]

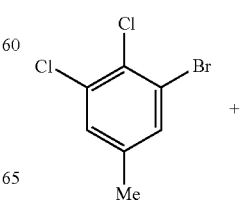

(Synthesis of Compound 1c)

[Chemical Formula 120]

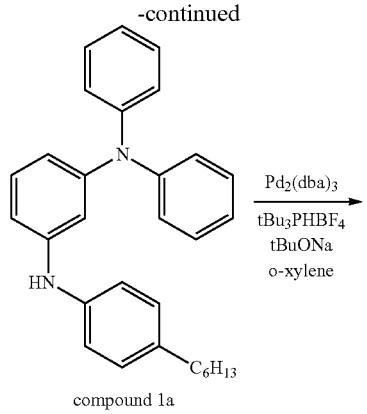

compound 1a

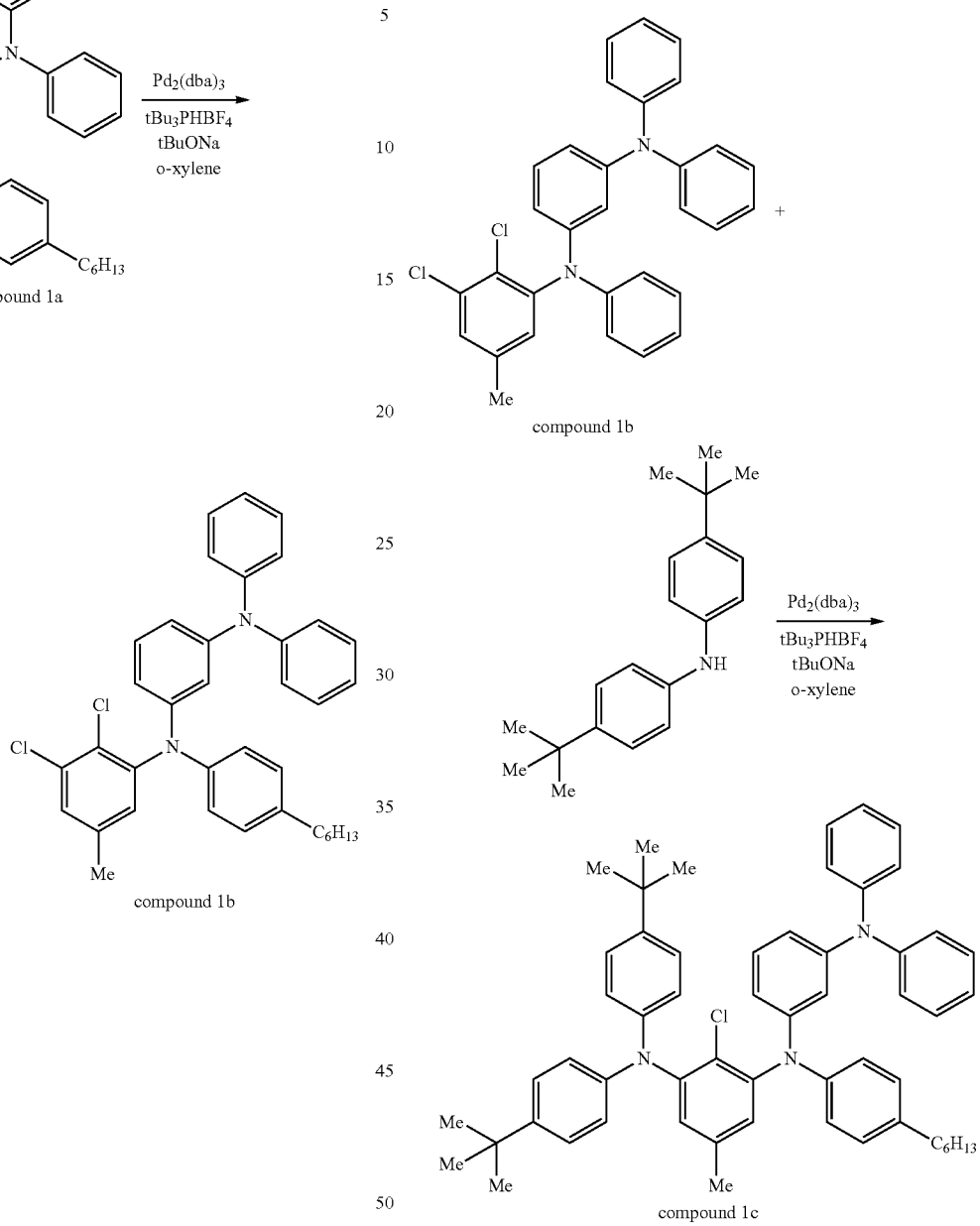

A nitrogen gas atmosphere was prepared in a reaction vessel, then, 3-bromo-4,5-dichlorotoluene (8.2 g), the compound 1a (14.8 g), Pd$_2$(dba)$_3$(dba)$_{0.73}$ (0.56 g), t-Bu$_3$PHBF$_4$ (0.30 g), t-BuONa (6.6 g) and o-xylene (130 g) were added, and the mixture was stirred at 50° C. for 2.5 hours. The resultant mixture was cooled down to room temperature, then, filtrated through a short column stacked with silica gel/Celite. The resultant filtrate was concentrated under reduced pressure to obtain a brown oil. The resultant oil was purified by silica gel column chromatography (a mixed solvent of hexane and toluene), then, concentrated under reduced pressure, and dried, to obtain a compound 1b (14.9 g, colorless oil). The compound 1b had an HPLC area percentage value of 99.0%.

A nitrogen gas atmosphere was prepared in a reaction vessel, then, bis(4-tert-butylphenyl)amine (7.0 g), the compound 1b (12.5 g), Pd$_2$(dba)$_3$(dba)$_{0.73}$ (0.42 g), t-Bu$_3$PHBF$_4$ (0.23 g), t-BuONa (3.7 g) and o-xylene (42 g) were added, and the mixture was stirred at 50° C. for 10 hours, then, stirred at 70° C. for 1 hour. The resultant mixture was cooled down to room temperature, then, filtrated through a short column stacked with silica gel/Celite. The resultant filtrate was concentrated under reduced pressure to obtain a brown oil. The resultant oil was purified by silica gel column chromatography (a mixed solvent of hexane and toluene), then, concentrated under reduced pressure, and dried, to obtain a compound 1c (9.2 g, colorless oil). The compound 1c had an HPLC area percentage value of 92.2%.

(Synthesis of Compound 1)

[Chemical Formula 121]

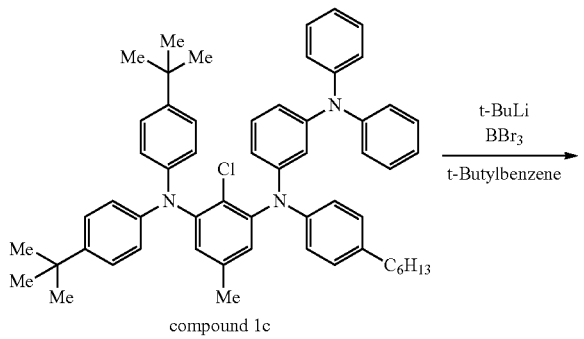

compound 1c

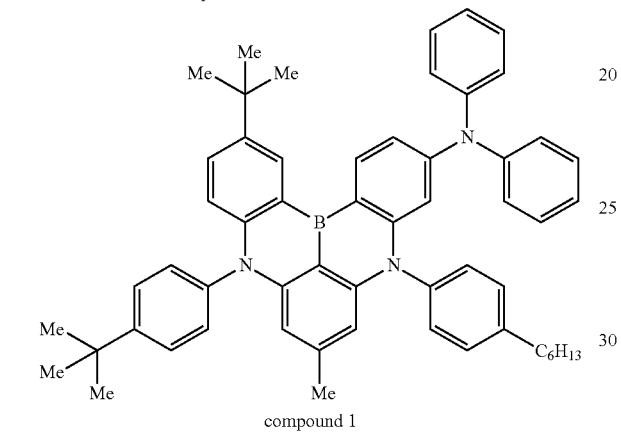

compound 1

A nitrogen gas atmosphere was prepared in a reaction vessel, then, the compound 1c (7.5 g) and tert-butylbenzene (56 mL) were added, and the mixture was cooled to 0° C., then, a t-BuLi/pentane solution (1.5 M, 9.6 mL) was slowly added to this while maintaining 0° C. The resultant mixture was stirred at 60° C. for 3 hours, then, pentane was distilled off under reduced pressure. The resultant mixture was cooled down to −50° C., then, BBr$_3$ (4.5 g) was added, and the mixture was stirred at −50° C. for 0.5 hours. The resultant mixture was heated up to 120° C., and reacted at 120° C. for 3 hours. The resultant mixture was cooled down to room temperature, then, a sodium acetate aqueous solution and ethyl acetate were added, and the resultant organic layer was washed with ion exchanged water. The resultant organic layer was concentrated under reduced pressured, to obtain a yellow oil. The resultant oil was purified by silica gel column chromatography (a mixed solvent of hexane and toluene), then, concentrated under reduced pressure, and dried, to obtain a yellow solid. The resultant solid was dispersed in acetonitrile, then, filtrated, to obtain a compound 1 (1.1 g, yellow solid). The compound 1 had an HPLC area percentage value of 99.4%.

LC-MS (APCI, positive): m/z=798.5 [M+H]+

$^1$H-NMR (CD$_2$Cl$_2$, 400 MHz) δ (ppm): 0.92 (m, 3H), 1.36 (m, 6H), 1.39 (s, 9H), 1.44 (s, 9H), 1.58 (m, 2H), 2.08 (s, 3H), 2.61 (dd, 2H), 5.92 (d, 2H), 6.19 (d, 1H), 6.61 (d, 1H), 6.87 (dd, 1H), 7.02 (t, 2H), 7.07 (m, 6H), 7.2-7.3 (m, 8H), 7.42 (dd, 1H), 7.68 (d, 2H), 8.67 (d, 1H), 8.79 (d, 1H).

<Synthesis Example 2> Synthesis of Compound 2

[Chemical Formula 122]

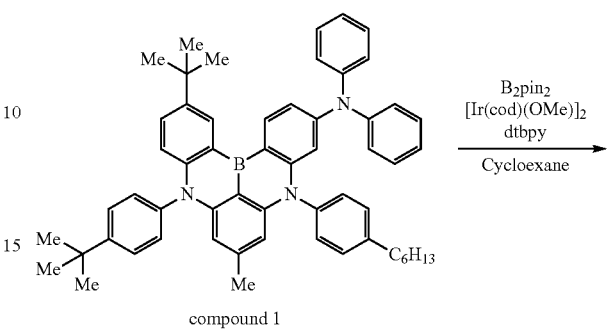

compound 1

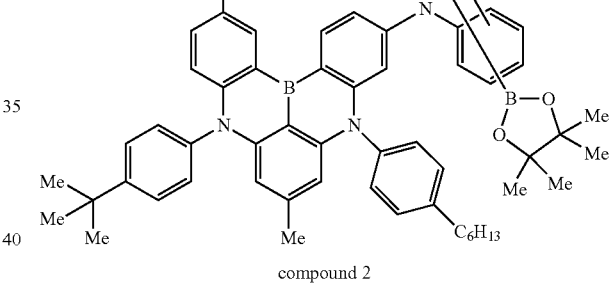

compound 2

A nitrogen gas atmosphere was prepared in a reaction vessel, then, the compound 1 (0.91 g), bis(pinacolato)diboron (B$_2$pin$_2$; 0.58 g), 4,4'-di-tert-butyl-2,2'-bipyridyl (dtbpy; 0.013 g), (1,5-cyclooctadiene)(methoxy)iridium(I) dimer ([Ir(cod) (OMe)]$_2$; 0.0155 g) and cyclohexane (23 mL) were added, and the mixture was stirred at 90° C. for 2 hours. The resultant mixture was cooled down to room temperature, then, the resultant organic layer was washed with ion exchanged water. The resultant organic layer was liquid-separated, a solid insoluble in the organic layer was removed by filtration, and the resultant filtrate was concentrated under reduced pressure, to obtain a yellow oil. The resultant oil was purified by silica gel column chromatography (a mixed solvent of hexane and toluene), then, concentrated under reduced pressure, and dried, to obtain a compound 2 (0.21 g, yellow oil). The compound 2 had an HPLC area percentage value of 97.4%. The compound 2 was obtained in the form of a mixture of four isomers, and its molar ratio: compound 2a:compound 2b:compound 2c:compound 2d was 7.5:37.1:43.0:12.4.

[Chemical Formula 123]

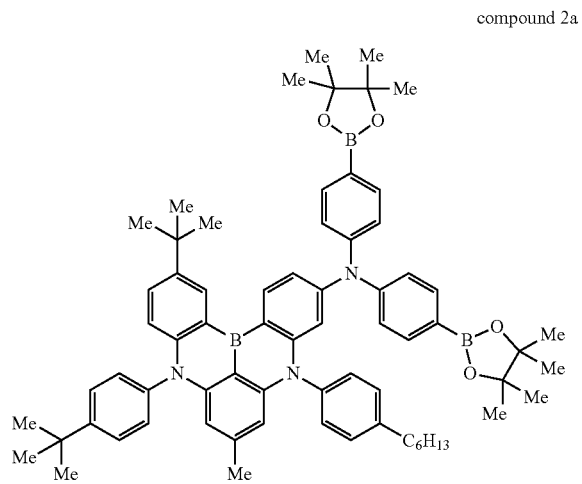

compound 2a

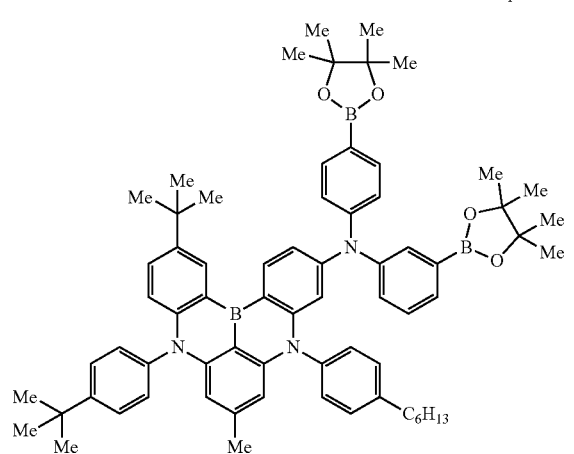

compound 2b

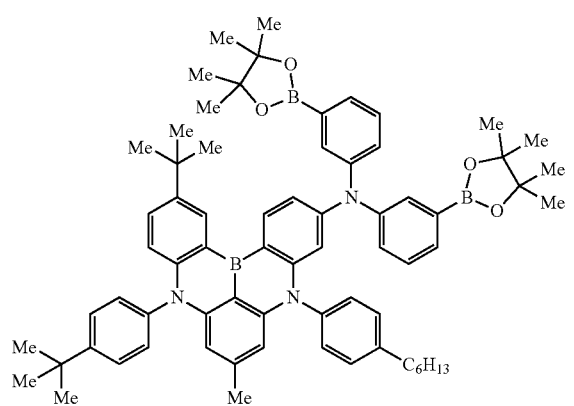

compound 2c

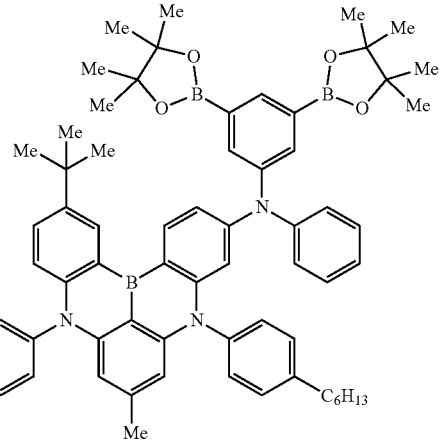

compound 2d $^1$H-NMR (CD$_2$Cl$_2$, 400 MHz) δ (ppm): 0.92 (m, 3H), 1.30, 1.32, 1.38, 1.39, 1.44 (s, sum 33H), 1.3-1.4 (m, (6H)), 1.44 (s, 9H), 1.58 (m, 2H), 2.08 (m, 3H), 2.59 (t, 2H), 5.92 (m, 2H), 6.09 (d, 0.12H: compound 2d), 6.11 (d, 0.43H: compound 2c), 6.20 (d, 0.37H: compound 2b), 6.26 (d, 0.08H: compound 2a), 6.60 (d, 0.6H), 6.61 (d, 0.4H), 6.80 (m, 0.6H), 6.86 (m, 0.4H), 7.0-7.1 (m, 4.3H), 7.1-7.2 (m, 1.2H), 7.2-7.3 (m, 5.5H), 7.4-7.5 (m, 2.6H), 7.51 (m, 0.27H: compound 2d), 7.59 (m, 1H), 7.68 (d, 2H), 7.83 (m, 0.13H: compound 2d), 8.6-8.7 (m, 1H), 8.79 (m, 1H).

<Synthesis Example 3> Synthesis and Acquisition of Compounds 3 to 8 and Compounds 11 to 12

A compound 3 was synthesized according to a method described in Japanese Unexamined Patent Application Publication (JP-A) No. 2010-189630.

A compound 4 was synthesized according to a method described in Japanese Translation of PCT International Application Publication (JP-T) No. 2007-512249.

A compound 5 was synthesized according to a method described in JP-A No. 2008-106241.

As a compound 6, a commercially available product was used.

A compound 7 was synthesized according to a method described in International Publication WO2009/131255.

A compound 8 was synthesized according to a method described in International Publication WO2016/031639.

[Chemical Formula 124]

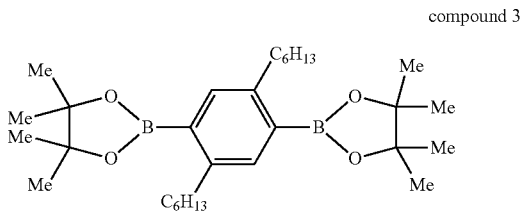

compound 3

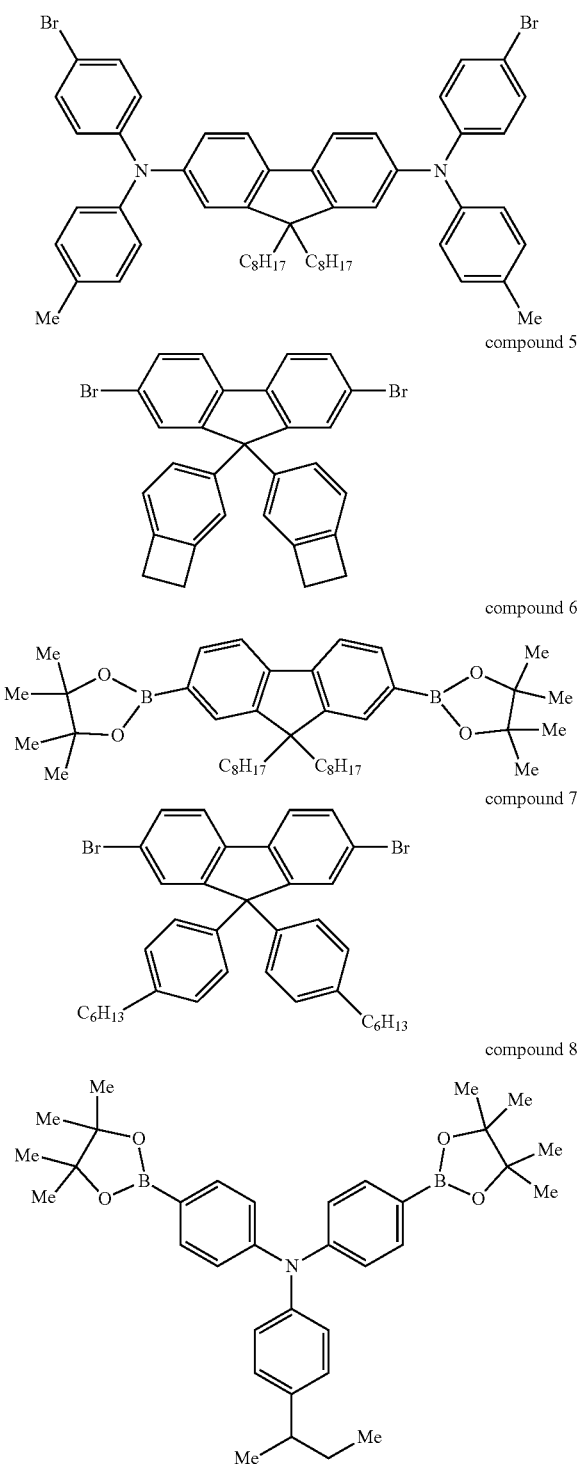

compound 4 compound 5 compound 6 compound 7 compound 8

<Synthesis Example 4> Synthesis of Polymer Compound 1

(Step 1) An inert gas atmosphere was prepared in a reaction vessel, then, the compound 3 (3.995 g), the compound 4 (6.237 g), the compound 5 (0.519 g), dichlorobis(tris-o-methoxyphenylphosphine)palladium (7.1 mg) and toluene (190 mL) were added, and the mixture was heated at 105° C.

(Step 2) Thereafter, a 20% by mass tetraethylammonium hydroxide aqueous solution (28 mL) was dropped into this, and the liquid was refluxed for 4 hours. Thereafter, to this were added phenylboronic acid (97.5 mg), a 20% by mass tetraethylammonium hydroxide aqueous solution (28 mL) and dichlorobis(tris-o-methoxyphenylphosphine)palladium (7.1 mg), and the mixture was refluxed for 6 hours. The resultant reaction mixture was cooled, then, washed with water twice, with a 10% by mass hydrochloric acid aqueous solution twice, with 3% by mass ammonia water twice and with water twice. The resultant solution was dropped into methanol and stirred, to generate a precipitate. The resultant precipitate was dissolved in toluene, and purified by passing through an aluminum column and a silica gel column in this order. The resultant solution was dropped into methanol and stirred, to generate a precipitate. The resultant precipitate was collected by filtration and dried, to obtain 6.65 g of a polymer compound 1. The polymer compound 1 had an Mn of $2.6 \times 10^4$ and an Mw of $1.4 \times 10^5$.

The polymer compound 1 is a copolymer constituted of a constitutional unit derived from the compound 3, a constitutional unit derived from the compound 4 and a constitutional unit derived from the compound 5 at a molar ratio of 50:42.5:7.5 according to the theoretical values calculated from the amounts of the charged raw materials.

<Example 1> Synthesis of Polymer Compound 2

(Step 1) An inert gas atmosphere was prepared in a reaction vessel, then, the compound 2 (0.104 g), the compound 6 (0.502 g), the compound 7 (0.628 g), dichlorobis(tris-o-methoxyphenylphosphine)palladium (0.86 mg) and toluene (27 mL) were mixed, and the mixture was heated at 105° C.

(Step 2) Thereafter, a 10% by mass tetraethylammonium hydroxide aqueous solution (18 mL) was dropped into this, and the liquid was refluxed for 4 hours. Thereafter, to this were added phenylboronic acid (48.8 mg) and dichlorobis(tris-o-methoxyphenylphosphine)palladium (0.9 mg), and the mixture was refluxed for 6 hours. The resultant reaction mixture was cooled, then, washed with water twice, with a 10% by mass hydrochloric acid aqueous solution twice, with 3% by mass ammonia water twice and with water twice. The resultant solution was dropped into methanol and stirred, to generate a precipitate. The resultant precipitate was dissolved in toluene, and purified by passing through an aluminum column and a silica gel column in this order. The resultant solution was dropped into methanol and stirred, to generate a precipitate. The resultant precipitate was collected by filtration and dried, to obtain 0.68 g of a polymer compound 2. The polymer compound 2 had an Mn of $4.5 \times 10^4$ and an Mw of $1.1 \times 10^5$.

The polymer compound 2 is a copolymer constituted of a constitutional unit derived from the compound 6, a constitutional unit derived from the compound 7 and a constitutional unit derived from the compound 2 at a molar ratio of 45:50:5 according to the theoretical values calculated from the amounts of the charged raw materials.

<Synthesis Example 5> Synthesis of Polymer Compound 3

A polymer compound 3 (1.1 g) was obtained in the same manner as in Example 1, except that the (Step 1) was changed to "An inert gas atmosphere was prepared in a reaction vessel, then, the compound 8 (0.096 g), the compound 6 (0.916 g), the compound 7 (1.119 g), dichlorobis (phenylphosphine)palladium (1.5 mg) and toluene (47 mL) were mixed, and the mixture was heated at 105° C.", in Example 1. The polymer compound 3 had an Mn of $5.0 \times 10^4$ and an Mw of $1.1 \times 10^5$.

The polymer compound 3 is a copolymer constituted of a constitutional unit derived from the compound 6, a constitutional unit derived from the compound 7 and a constitutional unit derived from the compound 8 at a molar ratio of 45:50:5 according to the theoretical values calculated from the amounts of the charged raw materials.

<Example D1> Fabrication and Evaluation of Light Emitting Device D1

An ITO film with a thickness of 45 nm was attached to a glass substrate by a sputtering method, to form an anode. On the anode, ND-3202 (manufactured by Nissan Chemical Industries, Ltd.) as a hole injection material was spin-coated to form a film with a thickness of 35 nm, and under an air atmosphere, the film was heated at 240° C. for 15 minutes on a hot plate, to form a hole injection layer.

The polymer compound 1 was dissolved at a concentration of 0.6% by mass in xylene. The resultant xylene solution was spin-coated on the hole injection layer, to form a film with a thickness of 20 nm, and the film was heated on a hot plate at 200° C. for 30 minutes under a nitrogen gas atmosphere, to form a hole transporting layer.

The polymer compound 2 was dissolved at a concentration of 1.3% by mass in xylene. The resultant xylene solution was spin-coated on the hole transporting layer, to form a film with a thickness of 60 nm, and the film was heated on a hot plate at 150° C. for 10 minutes under a nitrogen gas atmosphere, to form a light emitting layer.

The substrate carrying the light emitting layer formed thereon was placed in a vapor deposition machine, and the pressure in the machine was reduced to $1 \times 10^{-4}$ Pa or less, then, as a cathode, sodium fluoride was vapor-deposited with a thickness of about 7 nm on the light emitting layer, then, aluminum was vapor-deposited with a thickness of about 120 nm on the sodium fluoride layer. After vapor deposition, sealing was performed with a glass substrate, to fabricate a light emitting device D1.

When voltage was applied to the light emitting device D1, the maximum external quantum yield was 4.1%, and EL emission having the maximum peak wavelength of the emission spectrum at 460 nm was observed. At this stage, CIE1931 chromaticity coordinate was (0.142, 0.071). The current value was set so that the current density was 10 mA/cm², then, the device was driven at a constant current density and time change of luminance was measured. The time until the luminance reached 60% of the initial luminance was 44 hours.

<Example D2> Fabrication and Evaluation of Light Emitting Device D2

A light emitting device D2 was fabricated in the same manner as in Example D1, except that a composition composed of the polymer compound 2 and the polymer compound 3 at a mass ratio of 50:50 was used instead of the polymer compound 2, in Example D1.

When voltage was applied to the light emitting device D2, the maximum external quantum yield was 3.3%, and EL emission having the maximum peak wavelength of the emission spectrum at 460 nm was observed. At this stage, the CIE1931 chromaticity coordinate was (0.145, 0.067). The current value was set so that the current density was 10 mA/cm², then, the device was driven at a constant current density and time change of luminance was measured. The time until the luminance reached 60% of the initial luminance was 54 hours.

<Comparative Example CD1> Fabrication and Evaluation of Light Emitting Device CD1

A light emitting device CD1 was fabricated in the same manner as in Example D1, except that the polymer compound 3 was used instead of the polymer compound 1, in Example D1.

When voltage was applied to the light emitting device CD1, the maximum external quantum yield was 3.1%, and EL emission having the maximum peak wavelength of the emission spectrum at 440 nm was observed. At this stage, the CIE1931 chromaticity coordinate was (0.156, 0.063). The current value was set so that the current density was 10 mA/cm², then, the device was driven at constant current, and time change of luminance was measured. The time until the luminance reached 60% of the initial luminance was 38 hours.

<Synthesis Example 6> Synthesis of Compound 9

(Synthesis of Compound 9-1)

[Chemical Formula 125]

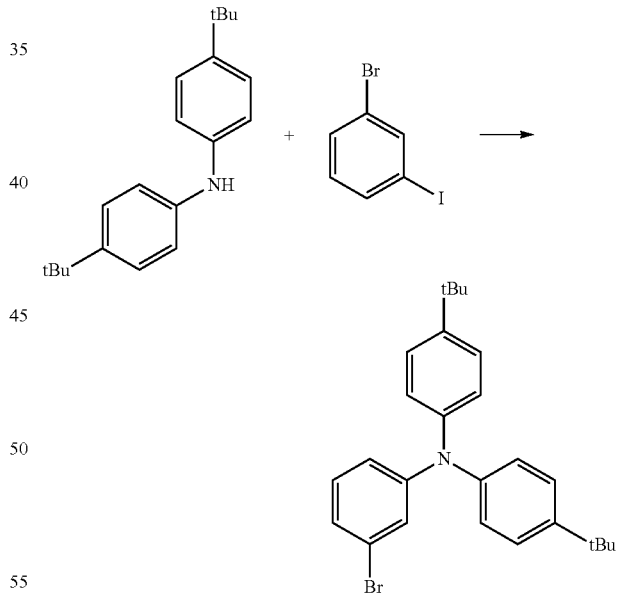

9-1

An argon gas atmosphere was prepared in a reaction vessel, then, bis(4-tert-butylphenyl)amine (150.59 g), 1-bromo-3-iodobenzene (147 g), palladium acetate (II) (1.11 g), Xantphos (2.87 g), t-BuONa (72 g) and toluene (1262 mL) were added, and the mixture was stirred at 80° C. for 2 hours. The resultant mixture was cooled down to room temperature, then, filtrated through a short column stacked with silica gel/Celite. The resultant filtrate was concentrated under reduced pressure, to obtain a coarse product. The resultant coarse product was dispersed in methanol, then, refluxed with heating. The resultant mixture was cooled, then, the resultant coarse product was collected by filtration, to obtain an ocherous powder. The resultant powder was dispersed in methanol and washed, further, purified by silica gel column chromatography (a mixed solvent of hexane and toluene), then, concentrated under reduced pressure, and dried, to obtain a compound 9-1 (190.3 g, pale yellow solid). The compound 9-1 had an HPLC area percentage value of 98.5%.

$^1$H-NMR (CDCl$_3$, 400 MHz) δ (ppm): 7.26 (d, 4H), 7.16 (m, 1H), 7.03-6.97 (m, 3H), 6.91 (ddd, 1H), 1.28 (s, 18H).

(Synthesis of Compound 9-2)

[Chemical Formula 126]

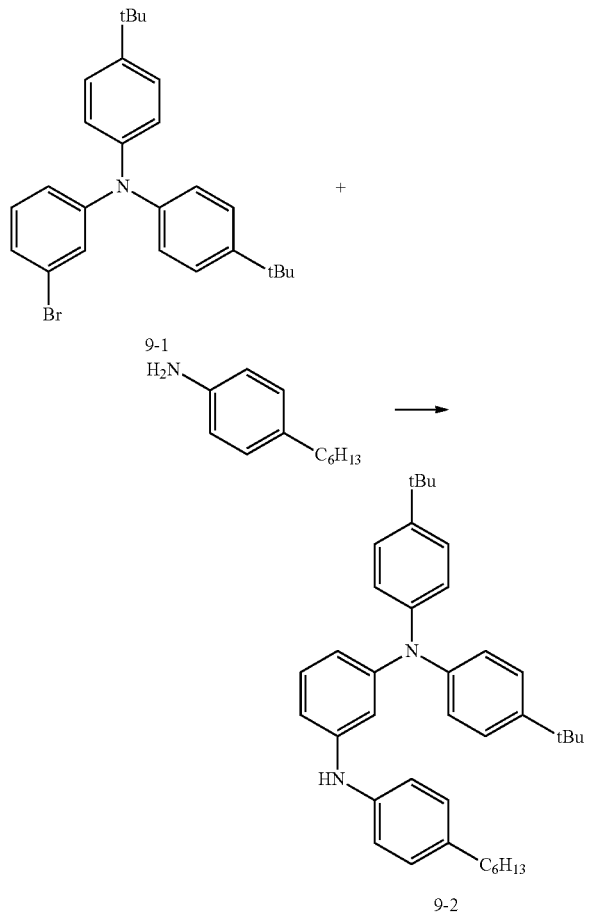

(Synthesis of Compound 9-3)

[Chemical Formula 127]

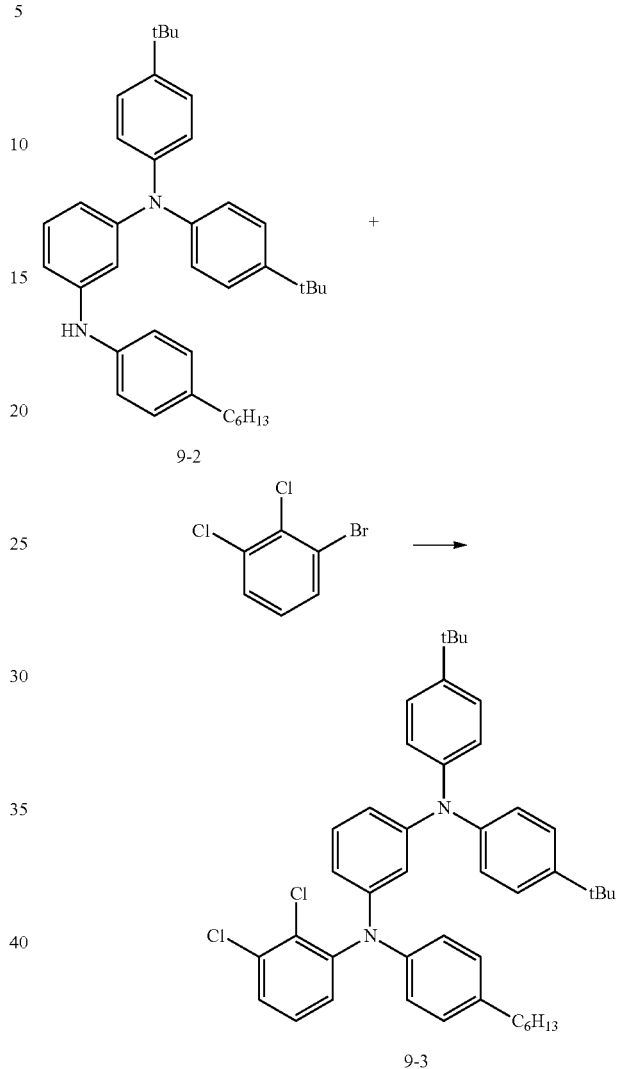

An argon gas atmosphere was prepared in a reaction vessel, then, the compound 9-1 (169.5 g), 4-hexylaniline (84.8 g), Pd$_2$(dba)$_3$(dba)$_{0.75}$ (6.26 g), t-Bu$_3$PHBF$_4$ (3.33 g), t-BuONa (55.13 g) and toluene (2117 mL) were added, and the mixture was stirred at 20° C. for 1.5 hours. The resultant mixture was filtrated through a short column stacked with silica gel/Celite, and the resultant filtrate was concentrated under reduced pressure, to obtain a coarse product. The resultant coarse product was purified by silica gel column chromatography (a mixed solvent of hexane and toluene), then, concentrated under reduced pressure, and dried, to obtain a compound 9-2 (181.3 g, oil). The compound 9-2 had an HPLC area percentage value of 99%. These operations were repeated, to obtain a necessary amount of the compound 9-2.

An argon gas atmosphere was prepared in a reaction vessel, then, 1-bromo-2,3-dichlorobenzene (77.2 g), the compound 9-2 (197.5 g), Pd$_2$(dba)$_3$(dba)$_{0.75}$ (6.11 g), t-Bu$_3$PHBF$_4$ (3.24 g), t-BuONa (53.3 g) and toluene (1337 g) were added, and the mixture was stirred at 50° C. for 4 hours. The resultant mixture was cooled down to room temperature, then, filtrated through a short column stacked with silica gel/Celite. The resultant filtrate was concentrated under reduced pressure, to obtain a coarse product. The resultant coarse product was purified by silica gel column chromatography (a mixed solvent of hexane and toluene), then, concentrated under reduced pressure, and dried, to obtain a compound 9-3 (220 g, white solid). The compound 9-3 had an HPLC area percentage value of 99%.

$^1$H-NMR (CDCl$_3$, 400 MHz) δ (ppm): 7.24-7.15 (m, 6H), 7.08 (d, 1H), 7.07 (s, 1H), 7.04-6.95 (m, 6H), 6.88 (d, 2H), 6.58 (dd, 1H), 6.52 (dd, 1H), 6.45 (dd, 1H), 2.50 (dd, 2H), 1.57 (m, 2H), 1.28 (m, 24H), 0.87 (t, 3H).

(Synthesis of Compound 9-4)

[Chemical Formula 128]

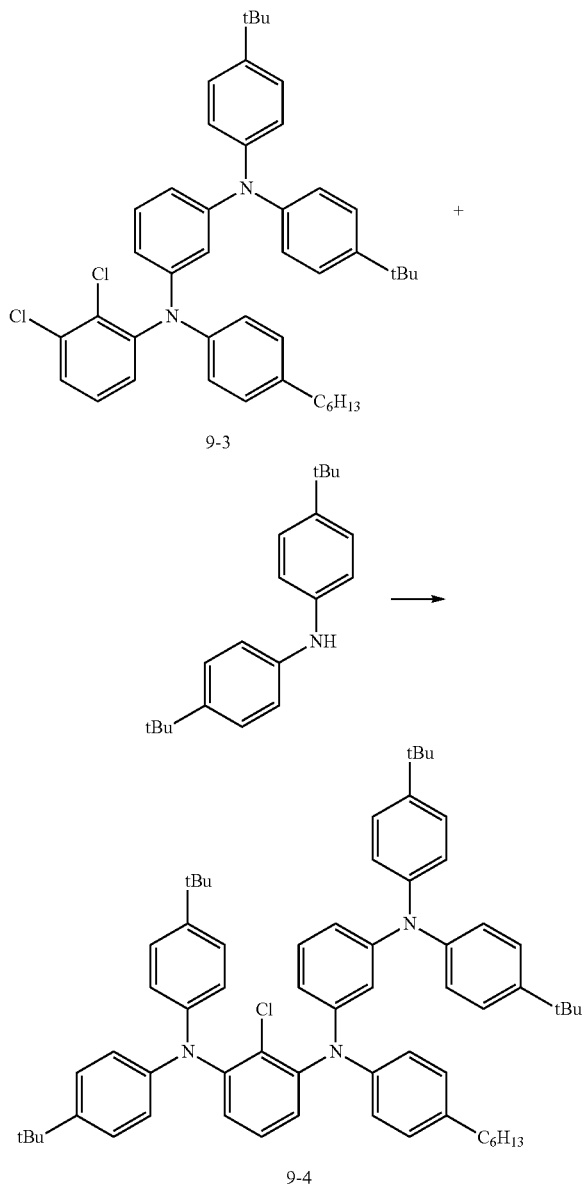

9-3

9-4

A nitrogen gas atmosphere was prepared in a reaction vessel, then, bis(4-tert-butylphenyl)amine (92.0 g), the compound 9-3 (195.0 g), Pd$_2$(dba)$_3$(dba)$_{0.75}$ (4.38 g), t-Bu3PHBF$_4$ (2.33 g), t-BuONa (38.6 g) and toluene (1323 g) were added, and the mixture was stirred at 50° C. for 5 hours, then, stirred at 70° C. for 1 hour. The resultant mixture was cooled down to room temperature, then, filtrated through a short column stacked with silica gel/Celite, and the resultant filtrate was concentrated under reduced pressure to obtain a brown oil. The resultant oil was purified by silica gel column chromatography (a mixed solvent of hexane and toluene), then, concentrated under reduced pressure, and dried, to obtain a compound 9-4 (149 g, colorless oil). The compound 9-4 had an HPLC area percentage value of 94.5%.

(Synthesis of Compound 9-5)

[Chemical Formula 129]

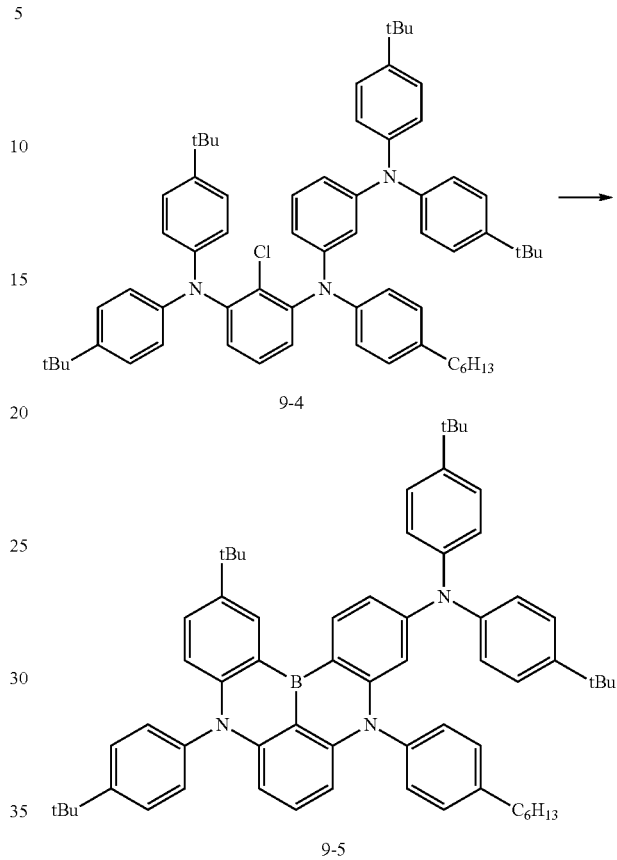

9-4

9-5

A nitrogen gas atmosphere was prepared in a reaction vessel, then, the compound 9-4 (132.4 g) and tert-butylbenzene (811 mL) were added, and the mixture was cooled to 0° C., then, a t-BuLi/pentane solution (1.5M, 151 mL) was added. The resultant mixture was stirred at 40° C. for 1 hour, then, stirred at 50° C. for 1 hour. The resultant mixture was cooled down to −50° C., then, BBr$_3$ (27.7 mL) was added, and the mixture was stirred at −50° C. for 0.5 hours. The resultant mixture was heated up to 0° C., then, N,N-diisopropylamine (48.8 mL) was added. The resultant mixture was heated up to 60° C., then, pentane was distilled off. The resutant mixture was heated up to 120° C., then, reacted for 3 hours. The resultant mixture was cooled down to room temperature, then, a sodium acetate aqueous solution and ethyl acetate were added, and the resultant organic layer was washed with ion exchanged water. The resultant organic layer was concentrated under reduced pressured, to obtain a yellow oil. The resultant oil was purified by silica gel column chromatography (a mixed solvent of hexane and toluene), then, concentrated under reduced pressure, and dried, to obtain a compound 9-5 (16.4 g, yellow solid). The compound 9-5 had an HPLC area percentage value of 96.9%.

$^1$H-NMR (CD$_2$Cl$_2$, 400 MHz) δ (ppm): 8.81 (d, 1H), 8.66 (d, 1H), 7.67 (d, 2H), 7.42 (dd, 1H), 7.30-7.20 (m, 8H), 7.12 (t, 1H), 7.10 (d, 2H), 6.99 (d, 4H), 6.84 (dd, 1H), 6.66 (d, 1H), 6.33 (d, 1H), 6.05 (d, 1H), 5.99 (d, 1H), 2.59 (m, 2H), 1.61 (m, 2H), 1.43 (s, 9H), 1.40 (s, 9H), 1.39-1.27 (m, 24H), 0.89 (t, 3H).

(Synthesis of Compound 9-6)

[Chemical Formula 130]

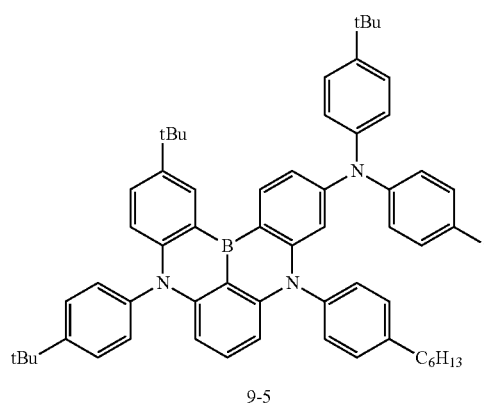

9-5

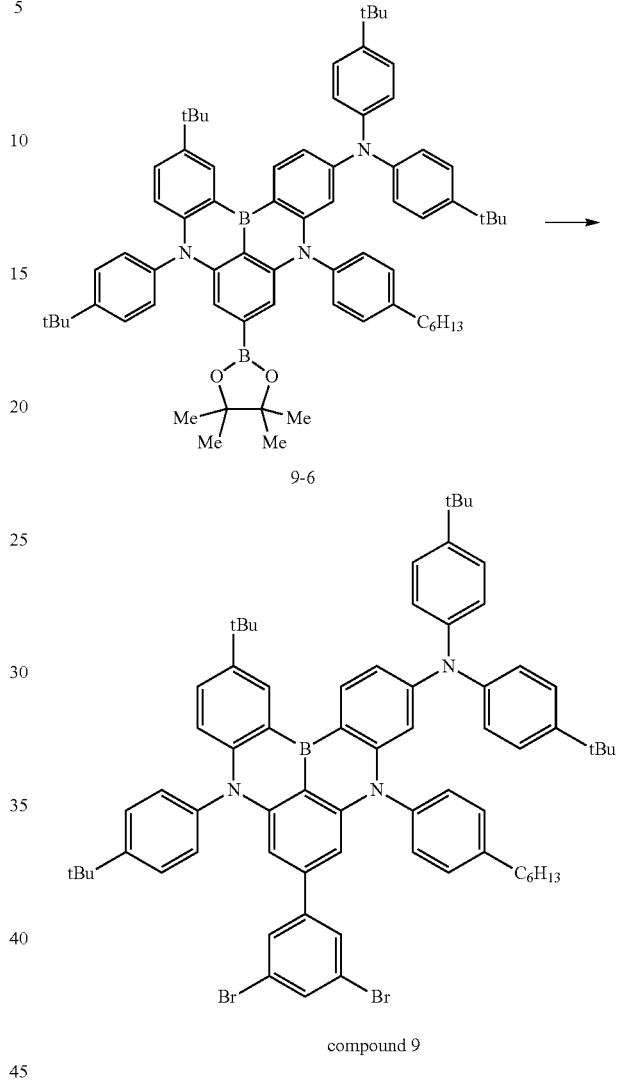

(Synthesis of compound 9)

[Chemical Formula 131]

A nitrogen gas atmosphere was prepared in a reaction vessel, then, the compound 9-5 (11.60 g), bis(pinacolato) diboron ($B_2pin_2$; 9.86 g), 4,4'-di-tert-butyl-2,2'-bipyridyl (dtbpy; 0.21 g), (1,5-cyclooctadiene)(methoxy)iridium(I) dimer ([Ir(cod)(OMe)]2; 0.26 g) and cyclohexane (232 mL) were added, and the mixture was stirred at 90° C. for 9.5 hours. The resultant mixture was cooled down to room temperature, then, methanol was added to stop the reaction. The resultant mixture was filtrated through a silica gel short column, and the resultant filtrate was concentrated under reduced pressure, to obtain a yellow oil. The resultant oil was re-crystallized from heptane, to obtain a pale yellow powder. The resultant powder was re-crystallized from a mixed liquid of toluene and ethanol, then, dried, to obtain a compound 9-6 (7.56 g, yellow powder). The compound 9-6 had an HPLC area percentage value of 90.7%.

A nitrogen gas atmosphere was prepared in a reaction vessel, then, 1,3,5-tribromobenzene (10.4 g), the compound 9-6 (7.5 g), toluene (112 mL) and tetrakis(triphenylphosphine)palladium(0) (0.228 g) were added, then, a 12% by mass tetrabutyl ammonium hydroxide aqueous solution (43 g) was added, and the mixture was refluxed with heating for 3 hours. The resultant mixture was cooled down to room temperature, then, an aqueous layer was separated, and the resultant organic layer was washed with water twice. To the resultant organic layer was added magnesium sulfate, then, the resultant mixture was filtrated, and the resultant filtrate was concentrated under reduced pressure, to obtain a coarse product. The resultant coarse product was filtrated through a silica gel/alumina short column. Steps of re-crystallizing the resultant solid from a mixed liquid of toluene and acetonitrile, and then, drying it were repeated three times, to obtain 6.1 g of a compound 9 as a pale yellow solid. HPLC area percentage value was 99.7%.

LC-MS (ESI, positive): 1128 [M+H]$^+$ $^1$H-NMR (CDCl$_3$, 400 MHz) δ (ppm): 8.87 (s, 1H), 8.70 (d, 1H), 7.70 (d, 2H), 7.46 (m, 2H), 7.31-7.18 (m, 10H), 7.12

(d, 2H), 7.03 (d, 4H), 6.95 (d, 1H), 6.74 (d, 1H), 6.36 (d, 1H), 6.09 (d, 2H), 2.59 (m, 2H), 1.62 (m, 2H), 1.44 (s, 18H), 1.32 (m, 24H), 0.89 (t, 3H).

<Synthesis Example 7> Synthesis of Compound 10

(Synthesis of Compound 10-1)

[Chemical Formula 132]

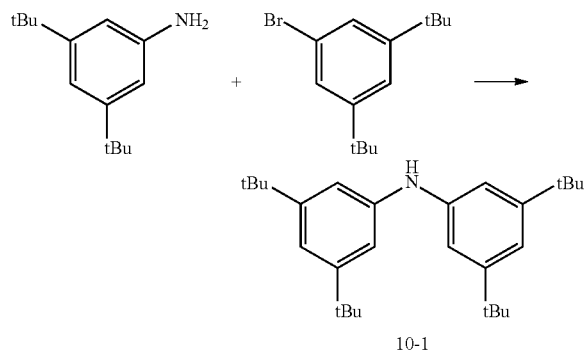

10-1

An argon gas atmosphere was prepared in a reaction vessel, then, 3,5-di-t-butylaniline (4.00 g), 1-bromo3,5-di-t-butylbenzene (4.77 g), Pd$_2$(dba)$_3$(dba)$_{0.75}$ (0.058 g), t-Bu$_3$PHBF$_4$ (0.032 g), t-BuONa (2.55 g) and toluene (143 mL) were added, and the mixture was stirred at 30° C. for 1.5 hours. The resultant mixture was filtrated through a short column stacked with silica gel/Celite, and the resultant filtrate was concentrated under reduced pressure, to obtain a compound 10-1 (9.74 g, oil). The compound 10-1 had an HPLC area percentage value of 96.9%.

(Synthesis of Compound 10-2)

[Chemical Formula 133]

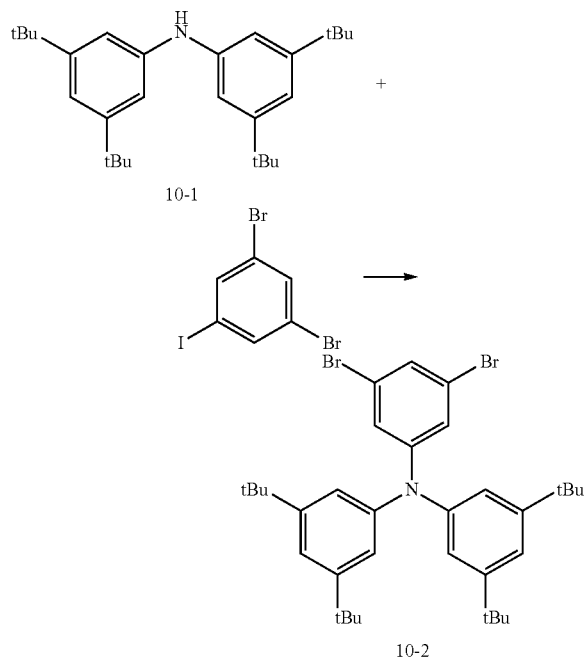

10-2

An argon gas atmosphere was prepared in a reaction vessel, then, the compound 10-1 (4.35 g), 1,3-dibromo-5-iodobenzene (4.00 g), palladium acetate (0.113 g), Xantphos (0.320 g), t-BuONa (1.45 g) and toluene (65 mL) were added, and the mixture was stirred for 4.5 hours while gradually heating from 60° C. to 80° C. The resultant mixture was filtrated through a short column stacked with silica gel/Celite, and the resultant filtrate was concentrated under reduced pressure, to obtain a coarse product. The resultant coarse product was purified by silica gel column chromatography (a mixed solvent of hexane and toluene), then, concentrated under reduced pressure, and dried, to obtain a compound 10-2 (5.26 g, pale red white powder). The compound 10-2 had an HPLC area percentage value of 89.8%.

(Synthesis of Compound 10-3)

[Chemical Formula 134]

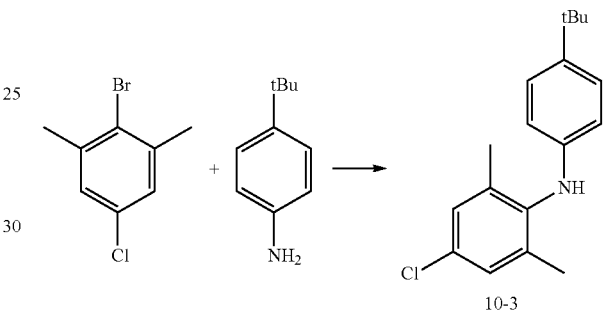

10-3

An argon gas atmosphere was prepared in a reaction vessel, then, 2-bromo-5-chloro-m-xylene (10.00 g), p-t-butylaniline (8.16 g), Pd$_2$(dba)$_3$(dba)$_{0.75}$ (0.746 g), t-Bu3PHBF$_4$ (0.416 g), t-BuONa (6.57 g) and toluene (250 mL) were added, and the mixture was stirred at 30° C. for 1 hour. The resultant mixture was filtrated through a short column stacked with silica gel/Celite, and the resultant filtrate was concentrated under reduced pressure, to obtain a coarse product. The resultant coarse product was purified by silica gel column chromatography (a mixed solvent of hexane and toluene), then, concentrated under reduced pressure, and dried, to obtain a compound 10-3 (13.16 g, pale yellow solid). The compound 10-3 had an HPLC area percentage value of 99.3%.

(Synthesis of Compound 10-4)

[Chemical Formula 135]

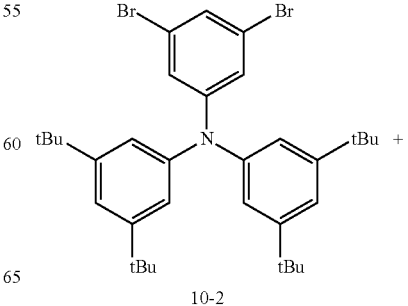

10-2

-continued

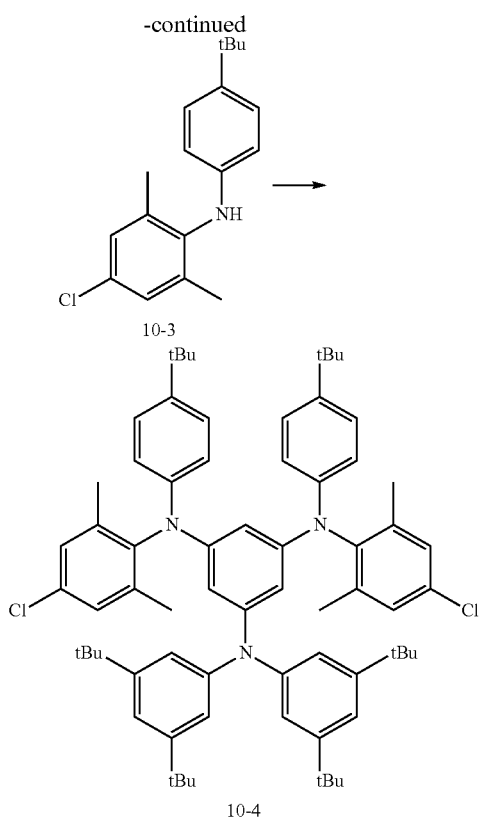

10-3

10-4

An argon gas atmosphere was prepared in a reaction vessel, then, the compound 10-2 (5.20 g), the compound 10-3 (5.25 g), Pd$_2$(dba)$_3$(dba)$_{0.75}$ (0.452 g), t-Bu$_3$PHBF$_4$ (0.252 g), t-BuONa (2.39 g) and toluene (104 mL) were added, and the mixture was stirred at 50° C. for 2 hours. The resultant mixture was cooled down to room temperature, then, filtrated through a short column stacked with silica gel/Celite. The resultant filtrate was concentrated under reduced pressure, to obtain a brown solid. The resultant solid was purified by silica gel column chromatography (a mixed solvent of hexane and toluene), then, concentrated under reduced pressure, and dried, to obtain a compound 10-4 (5.69 g, white solid). The compound 10-4 had an HPLC area percentage value of 98.4%.

(Synthesis of Compound 10-5)

[Chemical Formula 136]

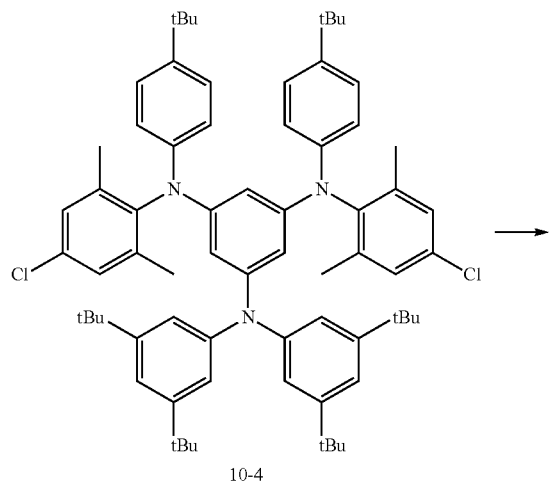

10-4

-continued

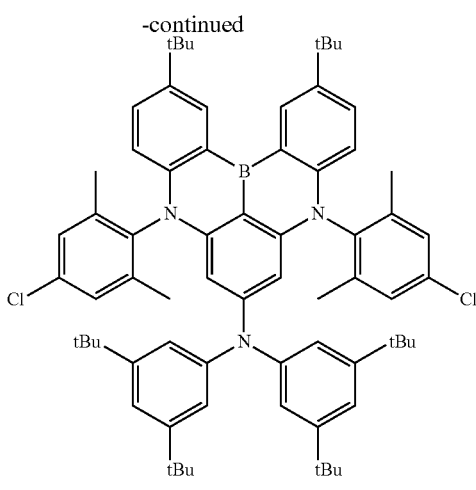

10-5

A nitrogen gas atmosphere was prepared in a reaction vessel, then, the compound 10-4 (4.60 g), o-dichlorobenzene (64 mL) and BBr$_3$ (3.3 g) were added, and the mixture was stirred at 140° C. for 6 hours. The resultant mixture was cooled down to room temperature, then, toluene (64 mL) and N,N-diisopropylamine (7.9 mL) were added, and the mixture was stirred. The resultant mixture was filtrated through a short column stacked with silica gel/Celite, and the resultant filtrate was concentrated under reduced pressure to obtain a brown oil. The resultant oil was purified by silica gel column chromatography (a mixed solvent of hexane and toluene), then, concentrated under reduced pressure, and dried, to obtain a yellow powder. The resultant powder was re-crystallized from a mixed solvent of toluene and acetonitrile, to obtain a compound 10-5 (1.55 g, yellow solid). The compound 10-5 had an HPLC area percentage value of 99.3%. These operations were repeated, to obtain a necessary amount of the compound 10-5.

(Synthesis of Compound 10)

[Chemical Formula 137]

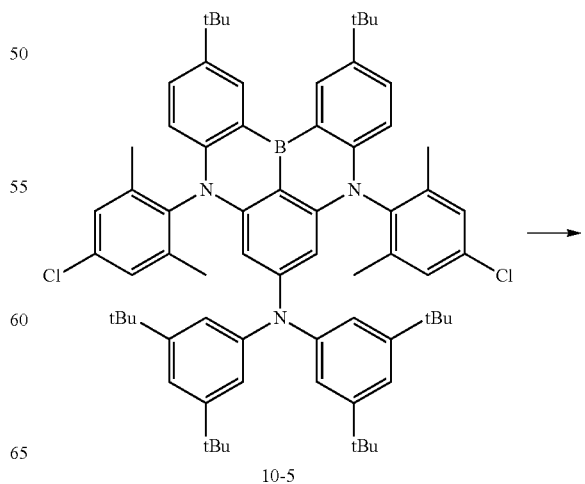

10-5

-continued

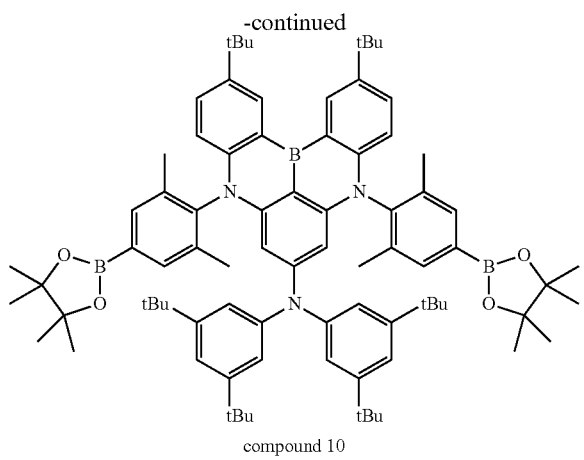

compound 10

A nitrogen gas atmosphere was prepared in a reaction vessel, then, the compound 10-5 (1.85 g), bis(pinacolato) diboron ($B_2pin_2$; 1.34 g), $Pd_2(dba)_3(dba)_{0.75}$ (0.048 g), XPhos (0.089 g), potassium acetate (1.03 g), 1,2-dimethoxyethane (18 mL) and toluene (4 mL) were added, and the mixture was stirred at 85° C. for 12 hours. The resultant mixture was cooled down to room temperature, then, methanol was added to stop the reaction. The resultant mixture was filtrated through a short column stacked with silica gel/ Celite, and the resultant filtrate was concentrated under reduced pressure, to obtain a yellow oil. The resultant oil was re-crystallized from acetonitrile, to obtain a pale yellow powder. The resultant powder was dissolved in a mixed solvent of toluene and heptane, then, activated carbon was added and the mixture was stirred. The resultant mixture was filtrated using Celite, then, concentrated under reduced pressure, and dried, to obtain a yellow powder. Steps of re-crystallizing the resultant powder from a mixed liquid of toluene and acetonitrile, and then, drying it were repeated twice, to obtain a compound 10 (1.48 g, yellow powder). The compound 10 had an HPLC area percentage value of 99.8%.

LC-MS (ESI, positive): 1232.9 $[M+H]^+$ $^1$H-NMR ($CDCl_3$, 400 MHz) δ (ppm): 9.12 (s, 2H), 7.67 (s, 4H), 7.43 (d, 2H), 6.98 (s, 2H), 6.82 (s, 4H), 6.59 (d, 2H), 5.46 (br.s, 2H), 1.86 (s, 12H), 1.46 (s, 18H), 1.36 (s, 24H), 1.13 (s, 36H).

<Example 2> Synthesis of Polymer Compound 4

An inert gas atmosphere was prepared in a reaction vessel, then, the compound 6 (0.633 g), the compound 8 (0.063 g), the compound 7 (0.723 g), the compound 9 (0.026 g), dichlorobis(tris-o-methoxyphenylphosphine)palladium (1.02 mg) and toluene (24.2 g) were mixed, and the mixture was heated at 80° C. Thereafter, a 10% by mass tetraethylammonium hydroxide aqueous solution (20 mL) was dropped into this, and the liquid was refluxed for 4.5 hours. Thereafter, to this were added phenylboronic acid (55.8 mg) and dichlorobis(tris-o-methoxyphenylphosphine)palladium (1.01 mg), and the mixture was refluxed for 8 hours. The resultant reaction mixture was cooled, then, the reaction liquid was washed with water once, with a 10% by mass hydrochloric acid aqueous solution twice, with a 3% by mass ammonia aqueous solution twice, and with water twice. The resultant organic layer was distilled under reduced pressure, to remove water. The resultant solution was purified by passing through a column filled with a mixture of alumina and silica gel. The resultant solution was dropped into methanol, and stirred, then, the resultant precipitate was collected by filtration and dried, to obtain 0.54 g of a polymer compound 4. The polymer compound 4 had an Mn of $4.5 \times 10^4$ and an Mw of $1.1 \times 10^5$.

The polymer compound 4 is a copolymer constituted of a constitutional unit derived from the compound 6, a constitutional unit derived from the compound 8, a constitutional unit derived from the compound 7 and a constitutional unit derived from the compound 9 at a molar ratio of 45:5:49:1 according to the theoretical values calculated from the amounts of the charged raw materials.

<Example 3> Synthesis of Polymer Compound 5

An inert gas atmosphere was prepared in a reaction vessel, then, the compound 6 (1.267 g), the compound 8 (0.127 g), the compound 10 (0.057 g), the compound 7 (1.486 g), dichlorobis(tris-o-methoxyphenylphosphine)palladium (2.09 mg) and toluene (30.5 g) were mixed, and the mixture was heated at 80° C. Thereafter, a 20% by mass tetraethylammonium hydroxide aqueous solution (25 mL) was dropped into this, and the liquid was refluxed for 3.5 hours. Thereafter, to this were added phenylboronic acid (112.2 g) and dichlorobis(tris-o-methoxyphenylphosphine)palladium (2.13 mg), and the mixture was refluxed for 5 hours. The resultant reaction mixture was cooled, then, the reaction liquid was washed with water once, with a 10% by weight hydrochloric acid aqueous solution twice, with a 3% by weight ammonia aqueous solution twice, and with water twice. The resultant organic layer was distilled under reduced pressure, to remove water. The resultant solution was purified by passing through a column filled with a mixture of alumina and silica gel. The resultant solution was dropped into methanol, and stirred, then, the resultant precipitate was collected by filtration and dried, to obtain 1.06 g of a polymer compound 5. The polymer compound 5 had an Mn of $7.7 \times 10^4$ and an Mw of $1.7 \times 10^5$.

The polymer compound 5 is a copolymer constituted of a constitutional unit derived from the compound 6, a constitutional unit derived from the compound 8, a constitutional unit derived from the compound 10 and a constitutional unit derived from the compound 7 at a molar ratio of 44:5:1:50 according to the theoretical values calculated from the amounts of the charged raw materials.

<Synthesis Example 8> Synthesis of Polymer Compound 6

The polymer compound 6 was synthesized according to a method of Polymer Example 1 described in International Publication WO2014/102543.

<Example D3> Fabrication and Evaluation of Light Emitting Device D3

An ITO film with a thickness of 45 nm was attached to a glass substrate by a sputtering method, to form an anode. On the anode, ND-3202 (manufactured by Nissan Chemical Industries, Ltd.) as a hole injection material was spin-coated to form a film with a thickness of 35 nm, and under an air atmosphere, the film was heated at 240° C. for 15 minutes on a hot plate, to form a hole injection layer.

The polymer compound 6 was dissolved at a concentration of 0.6% by mass in xylene. The resultant xylene solution was spin-coated on the hole injection layer, to form a film with a thickness of 20 nm, and the film was heated on a hot plate at 200° C. for 30 minutes under a nitrogen gas atmosphere, to form a hole transporting layer.

The polymer compound 4 was dissolved at a concentration of 1.3% by mass in xylene. The resultant xylene solution was spin-coated on the hole transporting layer, to form a film with a thickness of 60 nm, and the film was heated on a hot plate at 150° C. for 10 minutes under a nitrogen gas atmosphere, to form a light emitting layer.

The substrate carrying the light emitting layer formed thereon was placed in a vapor deposition machine, and the pressure in the machine was reduced to $1 \times 10^{-4}$ Pa or less, then, as a cathode, sodium fluoride was vapor-deposited with a thickness of about 7 nm on the light emitting layer, then, aluminum was vapor-deposited with a thickness of about 120 nm on the sodium fluoride layer. After vapor deposition, sealing was performed with a glass substrate, to fabricate a light emitting device D3.

When voltage was applied to the light emitting device D3, the maximum external quantum yield was 8.1%, and EL emission having the maximum peak wavelength of the emission spectrum at 465 nm was observed. At this stage, the CIE1931 chromaticity coordinate was (0.131, 0.095). The current value was set so that the current density was 10 mA/cm$^2$, then, the device was driven at a constant current density and time change of luminance was measured. The time until the luminance reached 50% of the initial luminance was 42 hours.

<Example D4> Fabrication and Evaluation of Light Emitting Device D4

A light emitting device D4 was fabricated in the same manner as in Example D3, except that the polymer compound 5 was used instead of the polymer compound 4, in Example D3.

When voltage was applied to the light emitting device D4, the maximum external quantum yield was 7.8%, and EL emission having the maximum peak wavelength of the emission spectrum at 450 nm was observed. At this stage, the CIE1931 chromaticity coordinate was (0.149, 0.045). The current value was set so that the current density was 10 mA/cm$^2$, then, the device was driven at a constant current density and time change of luminance was measured. The time until the luminance reached 50% of the initial luminance was 44 hours.

<Comparative Example CD2> Fabrication and Evaluation of Light Emitting Device CD2

A light emitting device CD2 was fabricated in the same manner as in Example D3, except that the polymer compound 3 was used instead of the polymer compound 4, in Example D3.

When voltage was applied to the light emitting device CD2, the maximum external quantum yield was 7.0%, and EL emission having the maximum peak wavelength of the emission spectrum at 440 nm was observed. At this stage, the CIE1931 chromaticity coordinate was (0.153, 0.055). The current value was set so that the current density was 10 mA/cm$^2$, then, the device was driven at a constant current density and time change of luminance was measured. The time until the luminance reached 50% of the initial luminance was 21 hours.

INDUSTRIAL APPLICABILITY

The present invention can provide a polymer compound which is useful for production of a light emitting device excellent in luminance life. Further, the present invention can provide a composition containing this polymer compound and a light emitting device containing this polymer compound.

The invention claimed is:

1. A polymer compound comprising a constitutional unit having a residue of a compound represented by the formula (1) and a constitutional unit having no residue of a compound represented by the formula (1)

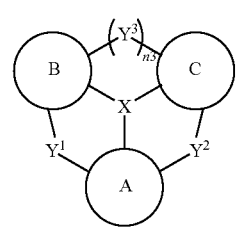

(1)

wherein,
Ring A, Ring B and Ring C each independently represent an aromatic hydrocarbon ring or an aromatic heterocyclic ring, and these rings optionally have a substituent,
X represents a boron atom, a phosphorus atom, P=O, P=S, an aluminum atom, a gallium atom, an arsenic atom, Si-Rx or Ge-Rx, Rx represents an aryl group or an alkyl group, and the foregoing groups optionally have a substituent,
Y$^1$ represents N-Ry, a sulfur atom or a selenium atom, Y$^2$ and Y$^3$ each independently represent an oxygen atom, N-Ry, a sulfur atom or a selenium atom, Ry represents a hydrogen atom, an aryl group, a monovalent heterocyclic group or an alkyl group, and the foregoing groups optionally have a substituent, when a plurality of Ry are present, they may be the same or different, Ry may be bonded to said Ring A, said Ring B or said Ring C directly or via a connecting group,
n3 is 0 or 1, and when n3 is 0, —Y$^3$— is absent.

2. The polymer compound according to claim 1, wherein said constitutional unit having a residue of a compound represented by the formula (1) is a constitutional unit represented by the formula (2) or the formula (2'):

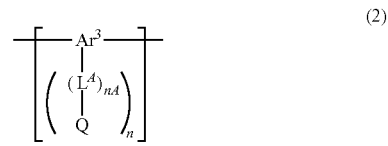

(2)

wherein,
nA is an integer of 0 to 5,
n is 1 or 2,
Ar$^3$ represents an aromatic hydrocarbon group or a heterocyclic group, and the foregoing groups optionally have a substituent,
L$^A$ represents an alkylene group, a cycloalkylene group, an arylene group, a divalent heterocyclic group, a group represented by —NR'—, an oxygen atom or a sulfur atom, and the foregoing groups optionally have a substituent, R' represents a hydrogen atom, an alkyl group, a cycloalkyl group, an aryl group or a monovalent heterocyclic group, and the foregoing groups optionally have a substituent, when a plurality of $L^A$ are present, they may be the same or different, Q represents said residue of a compound represented by the formula (1),

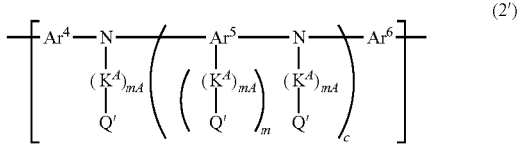

(2')

wherein, m is an integer of 1 to 4, mA is an integer of 0 to 5, when a plurality of mA are present, they may be the same or different, c is 0 or 1, $Ar^4$ and $Ar^6$ each independently represent an arylene group or a divalent heterocyclic group, and the foregoing groups optionally have a substituent, $Ar^5$ represents an aromatic hydrocarbon group, a heterocyclic group, or a group in which at least one aromatic hydrocarbon ring and at least one heterocyclic ring are bonded, and the foregoing groups optionally have a substituent, $Ar^4$, $Ar^5$ and $Ar^6$ may be bonded directly or via an oxygen atom or a sulfur atom to a group other than these groups bonded to a nitrogen atom to which these groups are bonded, to form a ring, $K^A$ represents an alkylene group, a cycloalkylene group, an arylene group, a divalent heterocyclic group, a group represented by —NR'—, an oxygen atom or a sulfur atom, and the foregoing groups optionally have a substituent, R' represents a hydrogen atom, an alkyl group, a cycloalkyl group, an aryl group or a monovalent heterocyclic group, and the foregoing groups optionally have a substituent, when a plurality of $K^A$ are present, they may be the same or different, Q' represents said residue of a compound represented by the formula (1), a hydrogen atom, an alkyl group, a cycloalkyl group, an aryl group or a monovalent heterocyclic group, and the foregoing groups optionally have a substituent, when a plurality of Q' are present, they may be the same or different, and at least one Q' is said residue of a compound represented by the formula (1).

3. The polymer compound according to claim 1, wherein said constitutional unit having a residue of a compound represented by the formula (1) is a constitutional unit represented by the formula (3):

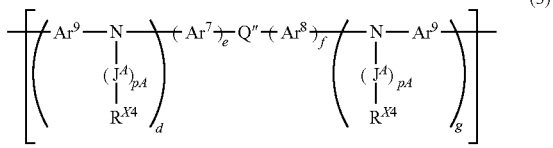

(3)

wherein, d, e, f and g each independently represent an integer of 0 to 2, pA is an integer of 0 to 5, when a plurality of pA are present, they may be the same or different, $J^A$ represents an alkylene group, a cycloalkylene group, an arylene group, a divalent heterocyclic group, a group represented by —NR'—, an oxygen atom or a sulfur atom, and the foregoing groups optionally have a substituent, R' represents a hydrogen atom, an alkyl group, a cycloalkyl group, an aryl group or a monovalent heterocyclic group, and the foregoing groups optionally have a substituent, when a plurality of $J^A$ are present, they may be the same or different, $Ar^7$, $Ar^8$ and $Ar^9$ each independently represent an arylene group or a divalent heterocyclic group, and the foregoing groups optionally have a substituent, when a plurality of $Ar^7$, $Ar^8$ and $Ar^9$ are present, they may be the same or different at each occurrence, $R^{X4}$ represents a hydrogen atom, an alkylgroup, a cycloalkyl group, an aryl group or a monovalent heterocyclic group, and the foregoing groups optionally have a substituent, when a plurality of $R^{X4}$ are present, they may be the same or different, and Q" represents said residue of a compound represented by the formula (1).

4. The polymer compound according to claim 1, wherein said X is a boron atom.

5. The polymer compound according to claim 1, wherein said $Y^1$, $Y^2$ and $Y^3$ are each N-Ry.

6. The polymer compound according to claim 1, wherein said n3 is 0.

7. The polymer compound according to claim 2, wherein said constitutional unit represented by the formula (2) is a constitutional unit represented by the formula (31):

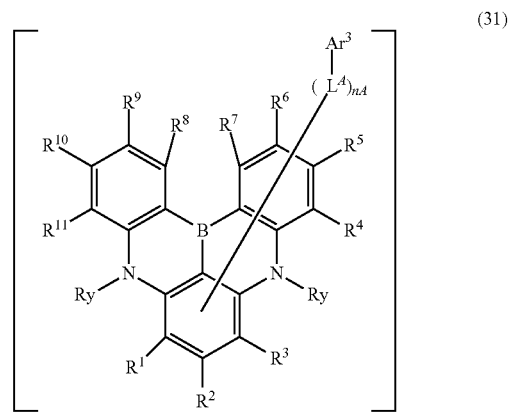

(31)

wherein, $R^1$, $R^2$, $R^3$, $R^4$, $R^5$, $R^6$, $R^7$, $R^8$, $R^9$, $R^{10}$ and $R^{11}$ each independently represent a connecting bond, a hydrogen atom, an alkyl group, a cycloalkyl group, an alkoxy group, a cycloalkoxy group, an aryl group, an aryloxy group, a monovalent heterocyclic group or a substituted amino group, and the foregoing groups optionally have a substituent, one of $R^1$, $R^2$, $R^3$, $R^4$, $R^5$, $R^6$, $R^7$, $R^8$, $R^9$, $R^{10}$ and $R^{11}$ is a connecting bond, and Ry, $Ar^3$, $L^A$ and nA represent the same meaning as described above.

8. The polymer compound according to claim 2, wherein said constitutional unit represented by the formula (2') is a constitutional unit represented by the formula (41):

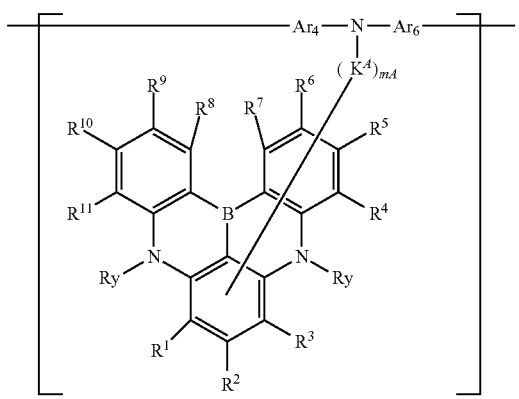

(41)

wherein, $R^1$, $R^2$, $R^3$, $R^4$, $R^5$, $R^6$, $R^7$, $R^8$, $R^9$, $R^{10}$ and $R^{11}$ each independently represent a connecting bond, a hydrogen atom, an alkyl group, a cycloalkyl group, an alkoxy group, a cycloalkoxy group, an aryl group, an aryloxy group, a monovalent heterocyclic group or a substituted amino group, and the foregoing groups optionally have a substituent, one of $R^1$, $R^2$, $R^3$, $R^4$, $R^5$, $R^6$, $R^7$, $R^8$, $R^9$, $R^{10}$ and $R^{11}$ is a connecting bond, and Ry, $Ar^4$, $Ar^6$, $K^A$ and mA represent the same meaning as described above.

9. The polymer compound according to claim 3, wherein said constitutional unit represented by the formula (3) is a constitutional unit represented by the formula (51):

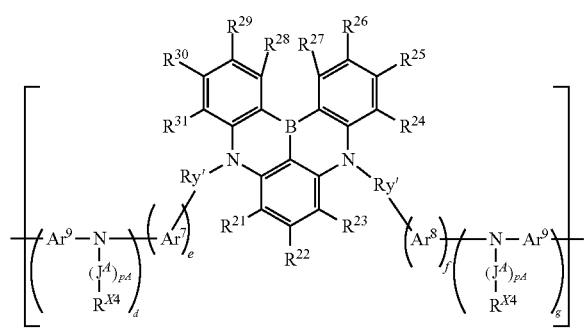

(51)

wherein, $R^{21}$, $R^{22}$, $R^{23}$, $R^{24}$, $R^{25}$, $R^{26}$, $R^{27}$, $R^{28}$, $R^{29}$, $R^{30}$ and $R^{31}$ each independently represent a hydrogen atom, an alkyl group, a cycloalkyl group, an alkoxy group, a cycloalkoxy group, an aryl group, an aryloxy group, a monovalent heterocyclic group or a substituted amino group, and the foregoing groups optionally have a substituent, Ry' represents a direct bond, an arylene group, a divalent heterocyclic group or an alkylene group, and the foregoing groups optionally have a substituent, a plurality of Ry' may be the same or different, and $Ar^7$, $Ar^8$, $Ar^9$, $R^{X4}$, $J^A$ pA, d, e, f and g represent the same meaning as described above.

10. The polymer compound according to claim 1, wherein said constitutional unit having no residue of a compound represented by the formula (1) is at least one constitutional unit selected from the group consisting of a constitutional unit represented by the formula (X) and a constitutional unit represented by the formula (Y):

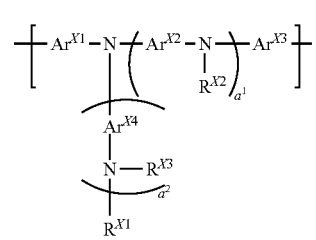

(X)

wherein, $a^1$ and $a^2$ each independently represent an integer of 0 to 2, $Ar^{X1}$ and $Ar^{X3}$ each independently represent an arylene group or a divalent heterocyclic group, and the foregoing groups optionally have a substituent, $Ar^{X2}$ and $Ar^{X4}$ each independently represent an arylene group, a divalent heterocyclic group, or a divalent group in which at least one arylene group and at least one divalent heterocyclic group are bonded, and the foregoing groups optionally have a substituent, when a plurality of $Ar^{X2}$ and $A^{X4}$ are present, they may be the same or different at each occurrence, $R^{X1}$, $R^{X2}$ and $R^{X3}$ each independently represent a hydrogen atom, an alkyl group, a cycloalkyl group, an aryl group or a monovalent heterocyclic group, and the foregoing groups optionally have a substituent, when a plurality of $R^{X2}$ and $R^{X3}$ are present, they may be the same or different at each occurrence,

(Y)

wherein, $A^{Y1}$ represents an arylene group, a divalent heterocyclic group, or a divalent group in which at least one arylene group and at least one divalent heterocyclic group are bonded, and the foregoing groups optionally have a substituent.

11. The polymer compound according to claim 10, wherein said the constitutional unit represented by the formula (Y) is a constitutional unit represented by the formula (Y-1) or a constitutional unit represented by the formula (Y-2):

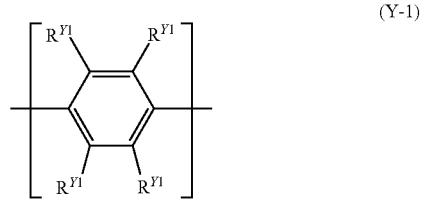

(Y-1)

wherein, $R^{Y1}$ represents a hydrogen atom, an alkyl group, a cycloalkyl group, an alkoxy group, a cycloalkoxy group, an aryl group or a monovalent heterocyclic group, and the foregoing groups optionally have a substituent, a plurality of $R^{Y1}$ may be the same or different, and adjacent $R^{Y1}$ may be bonded together to form a ring together with carbon atoms to which they are attached,

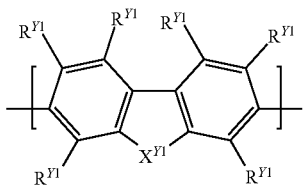

(Y-2)

wherein, $R^{Y1}$ represent the same meaning as described above, $X^{Y1}$ represents a group represented by —C($R^{Y2}$)$_2$—, —C($R^{Y2}$)=C($R^{Y2}$)— or C($R^{Y2}$)$_2$—C($R^{Y2}$)$_2$$R^{Y2}$ represents a hydrogen atom, an alkyl group, a cycloalkyl group, an alkoxy group, a cycloalkoxy group, an aryl group or a monovalent heterocyclic group, and the foregoing groups optionally have a substituent, a plurality of $R^{Y2}$ may be the same or different, and the plurality of $R^{Y2}$ may be bonded together to form a ring together with carbon atoms to which they are attached.

12. The polymer compound according to claim 2, wherein the total amount of said constitutional unit represented by the formula (2) and the constitutional unit represented by the formula (2') is 0.1 to 50% by mole with respect to the total amount of all constitutional units contained in the polymer compound.

13. The polymer compound according to claim 3, wherein the total amount of said constitutional unit represented by formula (3) is 0.1 to 50% by mole with respect to the total amount of all constitutional units contained in the polymer compound.

14. A composition comprising at least one material selected from the group consisting of a hole transporting material, a hole injection material, an electron transporting material, an electron injection material, a light emitting material, an antioxidant and a solvent, and the polymer compound according to claim 1.

15. A light emitting device having an organic layer containing the polymer compound according to claim 1.

* * * * *